United States Patent [19]
Gruen et al.

[11] Patent Number: 5,989,511
[45] Date of Patent: *Nov. 23, 1999

[54] SMOOTH DIAMOND FILMS AS LOW FRICTION, LONG WEAR SURFACES

[75] Inventors: Dieter M. Gruen, Downers Grove; Alan R. Krauss; Ali Erdemir, both of Naperville; Cuma Bindal, Woodridge; Christopher D. Zuiker, LaGrange, all of Ill.

[73] Assignee: The University of Chicago, Chicago, Ill.

[*] Notice: This patent is subject to a terminal disclaimer.

[21] Appl. No.: 08/620,932

[22] Filed: Mar. 22, 1996

Related U.S. Application Data

[63] Continuation-in-part of application No. 08/143,866, Oct. 27, 1993, Pat. No. 5,620,512, which is a continuation-in-part of application No. 08/035,419, Mar. 23, 1993, Pat. No. 5,370,855, which is a continuation-in-part of application No. 07/797,590, Nov. 25, 1991, Pat. No. 5,209,916.

[51] Int. Cl.$^6$ ................................................. C30B 29/04
[52] U.S. Cl. ..................... 423/446; 423/445 B; 117/108; 117/109; 117/929
[58] Field of Search .................. 117/108, 109, 117/929; 423/445 B, 446

[56] References Cited

U.S. PATENT DOCUMENTS

| | | | |
|---|---|---|---|
| 4,414,176 | 11/1983 | Krauss et al. | 376/136 |
| 4,559,901 | 12/1985 | Morimoto et al. | 118/723 |
| 4,634,600 | 1/1987 | Shimizu et al. | 427/38 |
| 4,698,198 | 10/1987 | Gruen | 376/146 |
| 4,816,286 | 3/1989 | Hirose | 427/39 |
| 5,015,494 | 5/1991 | Yamazaki | 427/39 |
| 5,132,105 | 7/1992 | Remo | 423/446 |
| 5,209,916 | 5/1993 | Gruen | 423/446 |
| 5,273,788 | 12/1993 | Yu | 427/554 |
| 5,328,676 | 7/1994 | Gruen . | |
| 5,360,477 | 11/1994 | Inoue et al. | 117/4 |
| 5,370,855 | 12/1994 | Gruen . | |
| 5,462,776 | 10/1995 | Gruen . | |
| 5,620,512 | 4/1997 | Gruen et al. | 117/929 |

OTHER PUBLICATIONS

J. Mater Res., Jan/Feb. 1988, p. 113–139, "Growth mechanism of vapor-deposited diamond," Authors: Frenklach et al.

(List continued on next page.)

Primary Examiner—Robert Kunemund
Attorney, Agent, or Firm—Emrich & Dithmar

[57] ABSTRACT

An article and method of manufacture of a nanocrystalline diamond film. The nanocrystalline film is prepared by forming a carbonaceous vapor, providing an inert gas containing gas stream and combining the gas stream with the carbonaceous containing vapor. A plasma of the combined vapor and gas stream is formed in a chamber and fragmented carbon species are deposited onto a substrate to form the nanocrystalline diamond film having a root mean square flatness of about 50 nm deviation from flatness in the as deposited state.

16 Claims, 47 Drawing Sheets

OTHER PUBLICATIONS

*J. Chem, Phys.*, Dec. 1990, p. 7800, "Laser Deposition of Carbon Clusters on Sufaces: A New Approach to the Study of Fullerenes," Authors: Gerard Meijer and Donald S. Bethune.

*Annu. Rev. Mater. Sci.*, vol. 21, 1991, p. 221–48, "Metastable Growth of Diamond and Diamond–Like Phases," Authors: Angus, et al.

*J. Phys. Chem*, vol. 95, 1991, p. 8402–8409, "Reslience of All–Carbon Molecules $C_{60}$, $C_{70}$ and $C_{84}$: A Surface–Scattering Time–of–Flight Investigation," Author: Beck, et al.

*Mat. Res. Soc. Symp. Proc.* vol. 208, 1991 Materials Research Society, "Spectrometric Characterization of Purified $C_{60}$ and $C_{70}$," Authors: Lykke et al.

*Chem. Rev.*, 1991, 91, p. 1213–1235, "$C_{60}$ Buckminster Fullerene," Authors: Kroto et al.

*Reprint from Inorganic Chemistry*, 1991, "Superconductivity at 28.6K in a Rubidium–$C_{60}$ Fullerene Compound, $Rb_xc_{60}$, Synthesized by a Solution–Phase Technique," p. 2962–2963; Wang, et al.

*Reprint from Inorganic Chemistry*, 1991, "First Easily Reproduced Solution–Phase Synthesis and Confirmation of Superconductivity in the Fullerene $K_xC_{60}$," p. 2838–39; Wang, et al.

*Popular Science*, Aug. 1991, p. 52–87, "Buckyball, The Magic Molecule," Author: Edward Edelson.

*Scientific American*, Oct. 1991, p. 54, "Fullerenes," Authors: Robert F. Curl and Richard E. Smalley.

*J. Chem. Phys.*, vol. 95, Nov. 1, 1991, p. 7008–7010, "Delayed electron emission from photoexcited $C_{60}$," Authors: Wurz et al.

*Chemical Physics Letters*, Dec. 20, 1991. "Near Specular Reflection of $C_{60}$ Ions in Collisions with an HOPG Graphite Surface," Authors: Busmann, Lill and Hertel.

*Appl. Phys. Lett.*, Dec. 23, 1991, p. 3461, "Nucleation of Diamond Films on Surfaces Using Carbon Clusters," Authors: R. J. Meilunas and R.P.H. Chang.

*Nature*, vol. 355, Jan. 16, 1992, p. 237, "Crushing $C^{60}$ to Diamond at Room Temperature," Authors: Reguerio, Monceau and Hodeau.

*Scientific American*, vol. 267, Oct. 1992, p. 84, "Diamond Film Semiconductors," Authors: Michael W. Geis and John C. Angus.

*Nature*, vol. 347, Sep. 27, 1990, pp. 354–358, "Solid $C_{60}$: A New Form of Carbon," Kratschmer, Lamb, Fostiropoulos and Huffman.

Parker, D.H. et al, "High Yield Synthesis, Separation and Mass Spectrometric Characterization of Fullerenes $C_{60}$ to $C_{266}$," J. Am. Chem. Soc. 113, 7499–7503 (1991).

Wasielewski, M.R., et al. "Triplet States of Fullerenes $C_{60}$ and $C_{70}$; Electron Paramagnetic Resonance Spectra, Photophysics and Electronic Structures," J. Am. Chem. Soc. 113, 2774–2776 (1991).

Van, Jon; "Exotic Form Opens New Carbon Uses," Chicago Tribune, Sun. Nov. 3, 1991.

Moffat, A.S., "When Diamonds Met Buckyballs," *Science*, vol. 254, Nov. 8, 1991, p. 800.

Meilunas et al., "Activated $C_{70}$ and diamond", Nature, 354 Nov. 28, 1991, p.271.

Diamond and Related Materials, 1992, Windischmann, et al. "Free–Standing Diamond Membranes: Optical, Morphological and Mechanical Properties," pp. 656–664.

Appl. Phys. Lett., Sep. 1993, Okano, et al. "Fabrication of a Diamond Field Emitter Array," pp. 1–13.

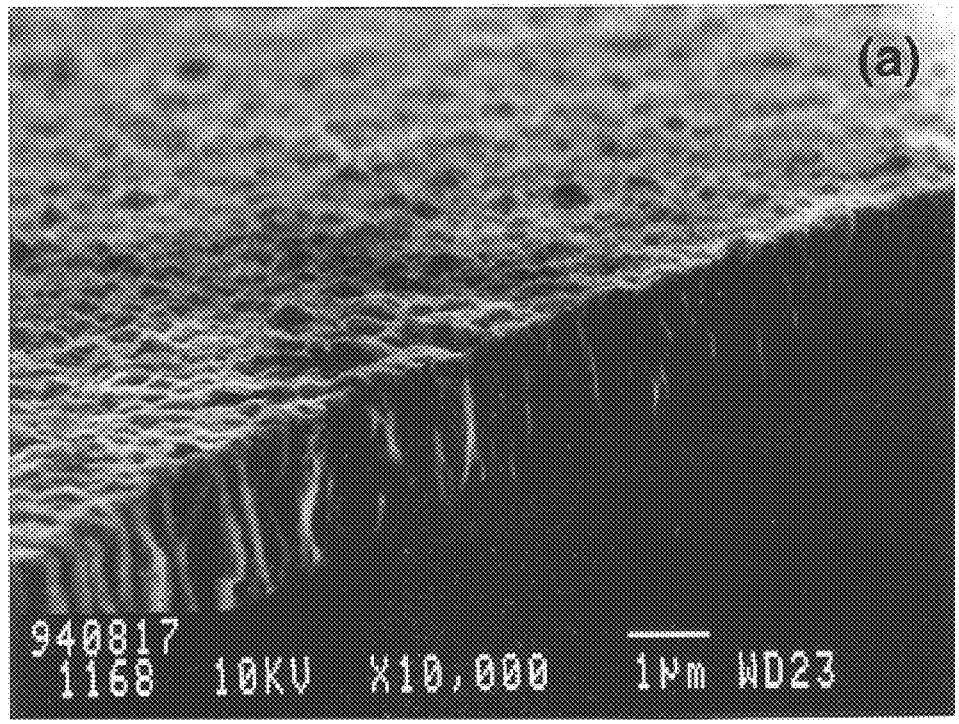
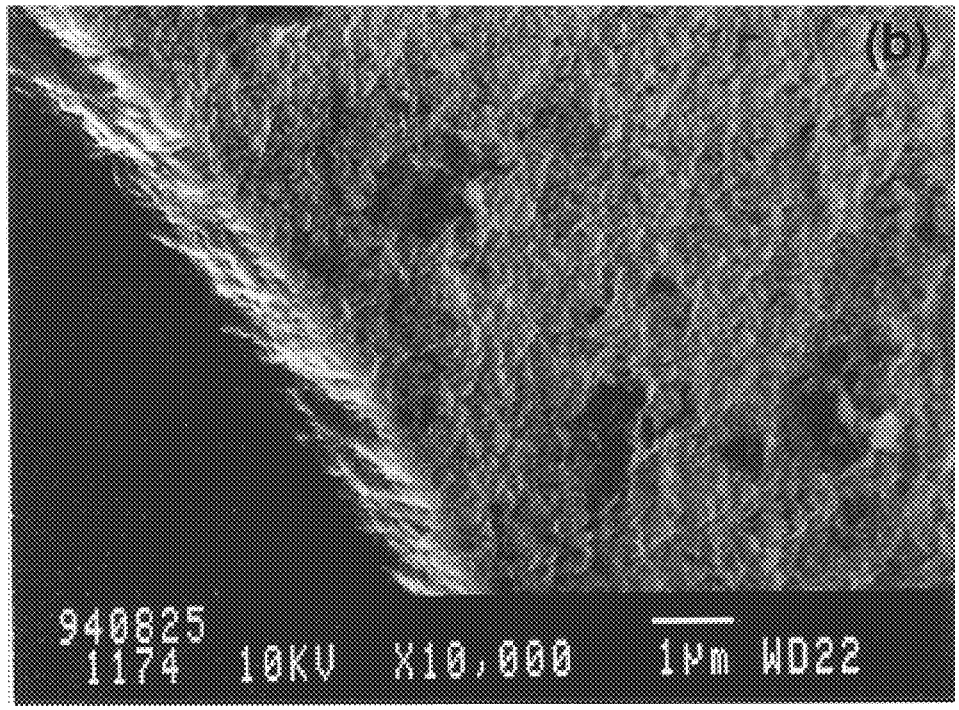
Fig. 11

DIAMOND (100) (2X1):H

C2 DIMER INSERTION: STEP 1

FIG. 22  C2 DIMER INSERTION: STEP 2

FIG. 23 — SECOND C2 DIMER INSERTED

FIG. 24 — C2 TROUGH INSERTION: STEP 1

FIG. 25 — C2 TROUGH INSERTION: STEP 2

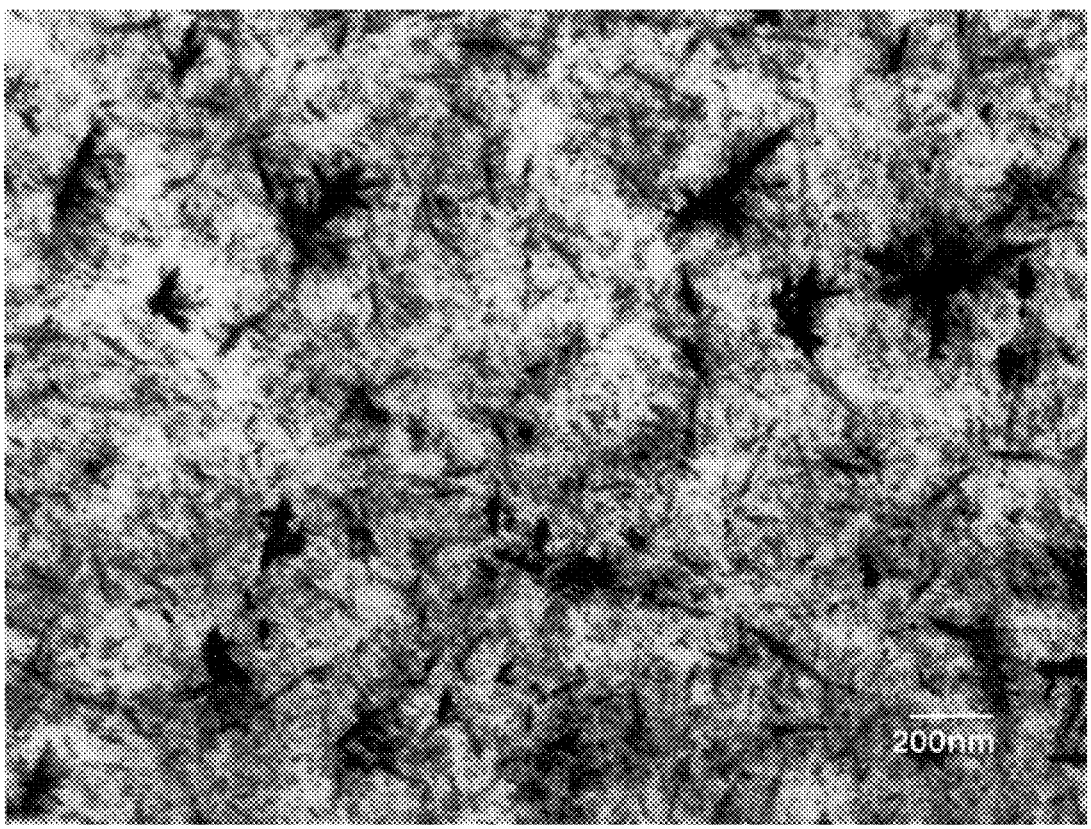
Fig 27b-Grains 940929 CH4 .tif

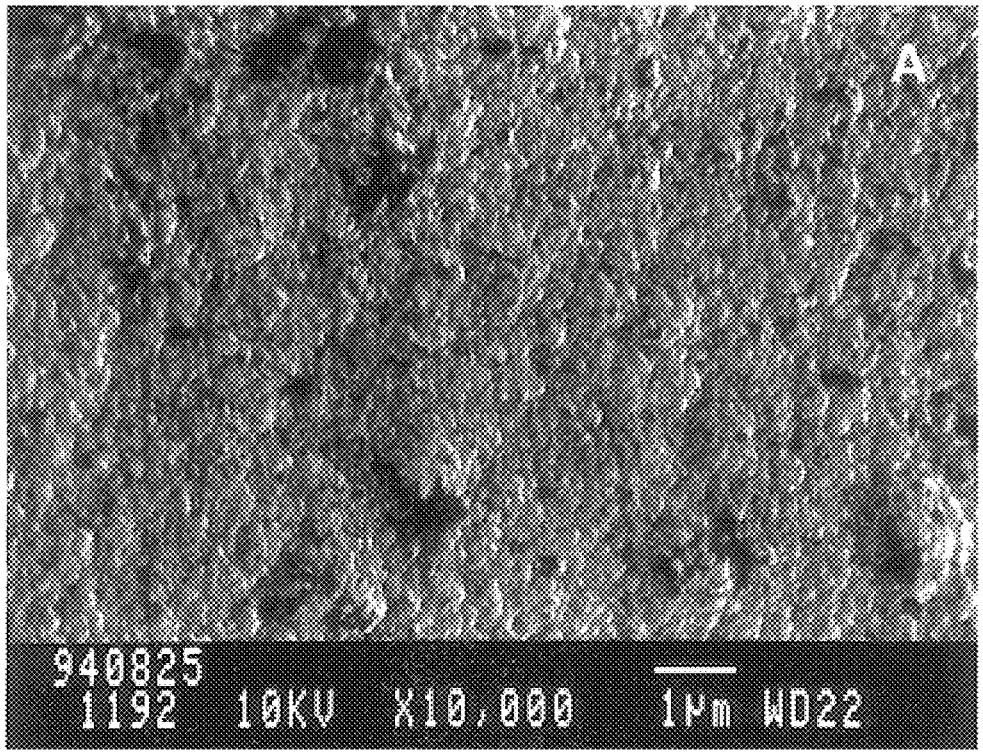
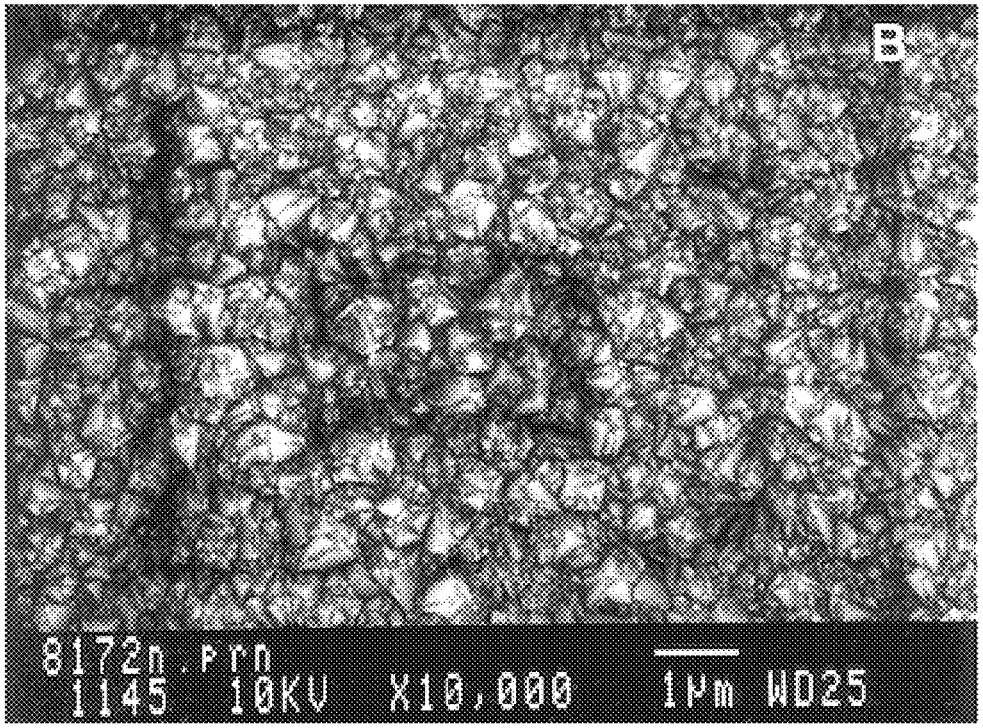
Fig. 33

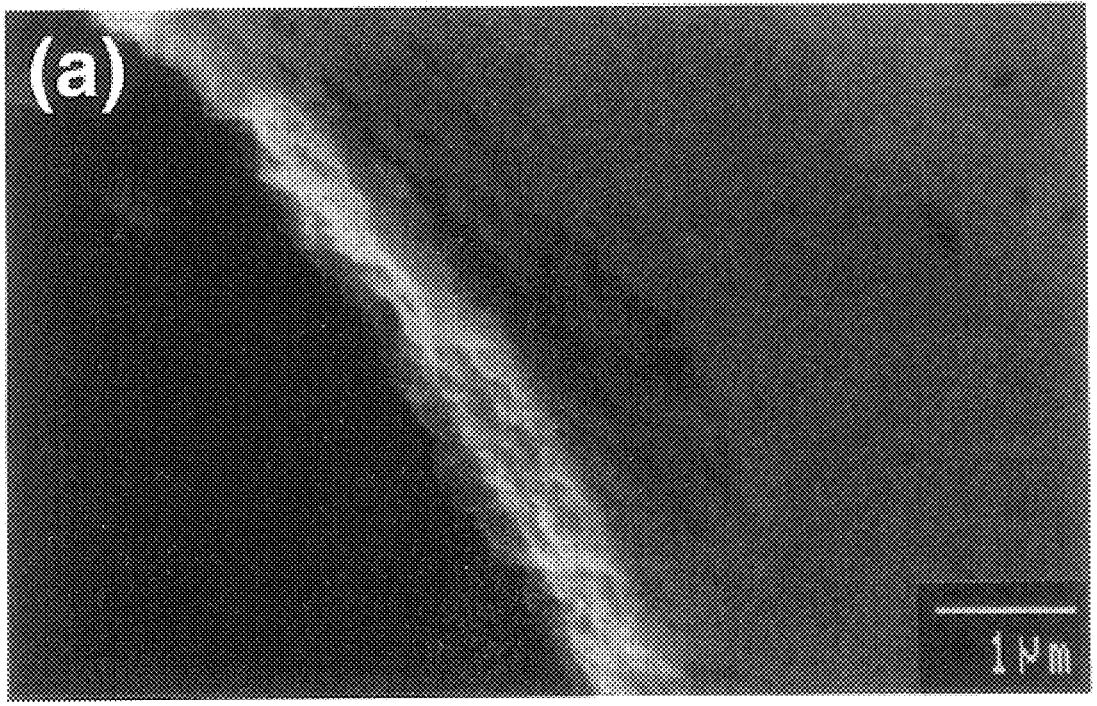
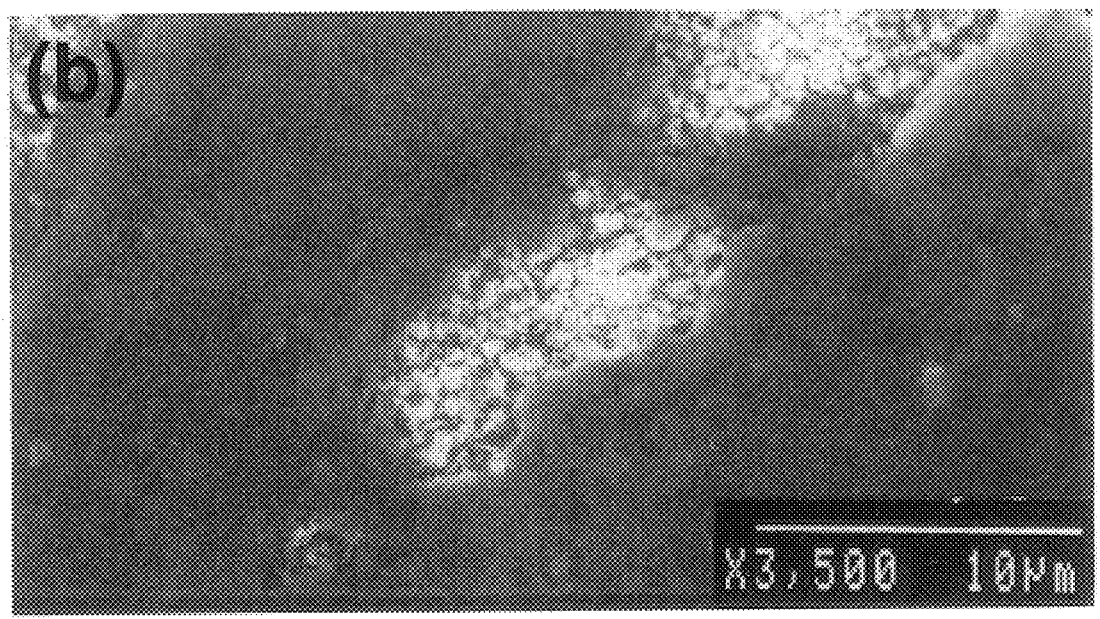
Fig 34

SMOOTH DIAMOND FILMS AS LOW FRICTION, LONG WEAR SURFACES

This application is a continuation-in-part of Ser. No. 08/143,866 filed Oct. 27, 1993, U.S. Pat. No. 5,620,512, which is a continuation-in-part of Ser. No. 08/35,419, filed Mar. 23, 1993, U.S. Pat. No. 5,370,855, which is a continuation-in-part of Ser. No. 07/797,590 filed Nov. 25, 1991, U.S. Pat. No. 5,209,916.

The United States Government has rights in this invention pursuant to Contract W-31-109-ENG-38 between the U.S. Department of Energy and the University of Chicago.

The present invention is directed generally to thin film coatings of diamond having ultralow friction and wear properties. Such diamond films are prepared from carbon precursors in a noble gas or noble gas/hydrogen gas atmospheres. More particularly, the invention is concerned with nanocrystalline diamond films which are extremely smooth (20–50 nm root mean square deviation from flatness) with sliding friction coefficients one to two orders of magnitude lower than diamond films prepared using conventional $H_2CH_4$ plasmas. These diamond films are prepared by dissociation of a gaseous carbonaceous compound using an excited plasma which contains the carbonaceous compound and a noble gas (such as Ar), a combination of noble gases or a noble gas/hydrogen gas mixture. The carbonaceous compound can comprise at least one of fullerene, methane, acetylene or anthracene.

The attractive mechanical and tribological properties of polycrystalline diamond ("PCD" hereinafter) and amorphous carbon films make these materials good prospects for a wide range of engineering applications, including bearings, seals and cutting tools. In applications where high contact stresses and thermal cycling are experienced (such as in tribology), it is important that such films have strong adhesion, very smooth surface finish and high thermal stability. In recent years, considerable progress has been made in the deposition and commercial utilization of amorphous carbon films (both hydrogenated and hydrogen-free), but their uses are limited by graphitization at elevated temperatures. Moreover, progress on PCD films has been rather limited. Currently, the technology is limited by such barriers as poor adhesion, slow growth rates and rough surface finish. In particular, it has been difficult to produce smooth diamond films without a compromise between film quality and deposition rate. In most cases, the films have consisted of large diamond grains with nondiamond precursors as the continuous phase. Further details of conventional methods will be discussed hereinbelow.

The generally rough surface finish of PCD films precludes their immediate use for most machining and wear applications. When used in sliding-wear applications, such rough films cause high friction and very high wear losses on mating surfaces. In machining operations, these films result in a rough surface finish on final products. Attempts have been made in recent years to develop effective chemical etching and mechanical polishing techniques. However, the extreme hardness of diamond makes mechanical polishing very difficult, and the chemical inertness of diamond causes most chemical etching and lithographic processing techniques to be ineffective. Laser beam techniques appear to be more successful but require longer processing times. These additional steps increase the cost of the final products and are difficult or impossible to apply to complex shapes. The consensus is that efficient ways need to be found to produce smooth diamond films and to increase their deposition rates before diamond coatings can become sufficiently cost-effective to warrant their widespread utilization in machining and sliding-wear applications.

In general, diamond films exhibit a combination of outstanding properties including exceptional hardness, thermal conductivity, electrical resistance, chemical inertness, optical transmittance, electrical carrier mobility and dielectric breakdown strength. As described above, these outstanding physical and chemical properties have led to widespread efforts to develop improved methods of manufacturing diamond films. In particular, prior art methods have been directed to chemical vapor deposition using a hydrogen gas atmosphere and high substrate temperatures, about 800° C.–1000° C. The hydrogen gas is dissociated into atomic hydrogen in the reaction vessel, and the atomic hydrogen is then reacted with various carbon containing compounds to form condensable carbon radicals, including $CH_3$ which are deposited to form the diamond layers. The resulting diamond layers are typically quite rough and have large grain size (about 5–10 microns). Typically, such diamond films are grown using about one mole percent of a hydrocarbon precursor (such as methane) in a hydrogen gas atmosphere. It is conventionally accepted that a large excess of hydrogen gas is essential for the diamond thin film growth process.

In such conventional methods of manufacture, hydrogen in varying amounts is invariably incorporated into the growing diamond film which gives rise to a variety of structural, electronic and chemical defects relative to bulk diamond. Although it is known that diamond film manufactured using hydrogen does introduce such defects, experimental results and theoretical works on growth mechanisms conclude that substantial hydrogen must be present during diamond film growth processes. For example, it has been shown that diamond film can be obtained using CO and $CO_2$ gas after exposing the initially produced deposits periodically to hydrogen in order to remove nondiamond carbon deposits. Methods of manufacture using methane-argon or methane-helium atmospheres have also been employed, but resulted only in formation of graphite or diamond-like carbon films, not diamond. Other researchers used methane-helium mixtures, but obtained growth of diamond films only when a methane-helium discharge atmosphere was alternated with a hydrogen—oxygen—helium discharge atmosphere. Further research work has determined that the alleged lower limit for diamond film growth in the $CO—H_2$ system required at least 25 mole percent hydrogen gas. Finally, although defects arise from the presence of hydrogen, various theoretical approaches have concluded that hydrogen is a necessary part of the reaction steps in forming diamond film in chemical vapor deposition reactions.

In other methodologies smooth films can be grown at low substrate temperatures, such as room temperature, and in the absence of hydrogen. However, such processes do not form a true diamond structure, rather forming "amorphous" diamond or "diamond-like" films. In other processes nanocrystalline diamond has been successfully grown in $H_2—CH_4$ plasmas by increasing the $CH_4/H_2$ ratio; but the result is an increase in graphitic character and the production of a "cauliflower" type of microstructure having properties which do not lend itself to useful commercial applications.

It is therefore an object of the invention to provide an improved form of diamond films for coating selected substrates.

It is a further object of the invention to provide a novel diamond film having nanocrystalline grain size and exhibiting ultralow friction coefficient and excellent wear properties.

It is an additional object of the invention to provide an improved nanocrystalline diamond film coating having an extremely smooth surface with 20–50 nm root mean square flatness.

It is also an object of the invention to provide a novel nanocrystalline diamond film having an ultrasmooth surface of about 3–6 nm root mean square flatness after undergoing sliding wear.

It is yet a further object of the invention to provide an improved diamond film having an accompanying graphite phase disposed on the surface undergoing sliding wear.

It is still another object of the invention to provide a novel nanocrystalline diamond film having substantially pure $sp^3$ bonding states for the carbon atoms of the film.

It is also an additional object of the invention to provide an improved nanocrystalline diamond film having a sliding friction coefficient against $Si_3N_4$ balls of 0.04 and 0.12 in dry $N_2$ and air, respectively, and about five to ten times lower than conventional $H_2$—$CH_4$ plasma deposited films.

It is another object of the invention to provide a novel system and method for manufacturing diamond film coated substrates by using a plasma of a noble gas, or a noble gas/hydrogen mixture and a hydrocarbon gas or fullerene compound.

It is an additional object of the invention to provide an improved system and method for manufacturing diamond film coated substrates employing a plasma atmosphere of argon, 0–20% hydrogen and $CH_4$ or $C_2H_2$.

It is also another object of the invention to provide an improved system and method of manufacturing a diamond film coated field emission tip.

It is yet a further object of the invention to provide a novel system and method of manufacturing a substrate coated with a nanocrystalline, regular shaped grains of diamond substantially free of graphite.

It is an additional object of the invention to provide an improved diamond film coated article of manufacture grown by use of argon, argon/hydrogen or argon/methane, ethylene or anthracene mixtures at low substrate temperature, above about 470° C.

It is a further object of the invention to provide a novel system and method for manufacturing a diamond film by chemical vapor deposition from decomposition of molecules to form carbon dimers which promote the growth of diamond.

It is yet another object of the invention to provide an improved system and method for manufacturing a diamond film from a fullerene molecular gas decomposed by collisions in a noble gas or mixed noble gas/hydrogen plasma.

It is still an additional object of the invention to provide a novel system and method for manufacturing a diamond film by excitation of an argon or argon/hydrogen gas mixture to metastable states able to transfer energy to a fullerene or hydrocarbon molecule causing decomposition to form the diamond film.

It is also an object of the invention to provide an improved method and system for making a diamond film by microwave energy decomposition of fullerene molecules or compounds consisting of hydrocarbon gases in the presence of a noble gas, such as argon, also in combination with hydrogen.

It is also an object of the invention to provide an improved method and system for making a diamond film by decomposition of fullerene molecules or compounds consisting of hydrocarbon gases in the presence of a noble gas, such as argon, also in combination with hydrogen.

It is still a further object of the invention to form an abrasion resistant diamond coating by carbon dimer decomposition onto a substrate.

These and other objects of the invention will be described in detail in the detailed description provided herein below and taken in conjunction with the drawings described below.

BRIEF DESCRIPTION OF THE DRAWINGS

FIG. 11A and B show SEM micrographs of Film A with FIG. 11A being before tribological testing and FIG. 11B being the wear track area after tribological testing;

FIG. 27B shows a transmission electron microscope image of a diamond layer prepared from a plasma of $CH_4/Ar$.

FIG. 33A illustrates an SEM micrograph of the diamond coating in FIG. 32 prepared by the method of the invention and FIG. 33B shows an SEM micrograph of the diamond coating in FIG. 32 prepared by conventional $H_2$—$CH_4$ plasma deposition;

FIG. 34A illustrates an SEM micrograph of the diamond coating of FIG. 33A along a wear track of SiC pins sliding against the coating and FIG. 34B is for the wear track on the diamond coating of FIG. 33B;

DETAILED DESCRIPTION OF PREFERRED EMBODIMENTS

Figure 1:
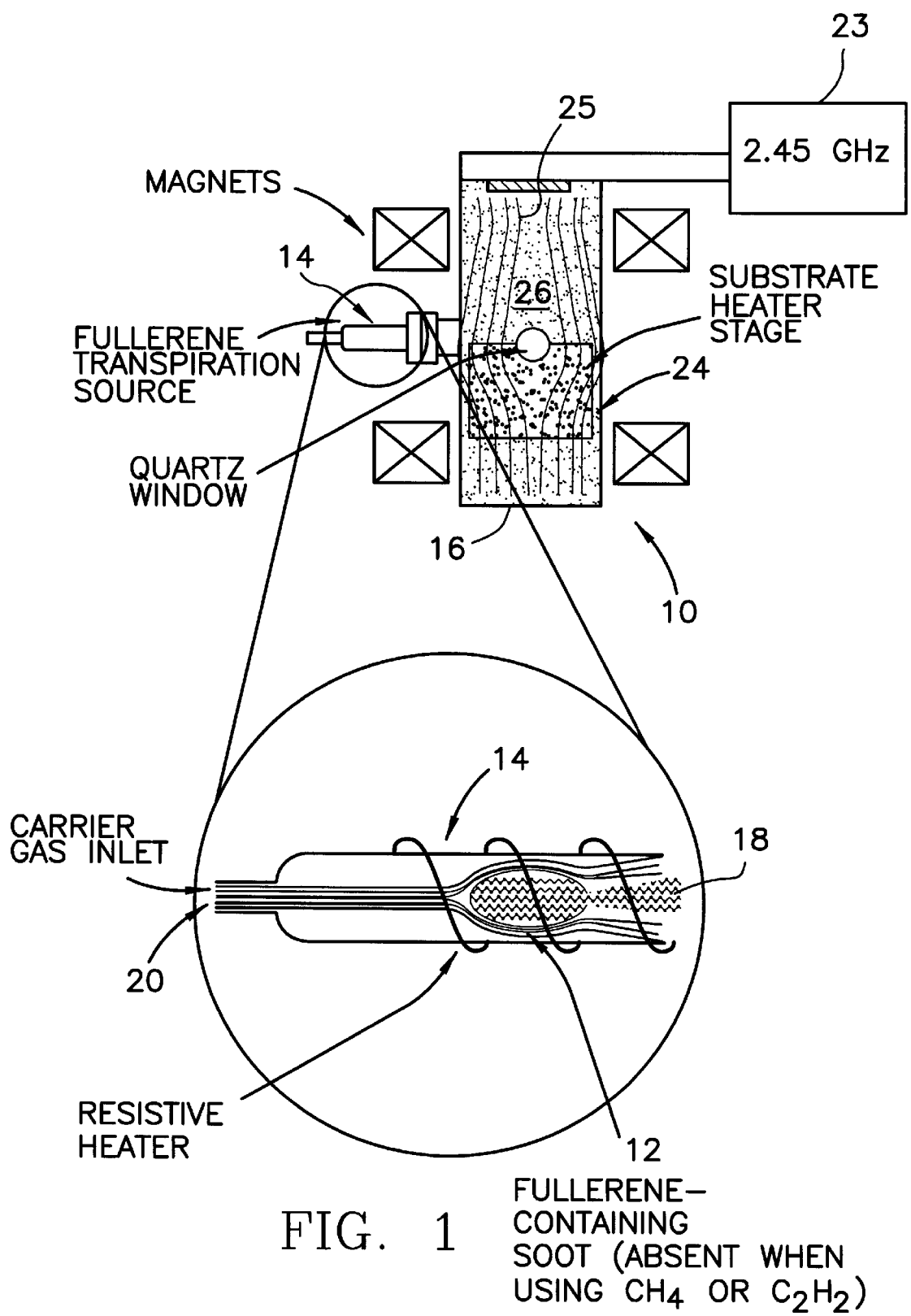
FIG. 1 illustrates a system constructed in accordance with one form of the invention for manufacturing diamond film.

A microwave plasma deposition system 10 (hereinafter "system 10") constructed in accordance with one form of the invention is illustrated in FIG. 1. The system 10 is based on a ASTeX (PDS-17) commercial plasma deposition apparatus manufactured by Applied Science and Technology. Fullerene containing soot 12 used as a staring material was treated to remove hydrocarbon contaminants by contact with methanol. The treated soot 12 was then thoroughly degassed by conventional vacuum and/or thermal treatment (such as heating at 200° C. for 2 hours). The degassed soot 12 was placed in a sublimator 14 which is coupled to plasma deposition chamber 16, and the volume of the sublimator 14 is also coupled to the volume of the plasma deposition chamber 16. Thus, fullerene containing vapor 18 can be introduced into the plasma deposition chamber 16 by heating the sublimator 14 (for example, by Pt resistance wire heating) to a temperature adequate to cause fullerene sublimation (such as, about 550° C. to 600° C.). A noble carrier gas (such as, argon, neon, krypton and xenon) and lower percentages (0–19%) of hydrogen are introduced through gas inlet 20 enabling the gas mixture to transport the sublimed fullerene containing vapor 18 into the plasma deposition chamber 16.

Figure 2:
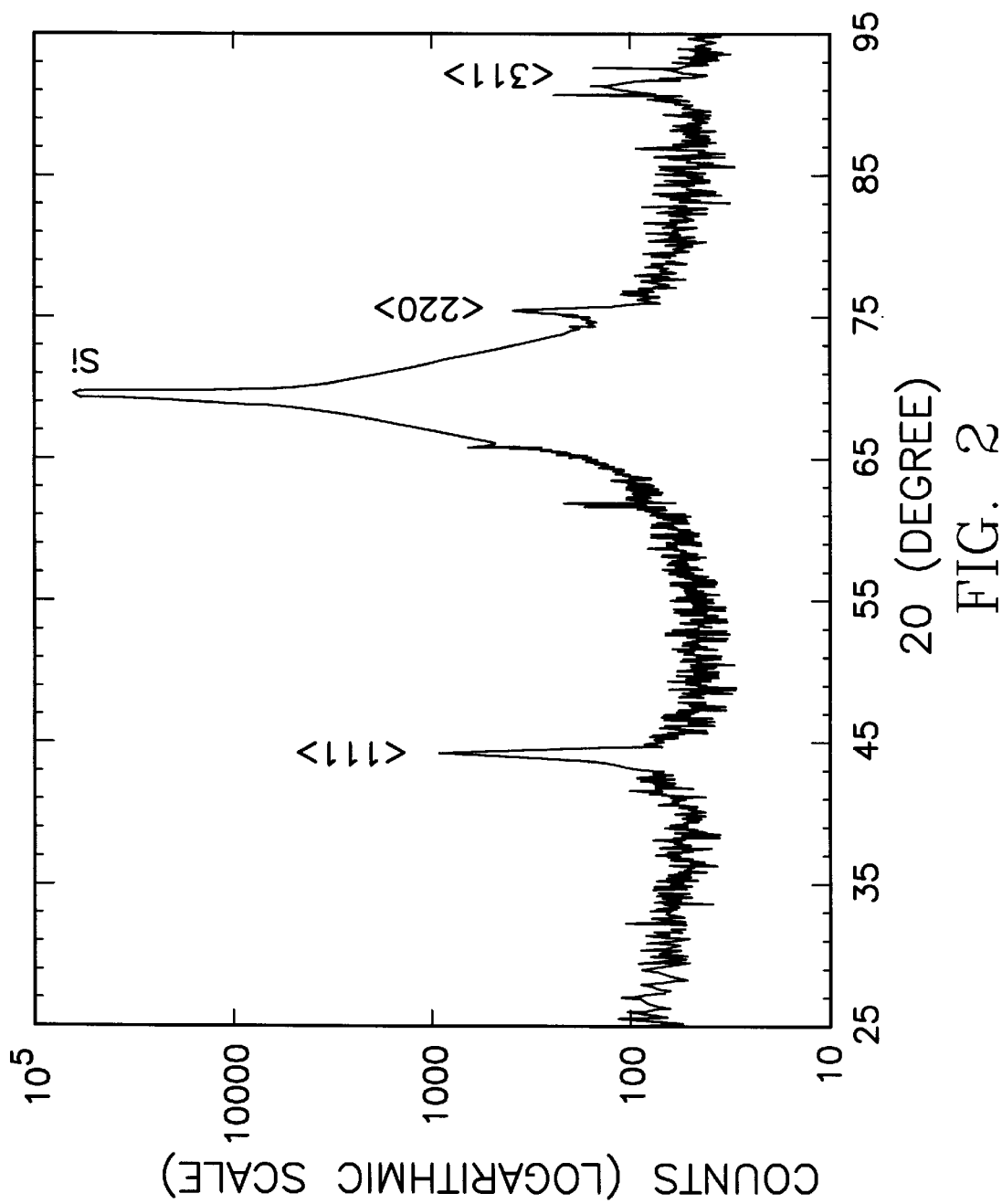
FIG. 2 illustrates an X-ray diffraction pattern for a diamond film on a silicon substrate with diamond grown by one method of the invention.

A substrate 22 was used to accumulate deposited carbon as a diamond layer on the substrate 22. The substrate 22 can be a single crystal silicon wafer, or one of various metals or ceramics. The substrate 22 can also be disposed on a graphite stage 24, which not only can support the substrate 22 but can act as a heating element to control the substrate temperature. Using a microwave generator 23, a microwave field 25 is established within the plasma deposition chamber 16 in order to generate an excited plasma 26. A variety of gas mixtures and other experimental conditions were utilized to produce diamond layers, and a sampling of representative values are shown in Table 1. Films labeled A–E were grown to comparable thickness to allow direct comparison. Films F and G were grown to examine properties of thick films grown under the same conditions, and Film G was grown under conventional $H_2$—$CH_4$ conditions. A bare silicon substrate was tested for comparison. Diamond film growth was monitored in situ using laser reflectance interferometry to determine growth rate and to allow stopping film growth at a selected thickness.

the three major diamond diffraction peaks corresponding to the (111), (220) and (311) reflections (see FIG. 2). Particular regions of the diamond layer were also examined by selected area electron diffraction and confirmed the lattice of the film was a face centered cubic structure with lattice constant of 3.53±0.10 Angstroms (the accepted diamond lattice constant is 3.56 Angstroms).

AES spectra were obtained using a Physical Electronics model 548 spectrometer with a double pass cylindrical mirror analyzer. The carbon KLL peak shape is sensitive to the bonding state of carbon, providing a qualitative means of assessing the $sp^2/sp^3$ ratio of the films. Near-edge extended X-ray absorption fine structure (NEXAFS) spectroscopy reveals structures corresponding to graphitic ($sp^2$) electron bonding between carbon atoms (286 eV), hydrogen—carbon bonding (288 eV) and diamond ($sp^3$) bonding between carbon atoms (290 eV). TEM imaging was performed in a JEOL 4000EXII operating at 400 kV. Specimens for TEM were prepared using standard dimpling and ion milling procedures. The surface was characterized using a Burleigh ARIS-3300 AFM to measure the rms surface roughness and a JEOL JXA-840A SEM to image the surface.

Friction and wear tests (see Table 1 for results) were performed with pairs of silicon nitride balls and diamond-coated silicon substrates on a ball-on-disk tribometer. Tests were run in dry nitrogen environments. A Plexiglas cover was fitted over the tribometer, permitting ultra dry environments to be created. Several specimens without the diamond

TABLE 1

| Film | Sample ID # | $H_2$ Flow sccm | Ar Flow sccm | $CH_4$ Flow sccm | $C_{60}$ T-furn ° C. | Pres. Torr | Power W | Substr Temp ° C. | Growth Rate µm/hr | Diamond Thickness µm | RMS Roughness nm | Friction Coef. | Wear Rate ×$10^{-6}$ $mm^3$/Nm |
|---|---|---|---|---|---|---|---|---|---|---|---|---|---|
| A | 940825 | 2 | 100 | 0 | 600 | 100 | 1500 | 850 | 0.3 | 1.7 | 30 | 0.12 | 0.014 |
| B | 940926B | 10 | 90 | 0 | 630 | 100 | 1500 | 850 | 0.9 | 2.0 | 105 | 0.18 | 0.15 |
| C | 940927 | 2 | 98 | 0 | 630 | 100 | 1500 | 850 | 0.25 | 2.0 | 41 | 0.04 | 0.1 |
| D | 940928 | 10 | 90 | 0.8 | 20 | 100 | 1500 | 850 | 0.8 | 2.0 | 125 | 0.21 | 0.88 |
| E | 940929 | 1.5 | 98 | 0.8 | 20 | 100 | 1500 | 850 | 0.5 | 2.3 | 53 | 0.08 | 0.4 |
| F | 941013 | 2 | 100 | 1 | 20 | 100 | 800 | 850 | 0.7 | 10 | 45 | — | — |
| G | 950802 | 98 | 0 | 2 | 20 | 60 | 1500 | 800 | 0.5 | 6 | 376 | 0.3 | 55 |
|  | Silicon | — | — | — | — | — | — | — | — | 0 | <3 | 0.42 | 1.2 |

The system 10 operates to deposit diamond on the substrate 22, and the diamond samples produced were characterized by a variety of conventional materials characterization techniques, such as, X-ray diffraction, Auger electron spectroscopy (AES), electron diffraction, transmission and scanning electron microscopy, atomic force microscopy (AFM), electron energy loss spectroscopy, and Raman spectroscopy. In addition, various wear rate tests were performed (see Table 1).

Raman spectra of the films were measured with a Renishaw Raman microscope using a HeNe laser at 632.8 nm with an output of 25 mW focused to a spot size of about 2 nm. Raman spectroscopy is widely used to characterize diamond films, although the small grain sizes in these films have a significant effect on the Raman spectrum. Raman spectroscopy revealed a band centered at 1333 $cm^{-1}$ and a broad band feature at about 1550 $cm^{-1}$. The 1333 $cm^{-1}$ band is characteristic of all diamond films regardless of grain size, and the 1550 $cm^{-1}$ band feature is also commonly observed from small grain size diamond films.

A Phillips powder diffractometer with $CuK_\alpha$ radiation was used for XRD measurements to ensure the presence of diamond and check for evidence of crystalline graphite. X-ray diffraction examination of the diamond layers showed films were also tested, primarily to assess and compare their tribological performance to those with a diamond film. The dead weight applied to the balls was 2 N. Frictional force was monitored with the aid of a linear variable-displacement-transducer and was recorded on a floppy disk via a data acquisition system throughout the tests. The rotational velocity was kept between 50 to 150 r/min. to provide sliding velocities of 25 to 40 mm/s. Sliding distance was 200 m. Wear-volume measurements on the balls were based on microscopic determination of the diameter of the circular wear scars. The wear of disk specimens was estimated from the traces of surface profiles across the wear tracks. Duplicate tests were run under conditions described above to check the reproducibility of the friction and wear data.

Figure 12A:
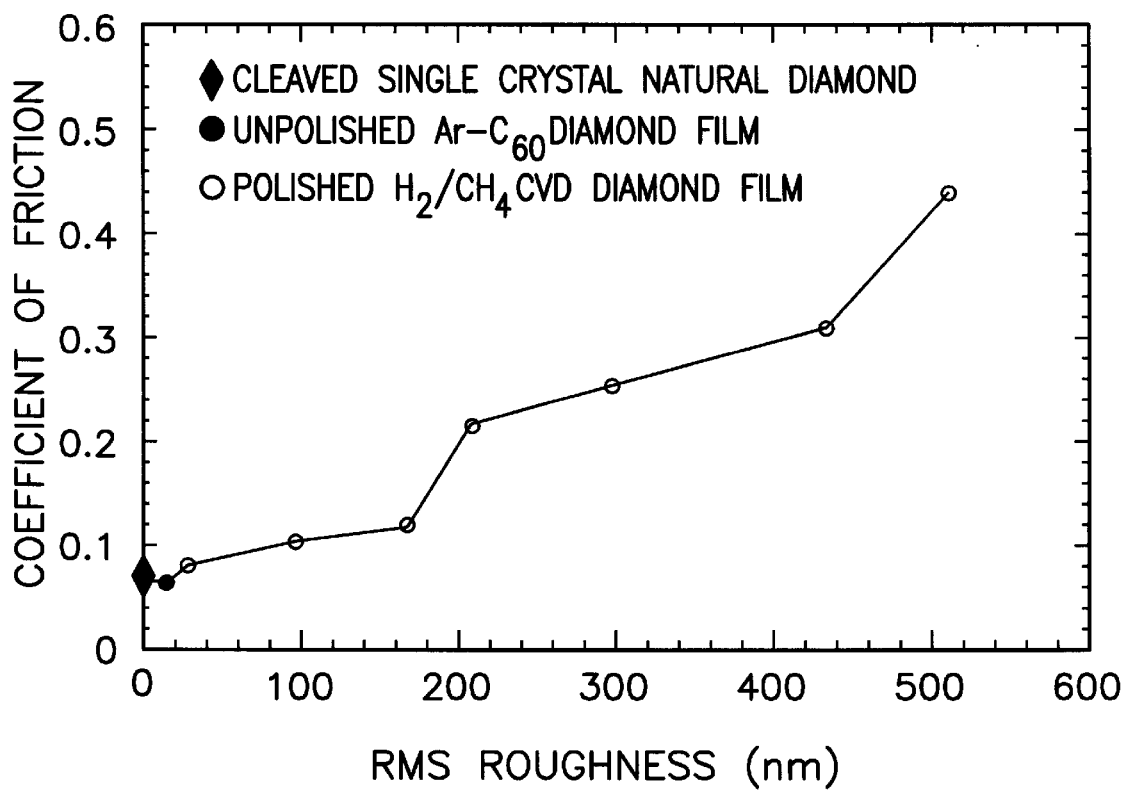
FIG. 12A shows the friction coefficient of polished CVD diamond film as a function of surface roughness. Also shown are the measured friction coefficients of a cleaved single crystal natural diamond and an as-deposited diamond film deposited using an Ar—$C_{60}$ plasma. There is a strong correlation between the surface roughness and friction coefficient, and the Ar—$C_{60}$ film is close in both properties to the cleaved single crystal diamond sample.
Figure 12B:
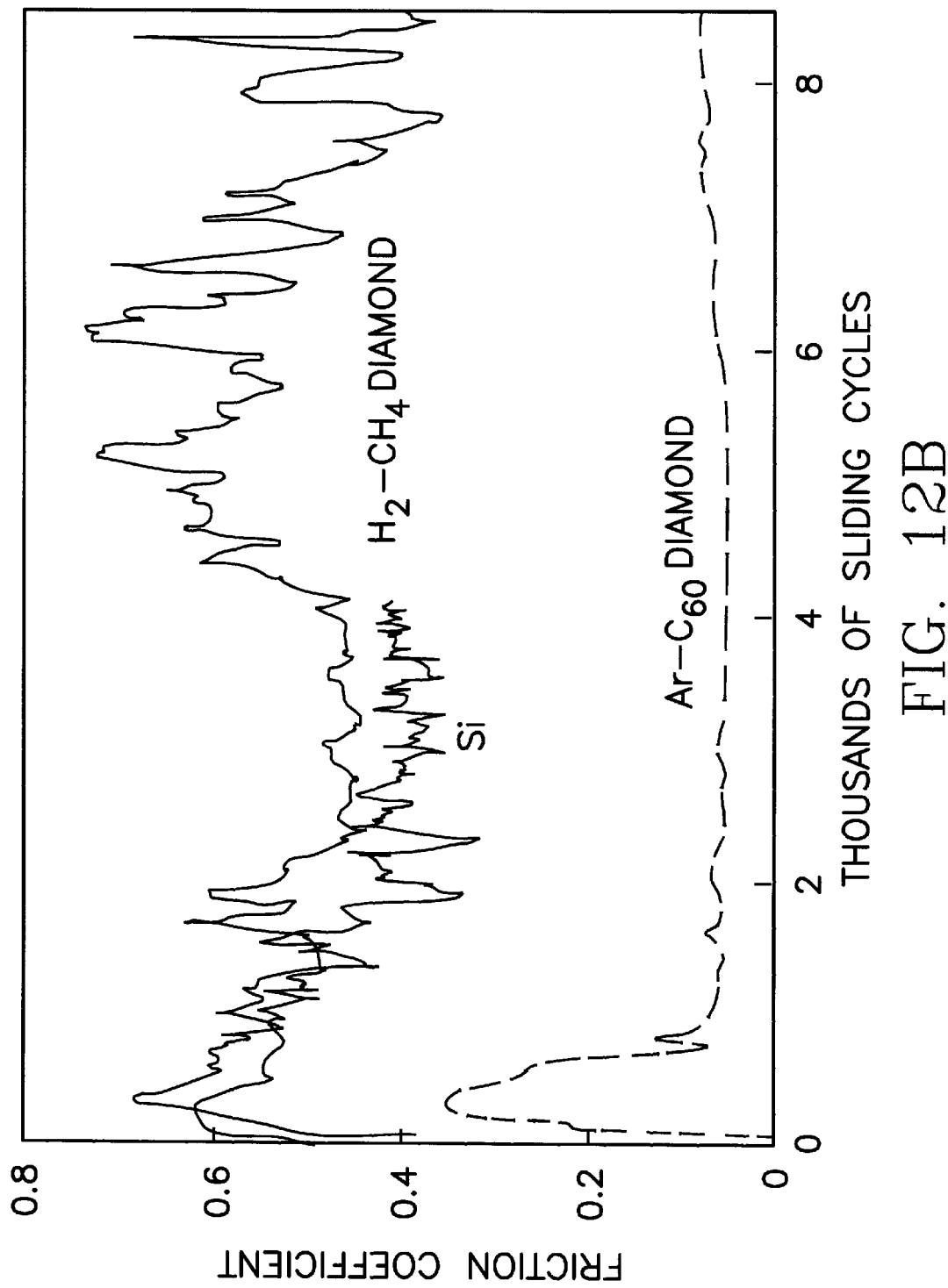
FIG. 12B shows the variation of the friction coefficients of Films C, D and an uncoated silicon substrate during sliding against $Si_3N_4$ balls in dry $N_2$ under a 2 N load; Film C achieves a friction coefficient comparable to cleaved single crystal national diamond.

Conventional $H_2$—$CH_4$ (no argon) plasma deposition of CVD diamond thin films results in rough films which must be polished in order to obtain a smooth surface. Since diamond is the hardest known material, this task, depending on the geometry of the surface, ranges from difficult to impossible. FIG. 12A shows the friction coefficient of polished CVD diamond film as a function of surface roughness. Also shown are the measured friction coefficients of a cleaved single crystal natural diamond and an as-deposited diamond film deposited using an Ar—$C_{60}$ plasma. There is a strong correlation between the surface roughness and friction coefficient, and the Ar—$C_{60}$ film is close in both properties to the cleaved single crystal diamond sample. The measured friction coefficients for samples A and F in Table 1 as well as the uncoated Si substrate, are shown in FIG. 12B. Referring to Table 1 and FIG. 12B, it can be seen that for a given carbon precursor, the hydrogen concentration in the plasma strongly affects the roughness and wear rates. The lowest friction and wear coefficients are obtained for low plasma hydrogen concentrations, and the films grown from the $C_{60}$ precursor tend to be much smoother than those grown from the $CH_4$ precursor.

Figure 4:
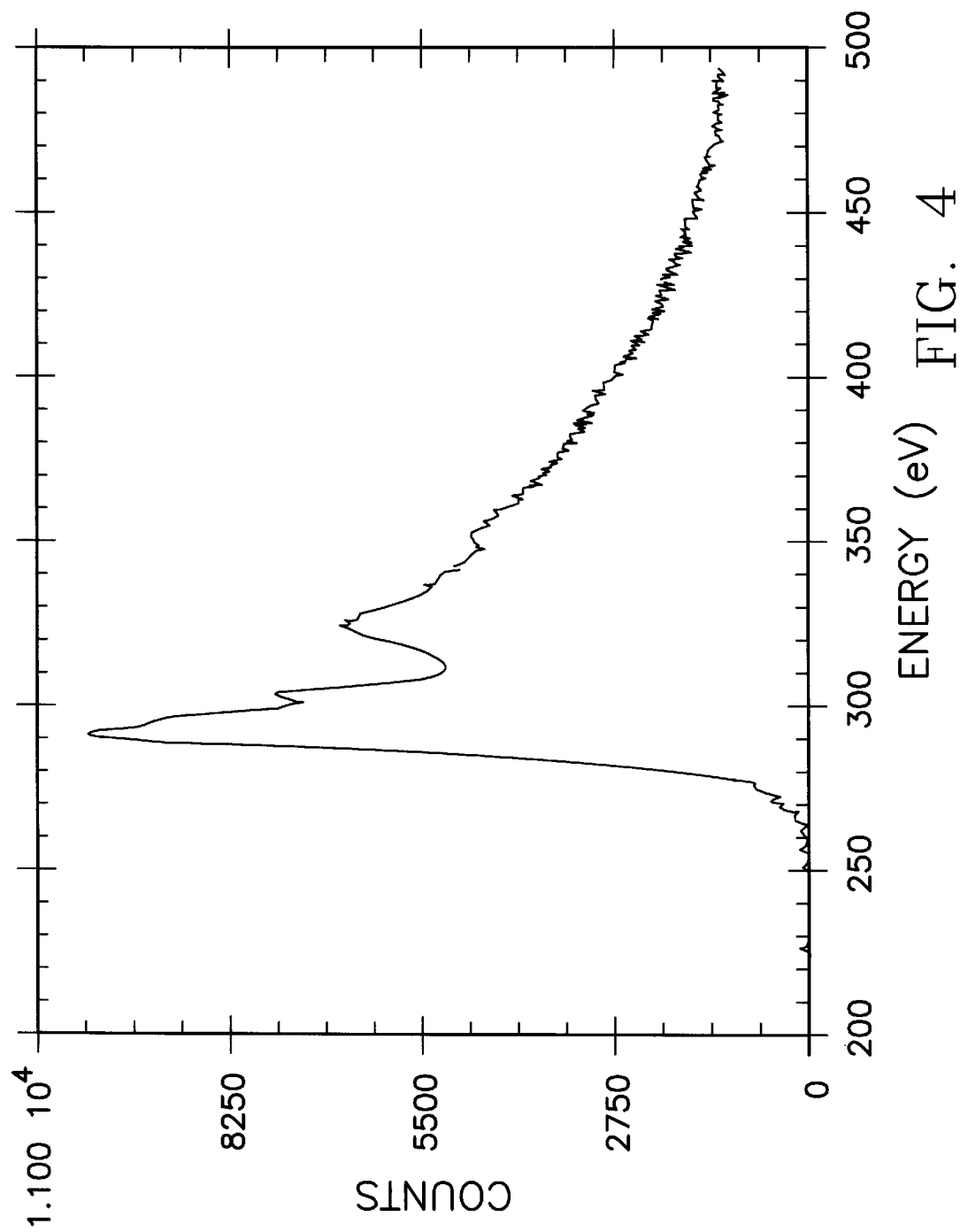
FIG. 4 illustrates an electron energy loss spectrum from a diamond film grown in accordance with one form of the invention.
Figure 5:
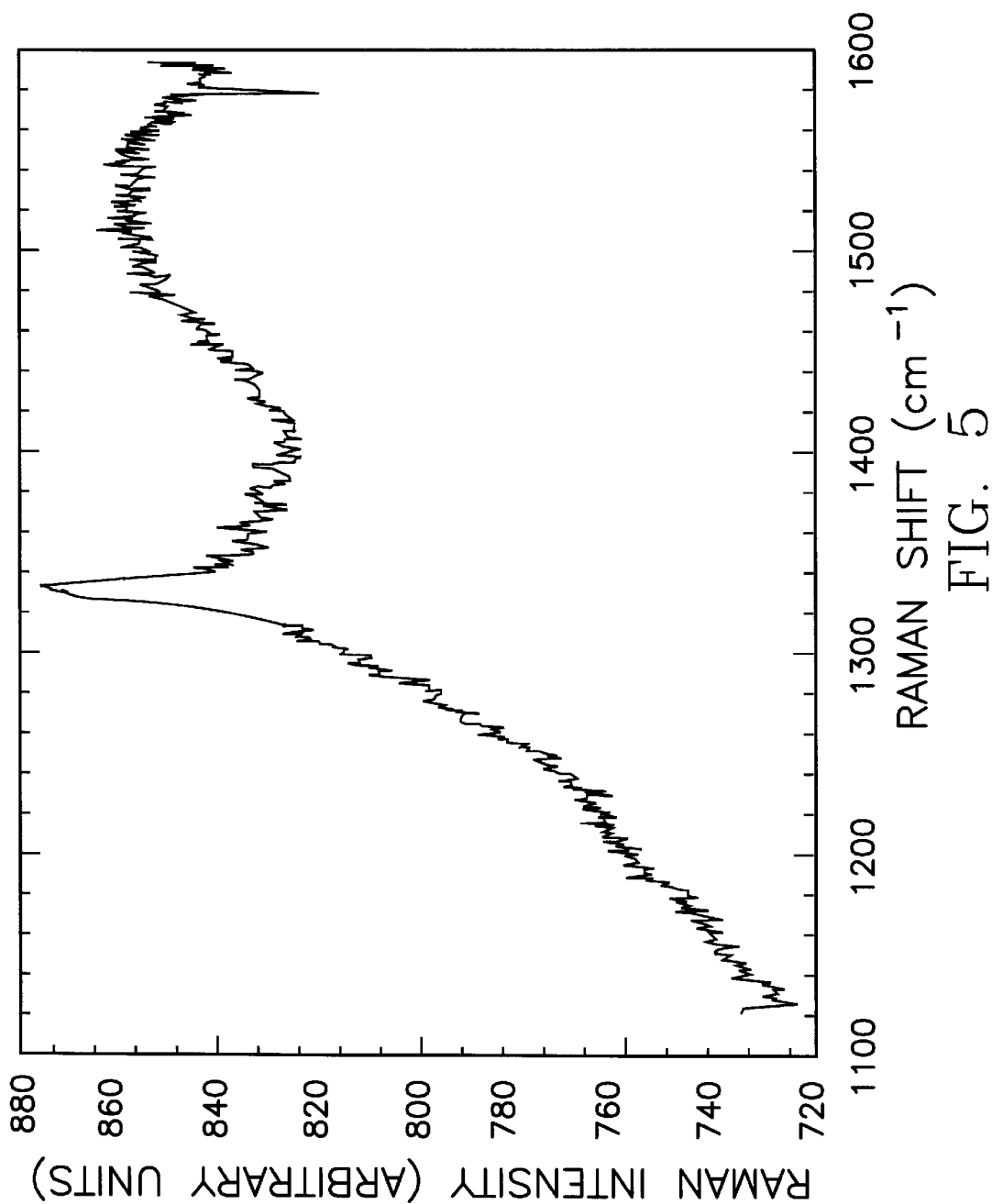
FIG. 5 illustrates a Raman spectrum from a diamond film grown in accordance with one form of the invention.

Transmission electron microscopy further determined that the diamond film was very fine-grained (~15 nm diameter), and the intergranular boundaries are free from graphitic contamination. Further characterization was performed by electron energy loss spectroscopy. The deposited specimen layers were examined, and a K-edge absorption peak was identified at about 291 eV, with no evidence of a graphite or amorphous carbon peak at 285 eV (see FIG. 4).

In another embodiment of the invention, additional diamond films were grown in the system 10 (a microwave plasma chemical vapor deposition reactor, ASTeX PDS-17 as previously described). The films were grown on silicon substrates polished with 0.1 μm diamond particles to enhance nucleation. In-situ diagnostics included plasma emission spectroscopy and surface reflectivity measurements. Raman spectroscopy was performed on the films ex-situ to ensure that diamond films were in fact grown.

Emission from the plasma was collected with a quartz optical fiber by viewing a region 1–2 cm above the substrate 22. The light was transmitted to an Interactive Technology model 103 optical monochromator with entrance and exit slit widths of 50 μm and 400 μm respectively. The monochromator was stepped in 2.3 Å increments with a dwell time of 100 msec from 3000 Å to 8000 Å. The dispersed light was detected with a Peltier-cooled photomultiplier tube. The reflectivity of the growing film surface was measured using a 5 mW HeNe laser. The reflected beam was passed through a HeNe laser line filter to eliminate plasma emissions and detected with a photodiode. The oscillations in the reflectivity were used to calculate the film thickness as a function of time and thus provide a measure of the growth rate. A Macintosh IIci was used to control the spectrometer and acquire data from both the spectrometer and photodiode. Raman measurements of the films were performed with a Renishaw Raman microscope using a HeNe laser at 6328 Å.

Plasma emission is observed when atoms or molecules in a plasma are excited to higher energy electronic states which decay mainly by radiative processes. The excited states may also decay by collisional quenching, and for larger molecules, by intermolecular nonradiative processes. Thus, many of the species in the plasma which are or interest, for example $CH_3^\bullet$ and $C_2H_2$, cannot be detected by plasma emission measurements. The emission intensity, proportional to the excited state population of the species, is somewhat difficult to relate to the ground state population because changes in plasma conditions can produce changes in the emission intensity of a species by changing not only the ground state population, but also the excitation rate and the competing deexcitation mechanisms such as quenching. This makes use of plasma emission somewhat difficult for quantitative measurement of ground state species concentrations. Nevertheless, it is believed that the very large changes in emission by $C_2$ relative to other emitting species observed in our experiments, especially those with similar excitation energies, are in fact correlated with an increase in the ground state $C_2$ population. The species observed by plasma emission in these experiments are listed in Table 2. The increases in $C_2$ emission intensity relative to H, Ar, and CH are evidence of an increase in the ground state concentration of $C_2$ in the plasma, though not necessarily a linear increase.

TABLE 2

| Species | Transition | Wavelength Å | Excited State Energy (eV) |
|---|---|---|---|
| H | $^2P^o{}_{1/2} \rightarrow {}^2S_{1/2}$ | 6560 | 12.1 |
| Ar | $4_p[1/2]_o \rightarrow 4s'[1/2]_1{}^o$ | 7504 | 13.5 |
| $C_2$ | $d^3\Pi_g \rightarrow a^3\Pi_u$ | 5165(0–0) | 2.5 |
| CH | $A^2\Delta \rightarrow X^2\Pi_r$ | 4314(0–0) | 2.9 |

Figure 13:
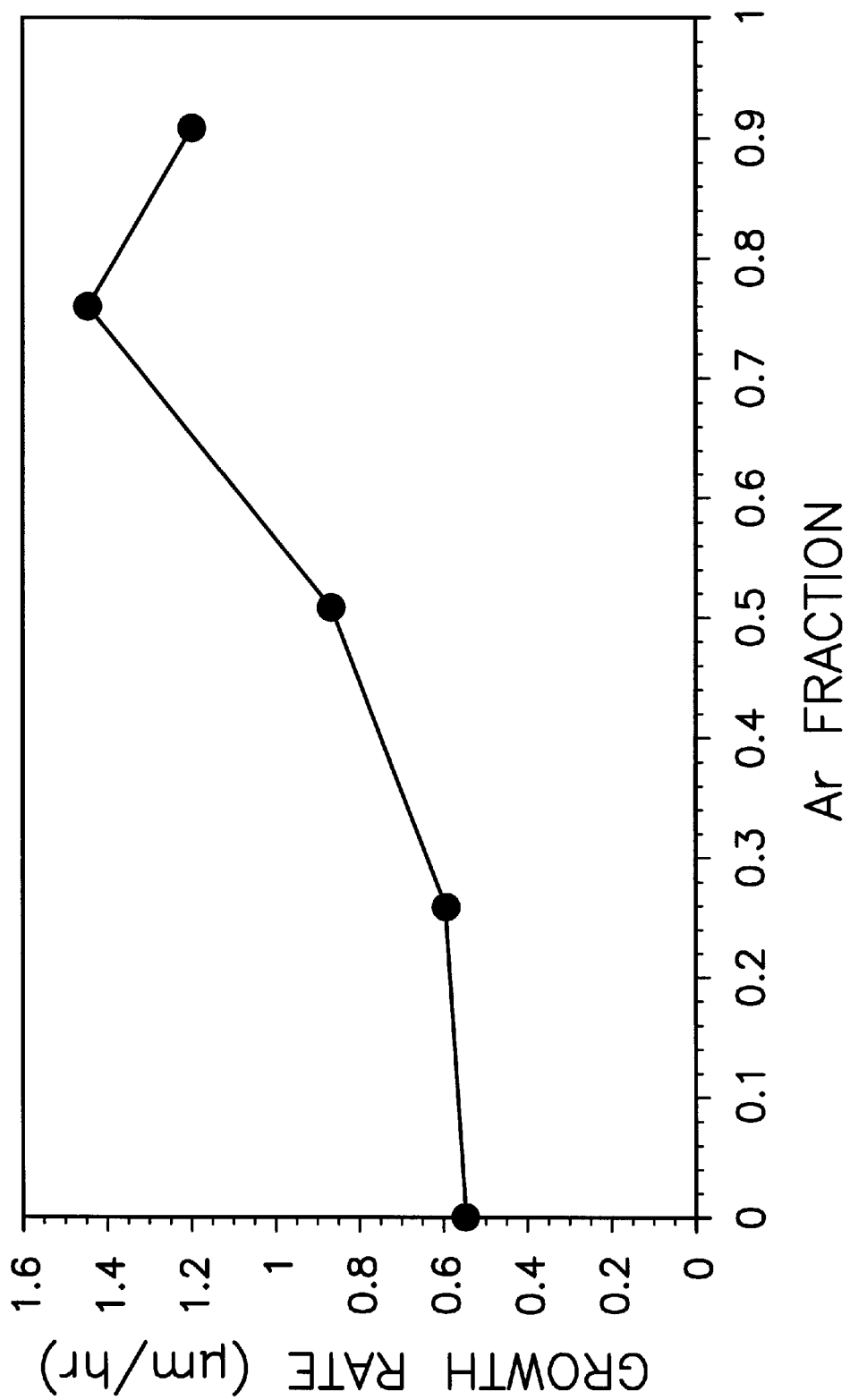
FIG. 13 shows growth rate in an $Ar/H_2/CH_4$ plasma as determined by laser interferometry. The gas mixture contained 1% $CH_4$ and the $Ar/H_2$ ratio was varied. The x-axis of FIG. 13 is $[Ar]/[Ar+CH_4+H_2]$. The growth rate increases with increasing argon fraction to a peak value near a fraction of 0.75; the growth rate increases by nearly a factor of three over the argon-free condition.

The fraction of Ar in the reactor was varied to determine the effect on growth rate and plasma emission for the five conditions shown in Table 3. The total flow of gas to the reactor was kept constant with increasing amounts of argon substituted for hydrogen. For each condition, the gas flow was set and the emission spectrum measured after the growth ratio equilibrated. The growth rate is observed to increase with increasing argon fraction to a peak value for an argon fraction near 0.75 (data condition 4) as shown in FIG. 13. The argon addition leads to growth rates of up to a factor of three greater than that of hydrogen-methane. The change in gas composition has a large effect on the gas phase chemistry, as evidenced by the emission spectrum.

TABLE 3

Power: 1500 W
Pressure: 80 Torr
Temperature: 850° C.

| Data Point | $H_2$ Flow (sccm) | Ar Flow (sccm) | $CH_4$ Flow (sccm) |
|---|---|---|---|
| 1 | 100 | 0 | 2 |
| 2 | 75 | 25 | 2 |
| 3 | 50 | 50 | 2 |
| 4 | 25 | 75 | 2 |
| 5 | 10 | 90 | 2 |

Figure 14:
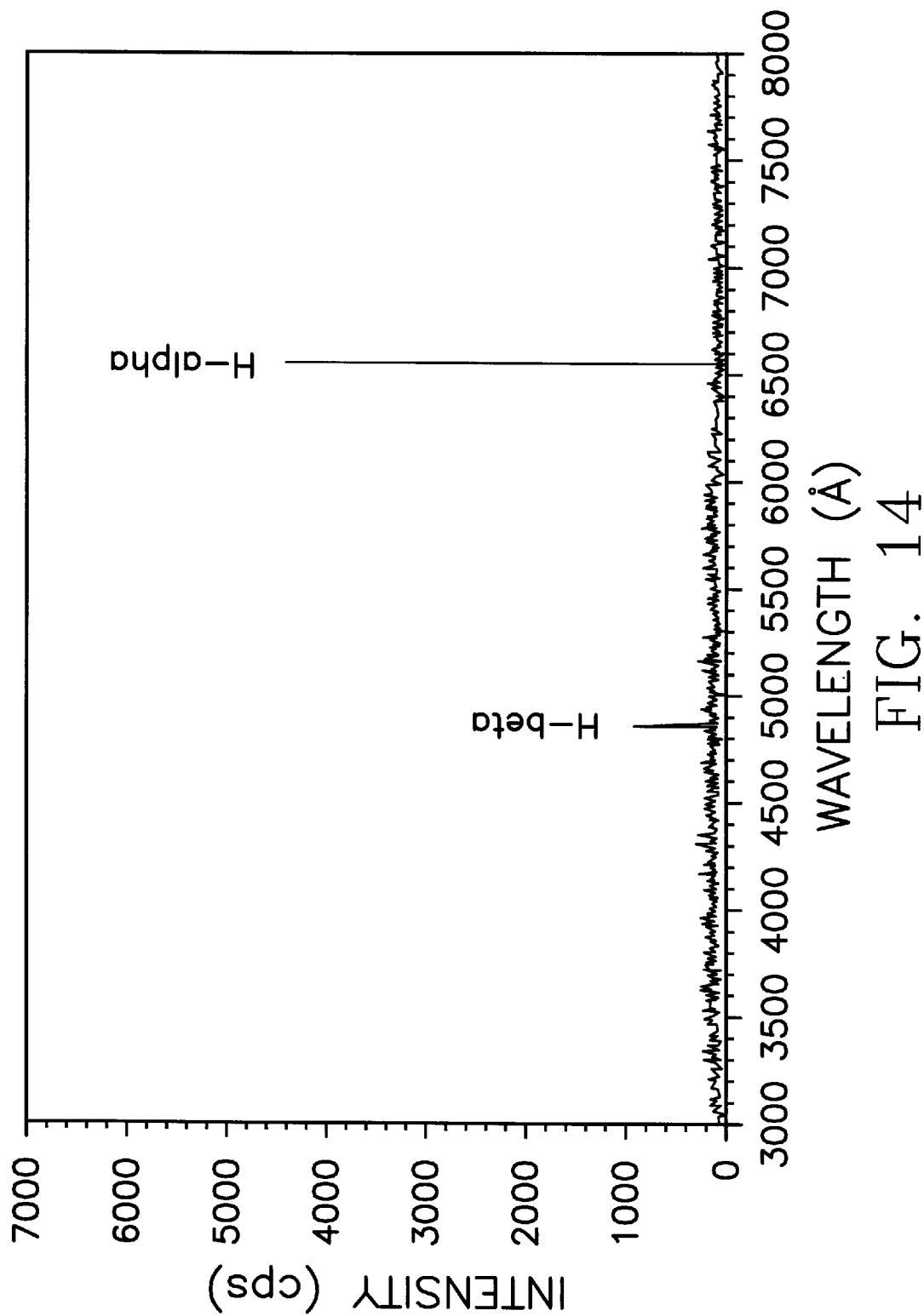
FIG. 14 shows an emission spectrum from a 100 sccm $H_2$ and 2 sccm $CH_4$ plasma; only H-alpha and H-beta emission lines from atomic hydrogen are observed.
Figure 15:
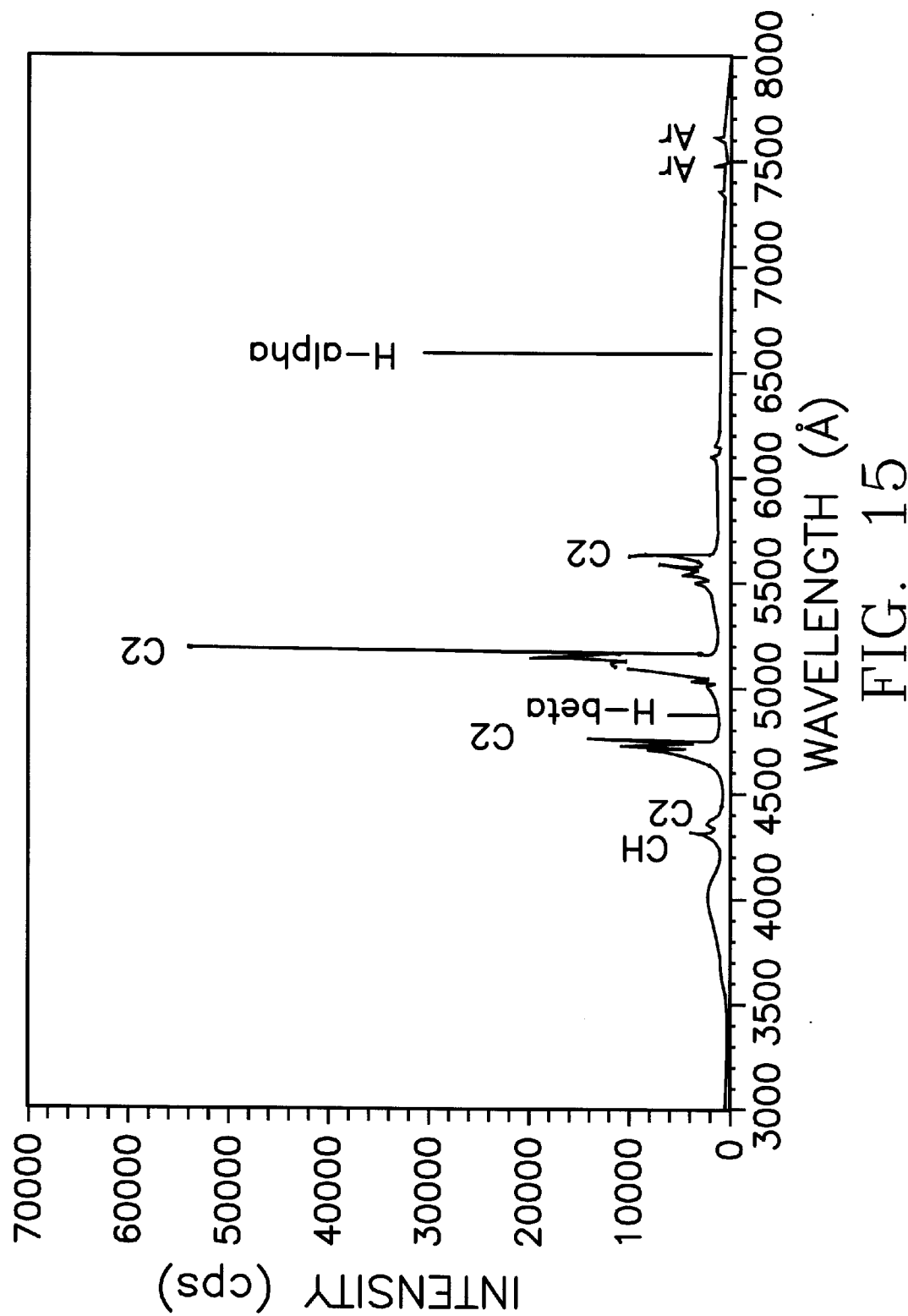
FIG. 15 shows an emission spectrum from 25 sccm $H_2$, 75 sccm Ar and 2 sccm $CH_4$ plasma; the $C_2$ Swan bands and atomic hydrogen lines are prominent, while the CH band at 4310 Å and atomic argon lines at 7504 Å and 7635 Å are distinguishable.
Figure 16:
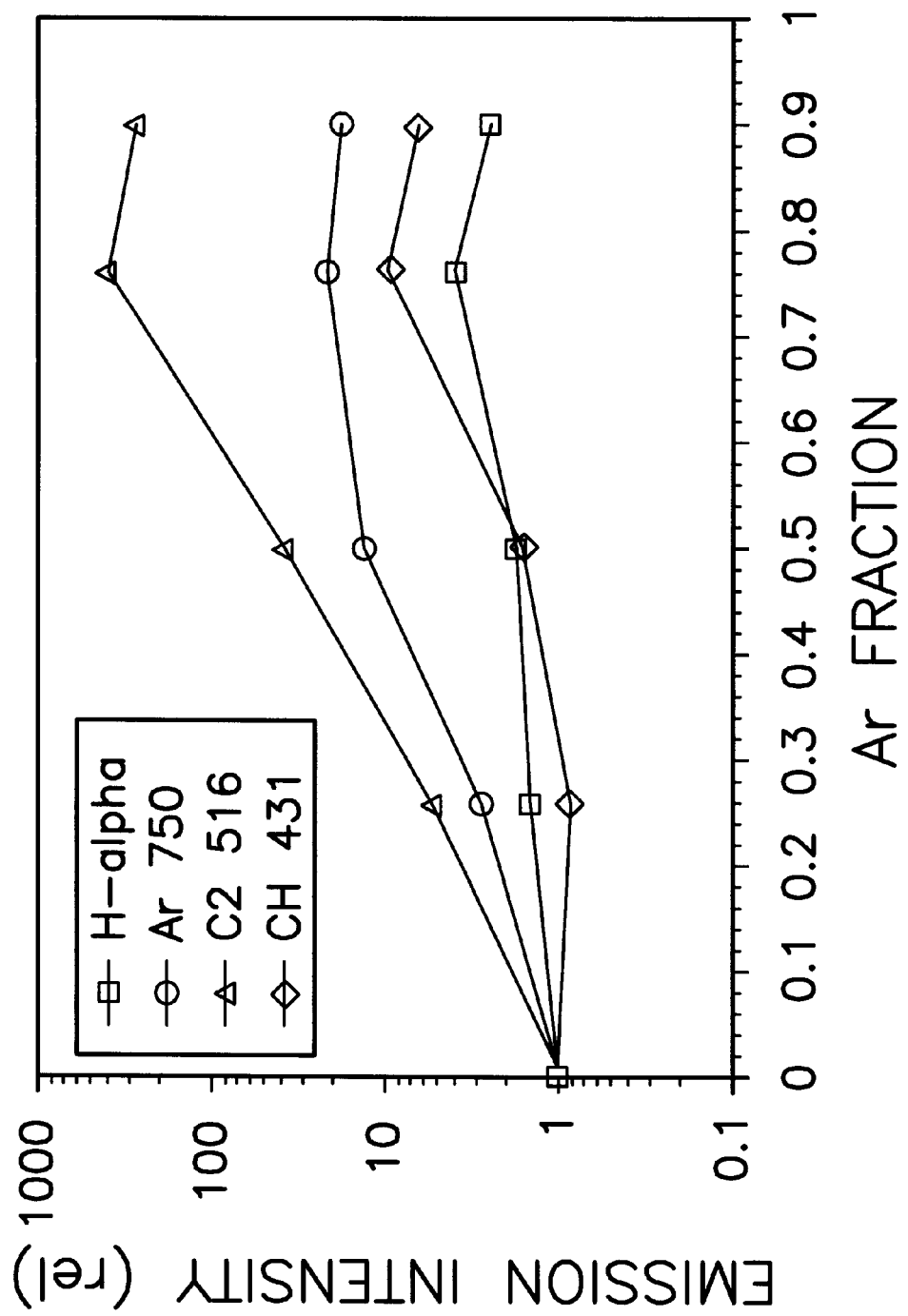
FIG. 16 shows emission intensities from H (6560 Å), Ar (7504 Å), $C_2$ (5160 Å band), and CH (4310 Å band) plotted as a function of Ar fraction; $C_2$ emission increases by the greatest amount and increases in intensity relative to other emitting species, indicating an increase in gas phase concentration as the Ar flow increases.

Emission spectra for data condition 1 (100 sccm $H_2$, 2 sccm $CH_4$) and condition 4 (25 sccm $H_2$, 75 sccm Ar, 2 sccm $CH_4$) are shown in FIGS. 14 and 15. For condition 1, the atomic hydrogen lines are very prominent with little emission from other species. By contrast, the high Ar fraction for condition 4 results in prominent emission bands, particularly from $C_2$. Emission from CH, as well as from Ar and H, are also evident. The intensities of H-alpha (6560 Å), Ar (7504 Å), $C_2$ (5160 Å band) and CH (4310 Å band) are plotted as a function of Ar fraction in FIG. 16. The intensities were normalized to values of unity for condition 1. $C_2$ emission increases by as much as a factor of 500, and by an order of magnitude relative to other emitting species, reflecting (as mentioned earlier) an increase in the gas phase concentration of $C_2$.

In a second experiment, $H_2$ and Ar flows were maintained at 50 sccm while the $CH_3$ flow was varied from 1 to 5 sccm. Measurements of growth rate and plasma emission were made for seven conditions shown in Table 4. Again, for each condition the gas flow was set, and the emission spectrum was measured after the growth rate equilibrated.

TABLE 4

Power: 1500 W
Pressure: 100 Torr
Temperature: 850° C.

| Point | $H_2$ Flow (sccm) | Ar Flow (sccm) | $CH_4$ Flow (sccm) |
|---|---|---|---|
| 1 | 50 | 50 | 1 |
| 2 | 50 | 50 | 1.5 |
| 3 | 50 | 50 | 2 |
| 4 | 50 | 50 | 2.5 |
| 5 | 50 | 50 | 3 |
| 6 | 50 | 50 | 4 |
| 7 | 50 | 50 | 5 |

Figure 17:
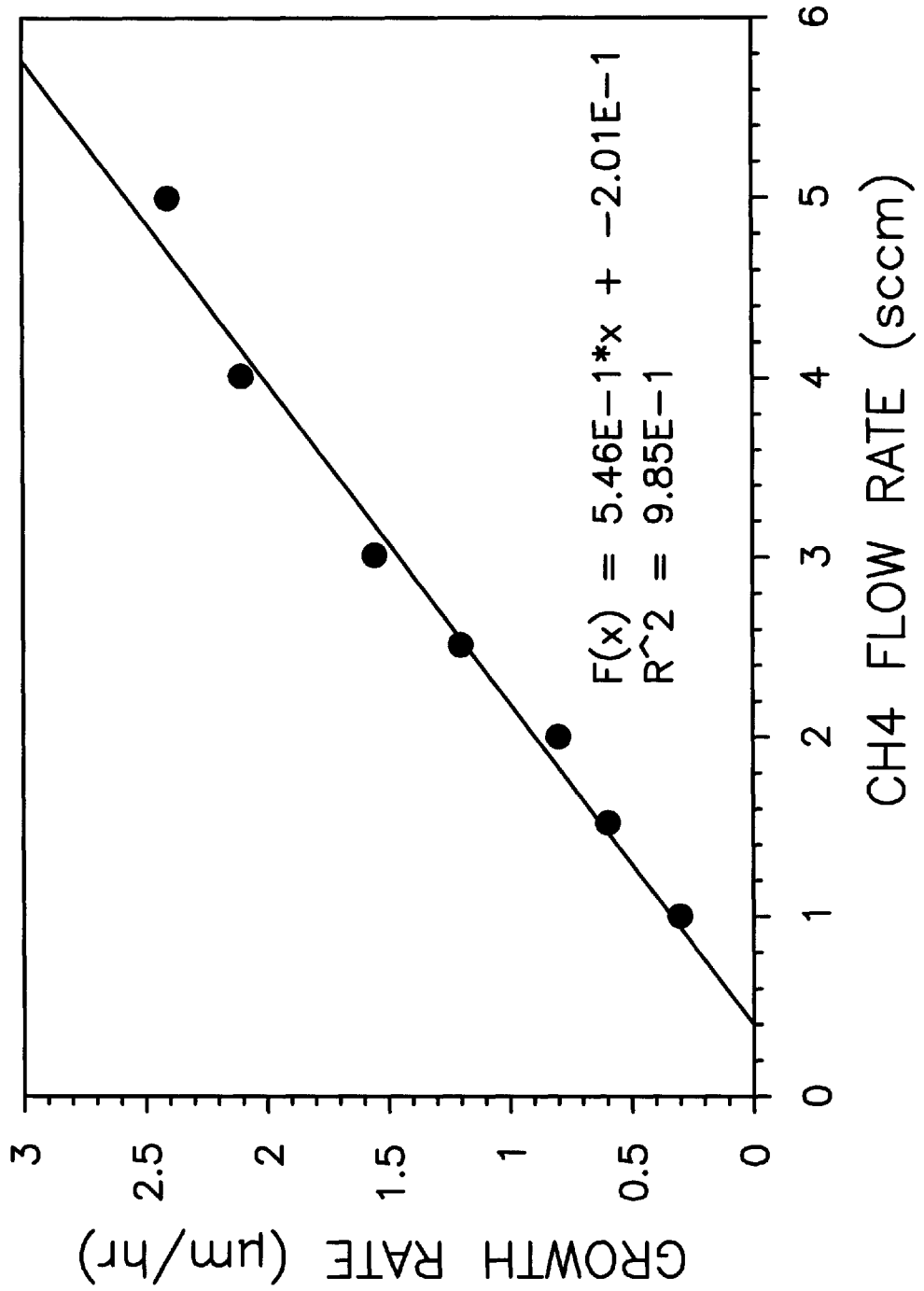
FIG. 17 shows the growth rate as determined by laser interferometry, and the rate increases linearly with $CH_4$ flow.
Figure 18:
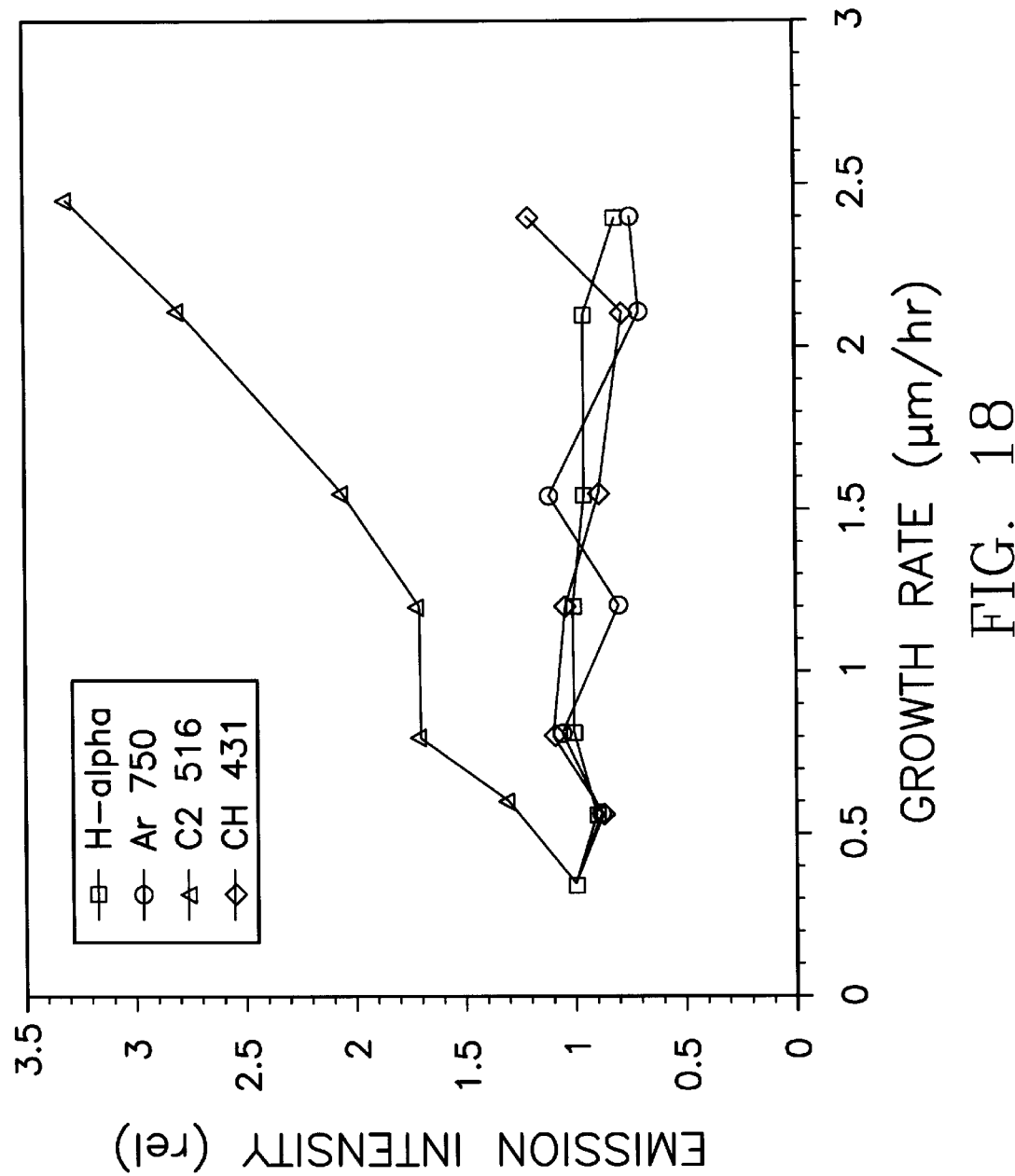
FIG. 18 shows plasma emission intensities observed as a function of growth rate for a second experiment; the $C_2$ emission increases linearly with growth rate, while emission from other species is nearly constant, identifying $C_2$ as the growth species.

In this set of experiments, the growth rate increased linearly with increasing $CH_4$ flow as shown in FIG. 17. The changes in $CH_4$ flow result in small changes in the gas composition and can be thought of as a perturbation to the plasma. Since excitation and quenching rates can be expected to change only marginally under these conditions, the emission intensity is likely correlated with ground state species concentrations in the plasma. The emission intensities of H, Ar, $C_2$ and CH are plotted as a function of growth rate in FIG. 18, normalized to unity at condition 1. The growth rate is unrelated to the $H_2$, Ar and CH emission intensities, but increases linearly with $C_2$ emission intensity. Thus, the growth rate depends on the $C_2$ gas phase concentration in the plasma.

Figure 19:
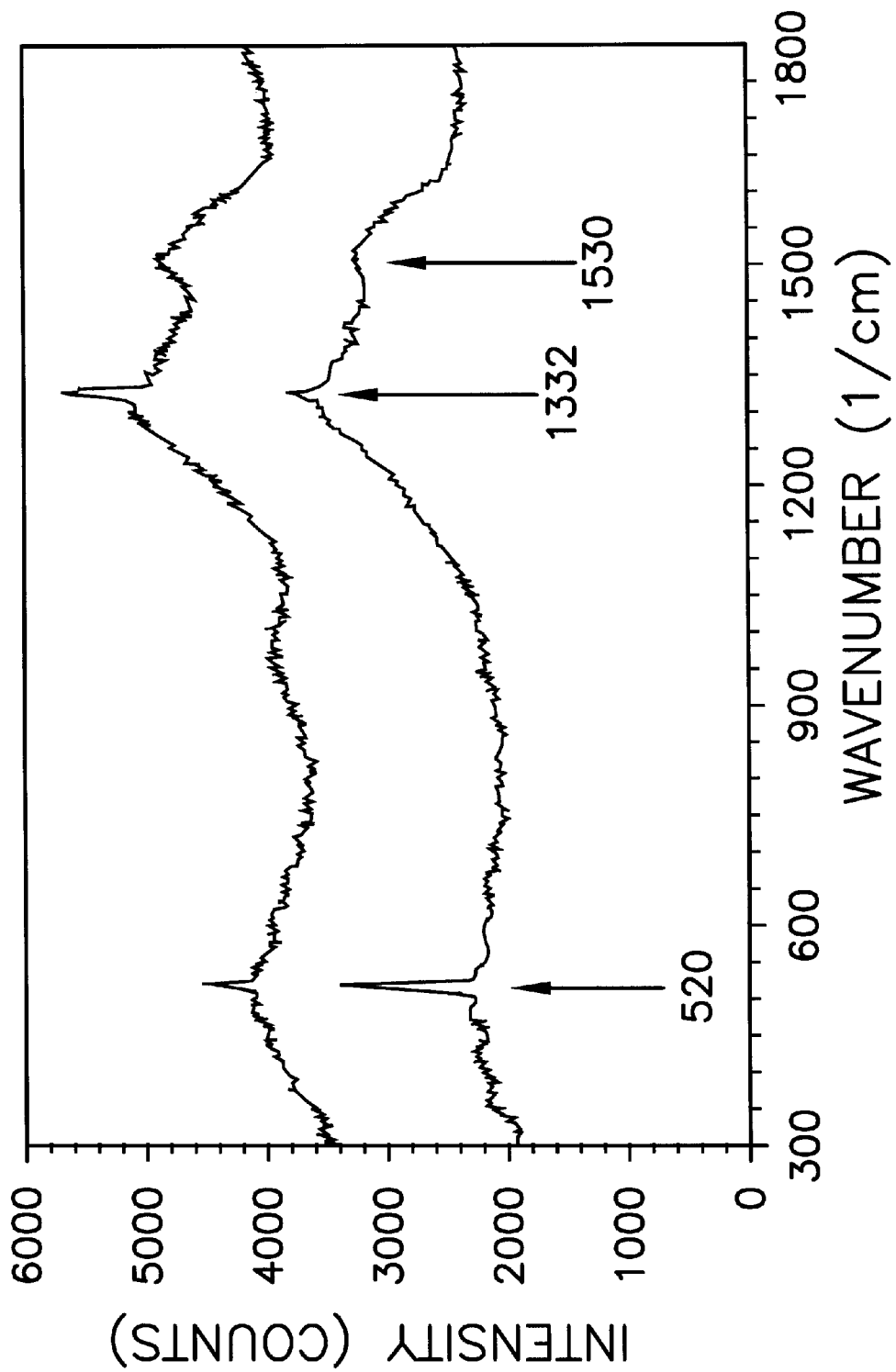
FIG. 19 shows Raman spectra of the films produced in the two experiments; the lower spectrum is from the first experiment, where the Ar fraction in the reactor was varied; the upper spectrum is from the second experiment, where methane flow was increased.

Raman spectra for the two films grown in the above experiments are shown in FIG. 19 to confirm that diamond was indeed deposited. The lower spectrum is from the first film, where the Ar gas fraction was varied throughout the deposition. The film was 2.8 μm thick and the diamond peak at 1332 $cm^{-1}$ is clear. The broad features at 1530 $cm^{-1}$ and 1330 $cm^{-1}$ have been attributed to the presence of nondiamond carbon, but may also be an artifact of the very small grain size. The transparency of the film is evident from the silicon peak at 520 $cm^{-1}$, which results from light penetrating to the silicon substrate under the film. The upper spectrum is from the second film, grown under varying methane concentrations. This film was 4 μm thick. The diamond peak is more pronounced than in the first film, but the features otherwise appear similar. From this we conclude the films grown from $CH_4/H_2/Ar$ mixtures are predominantly diamond.

Additional support for this conclusion of the films being diamond comes from a measurement of the refractive index of the films. The above-described film thickness was measured to be 4.0±0.03 μm, while the reflectivity of the surface underwent 31.5 oscillations. The index of refraction is related to the film thickness and the number of oscillations by $$n = \frac{m\lambda}{2d},$$

where λ is the laser wavelength (0.6328 μm), m is the number of oscillations in the reflectance (31.5) and d is the film thickness (4.0±0.3 μm). From this, the index of refraction of the film is calculated to be 2.5±0.2. This is within error of the accepted value of 2.41 for bulk diamond at this wavelength.

As previously discussed, $C_2$ deposition to form diamond is energetically favorable. Ab initio calculations indicate that $C_2$ insertion into the reconstructed hydrogen-terminated (100) surface of diamond is energetically favorable with small activation barriers. It has been experimentally determined that diamond films can, using this process, be grown at relatively low temperatures (<500° C.), as opposed to conventional diamond growth processes which require substrate temperatures of 800° C.–1000° C. These high substrate temperatures preclude deposition on many materials of technological importance.

Figure 20:
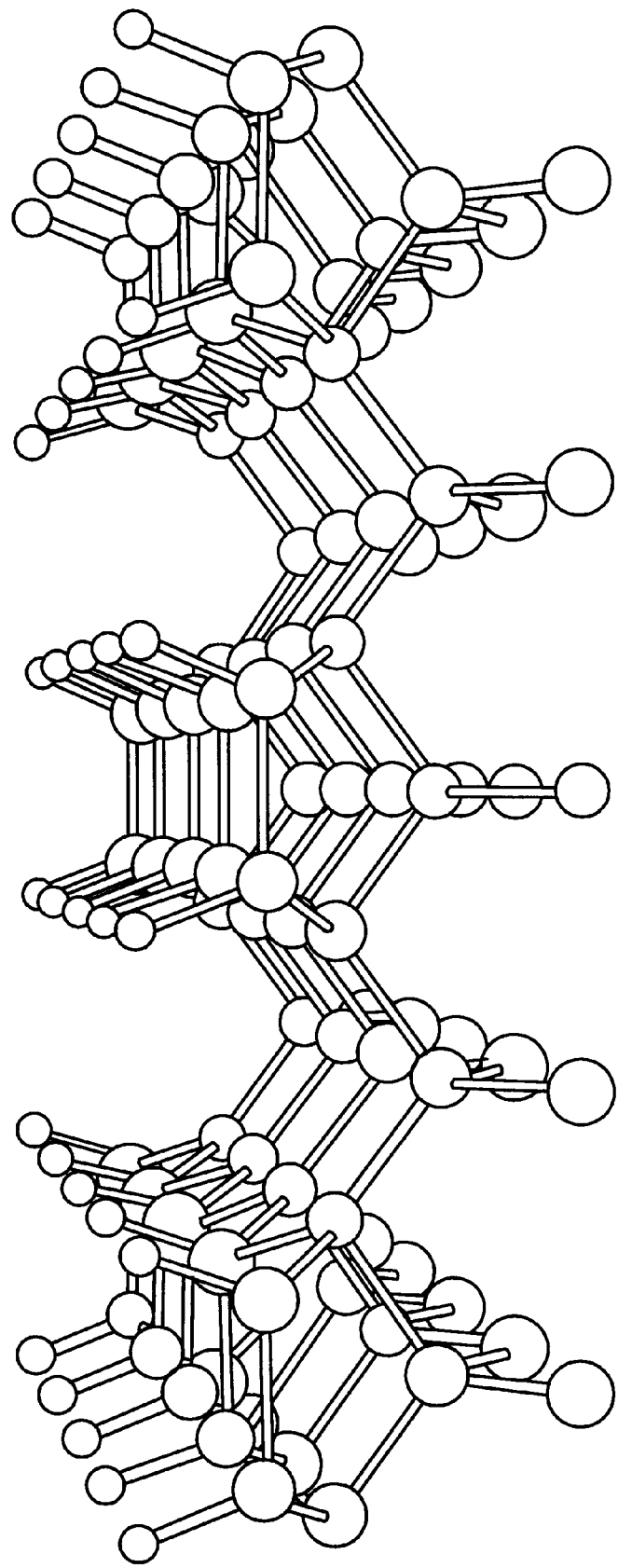
FIG. 20 shows a (100) (2×1):H reconstructed diamond surface.
Figure 21:
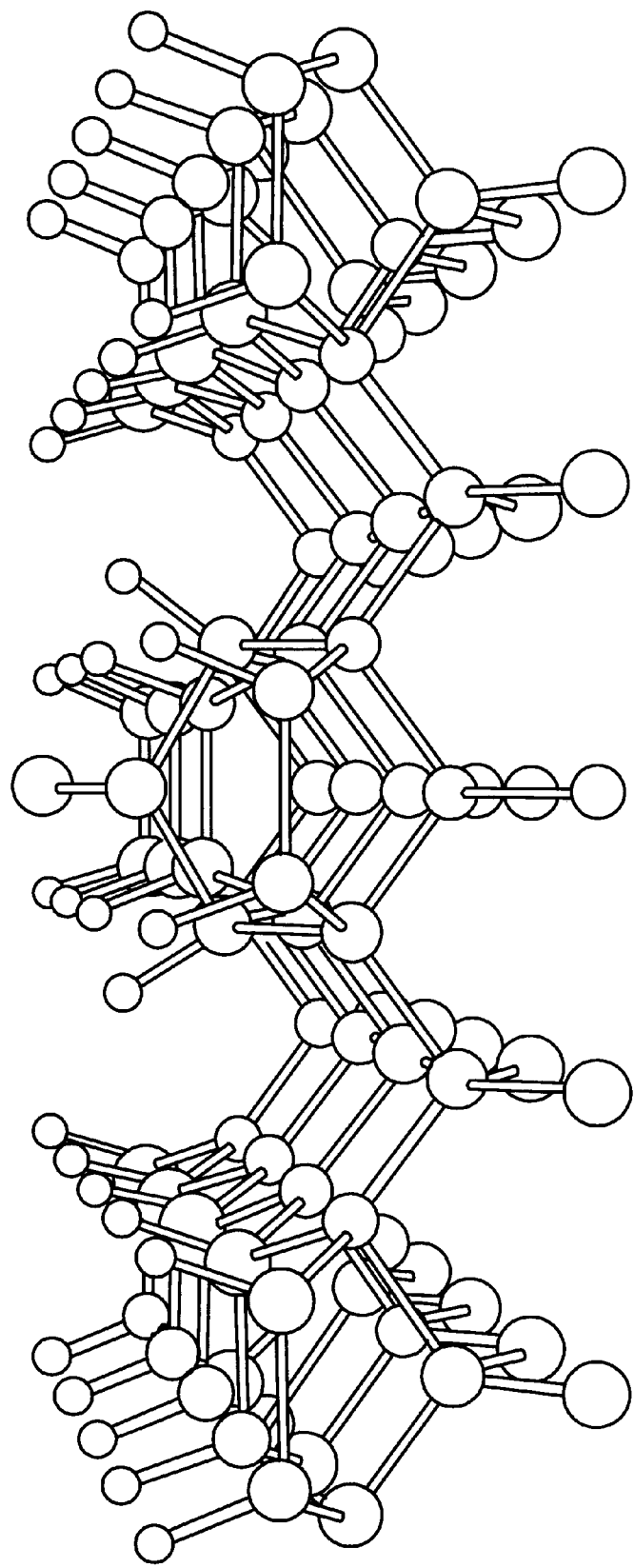
FIG. 21 shows a $C_2$ molecule inserted into a C—C surface dimer bond.
Figure 22:
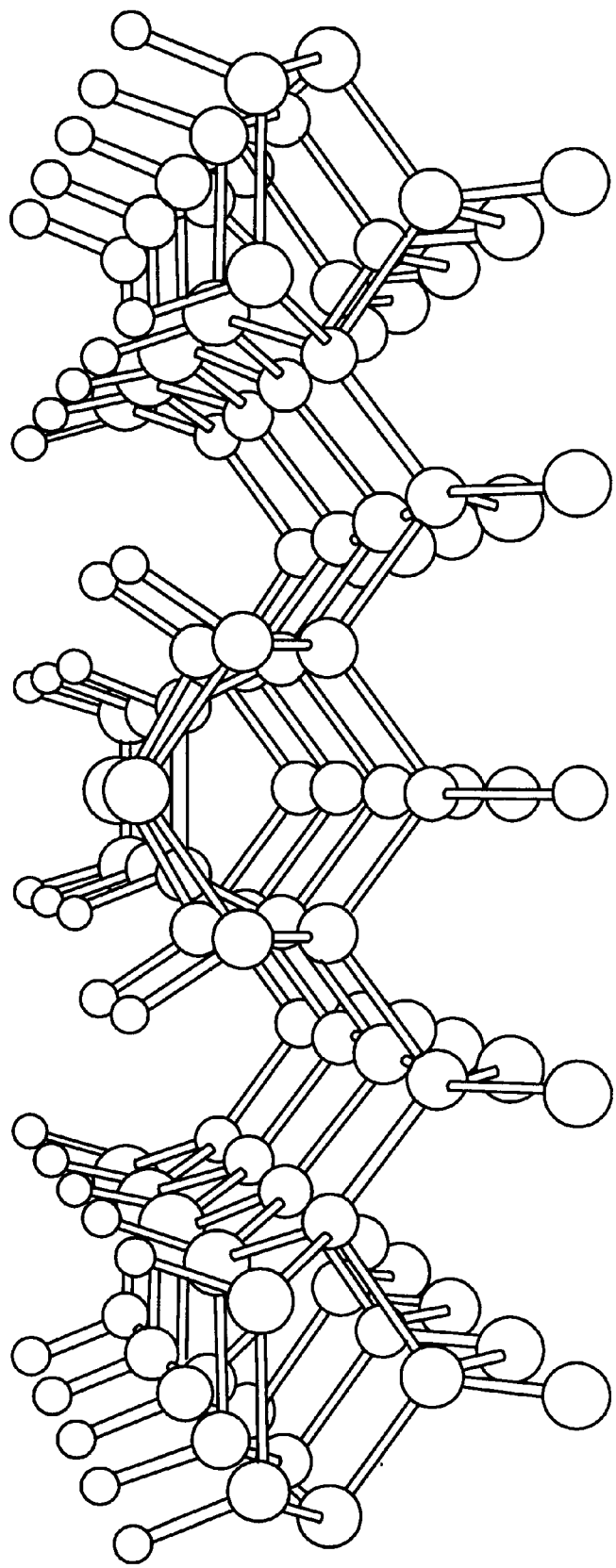
FIG. 22 shows a $C_2$ molecule inserted into an adjacent C—C surface dimer bond, forming a new surface dimer perpendicular to the previous dimer row.
Figure 23:
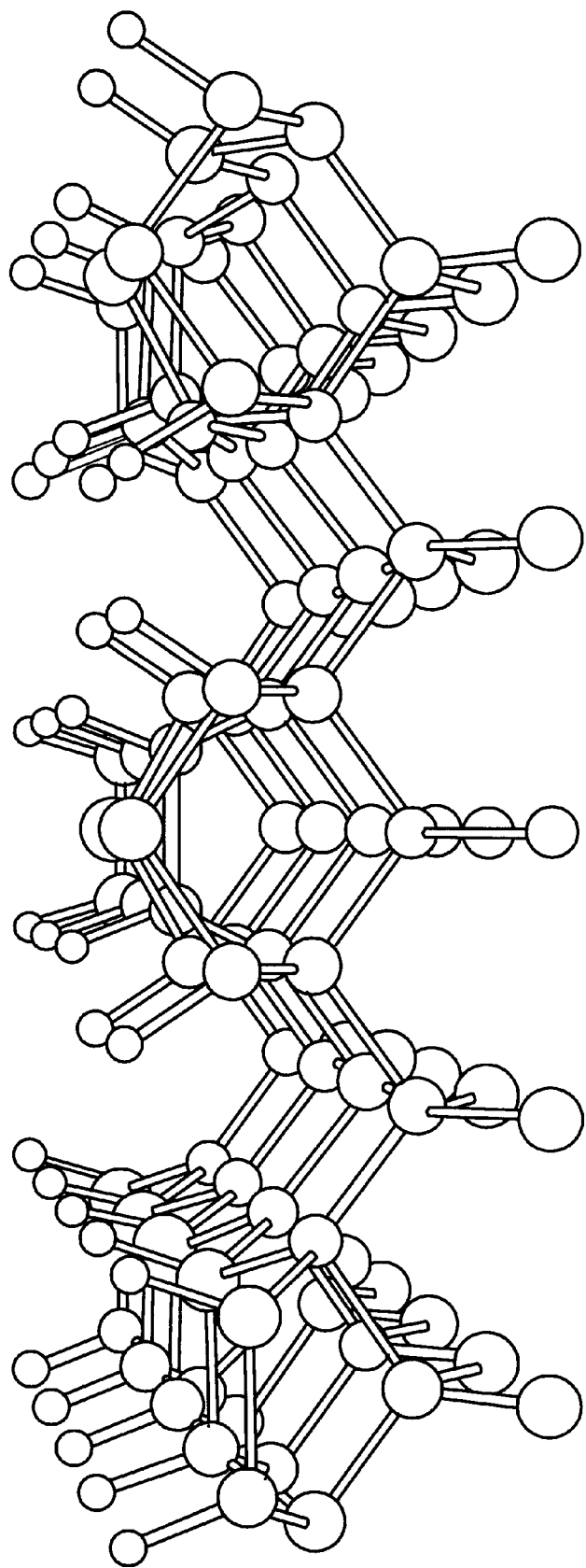
FIG. 23 shows a second $C_2$ molecule forming a new surface dimer in an adjacent dimer row.
Figure 24:
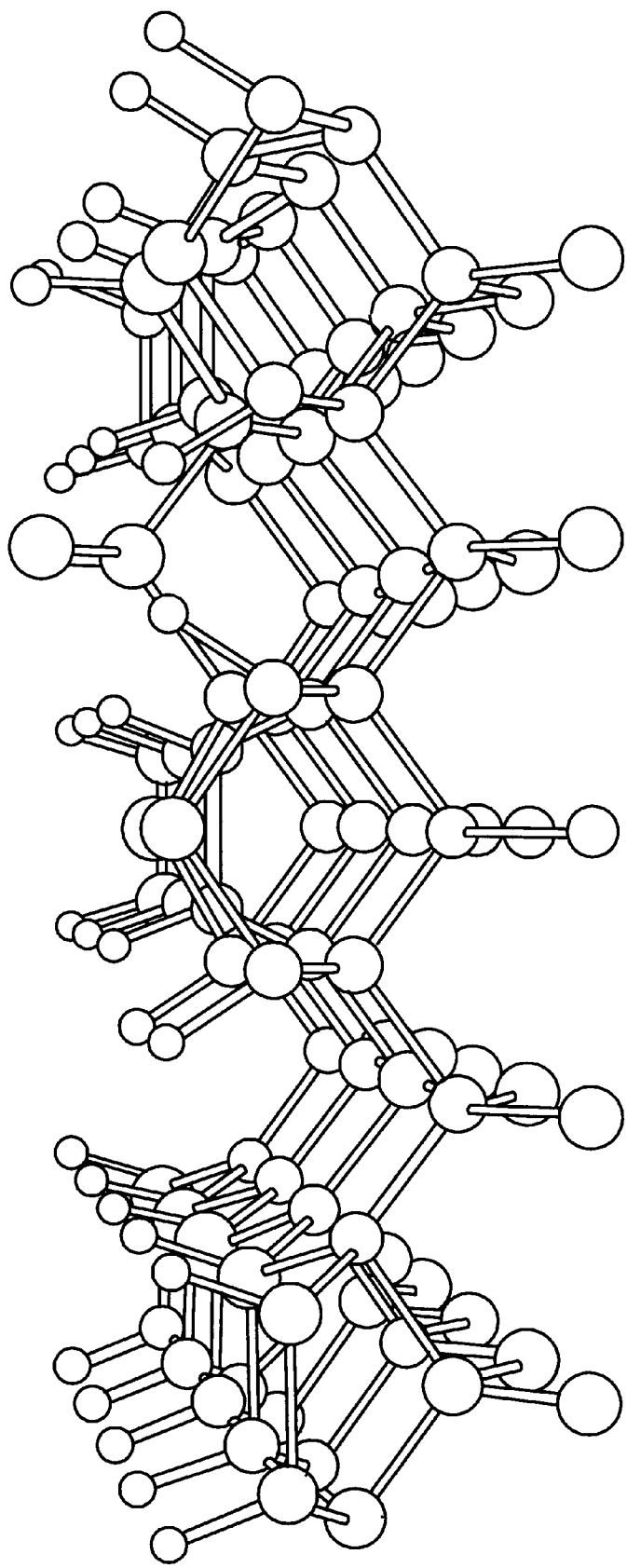
FIG. 24 shows a third $C_2$ molecule inserted into the trough between the two previously incorporated $C_2$ molecules.
Figure 25:
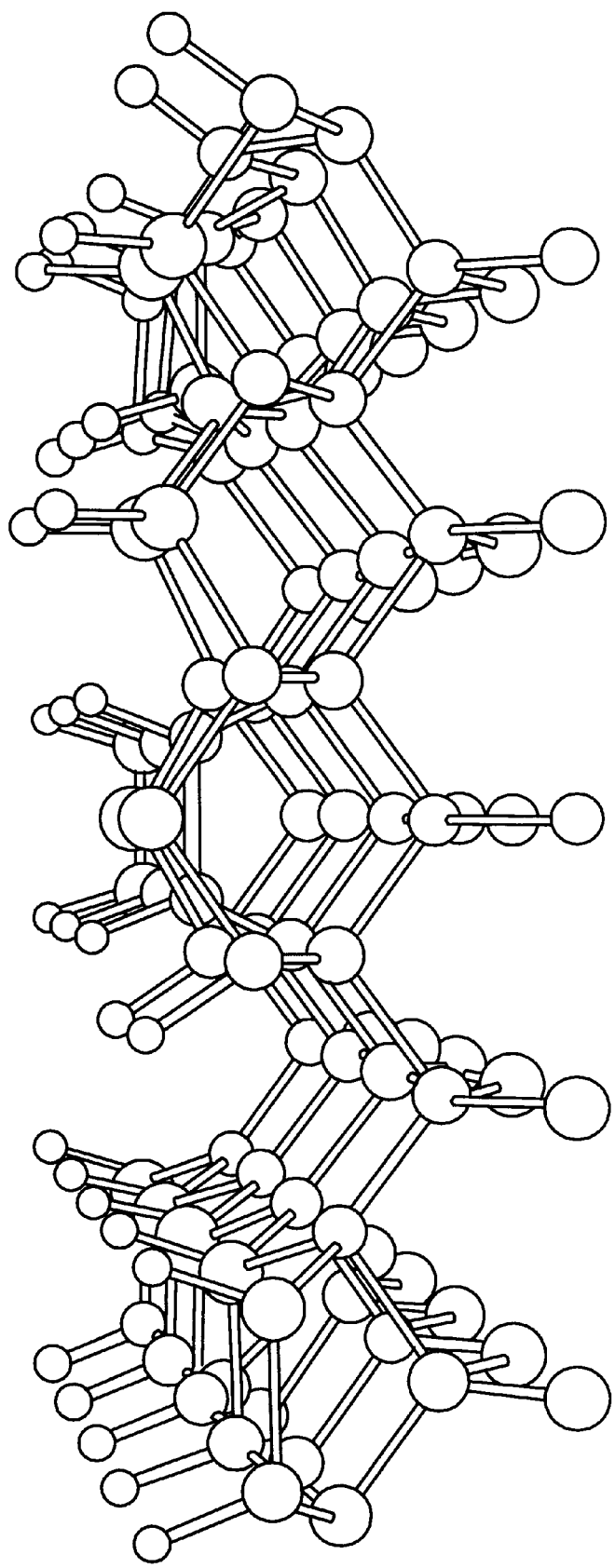
FIG. 25 shows the third $C_2$ molecule completing insertion into the trough, forming a dimer row perpendicular to the previous surface row.

Without limiting the scope of the invention, in FIGS. 20–25, a proposed mechanism for growth on the diamond (100) (3>1):H reconstructed surface with $C_2$ is outlined. FIG. 20 shows the (100) (2×1):H reconstructed diamond surface, thought to be the most likely surface in these environments. The large atoms are C and the small atoms are H terminating the surface. A $C_2$ molecule impinges on the surface and inserts into a surface C—C dimer bond, as shown in FIG. 21. The $C_2$ then inserts into an adjacent C—C bond to form a new surface carbon dimer, as shown in FIG. 22. By the same process, a second $C_2$ molecule forms a new surface dimer on an adjacent row, as shown in FIG. 23. A third $C_2$ molecule inserts into the trough between the two new surface dimers as shown in FIGS. 24 and 25. The three $C_2$ molecules incorporated into the diamond surface form a new surface dimer row running perpendicular to the previous dimer row. The $C_2$ growth mechanism as proposed here requires no hydrogen abstraction reactions from the surface and in principle should proceed in the absence of gas phase atomic hydrogen.

In another aspect of the invention, the previously described methods of manufacture can be applied to produce equiaxed nanocrystalline diamond film and fine grained dendritic structures. Such preferred structures are advantageous for specialized applications calling for very uniform, fine grained diamond which is quite smooth and can be reliably produced as layers of extremely small thickness. For example, diamond layers can be used to great advantage on field emission microtips (or any such electronic or optical application) which require deposition of a very thin, smooth conformal diamond coating which preserves the topographical features of the substrate. Diamond has been shown to be a cold cathode electron emitting material with emission characteristics which follow the known Fowler-Nordheim relation corresponding to field-induced electron tunneling. A variety of requirements, however, should be met for electron emission applications: the material must (1) have the low work function/negative electron affinity of diamond, (2) have sufficient electrical conductivity to provide a conducting path to the substrate in order to restore the emitted electrons to the surface, (3) for planar emitters, the film should have a surface topography which enhances the electric field at the surface and (4) for microtip arrays, the film should have a morphology which produces a uniform thin coating on microtips which have contour requirements on the 10–100 nm scale.

Figure 26:
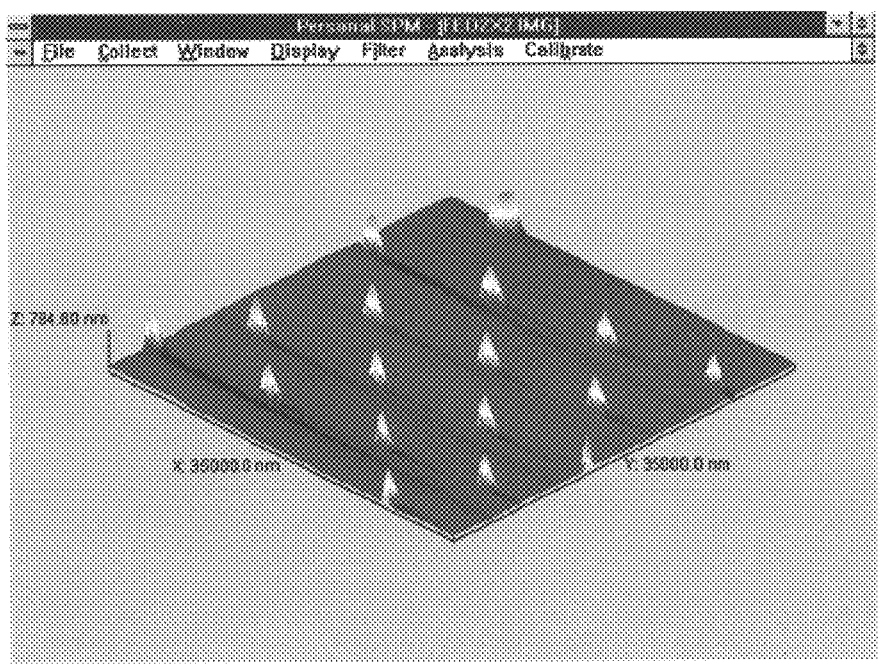
FIG. 26 shows an atomic force micrograph of an array of typical field emission tips.
Figure 27A:
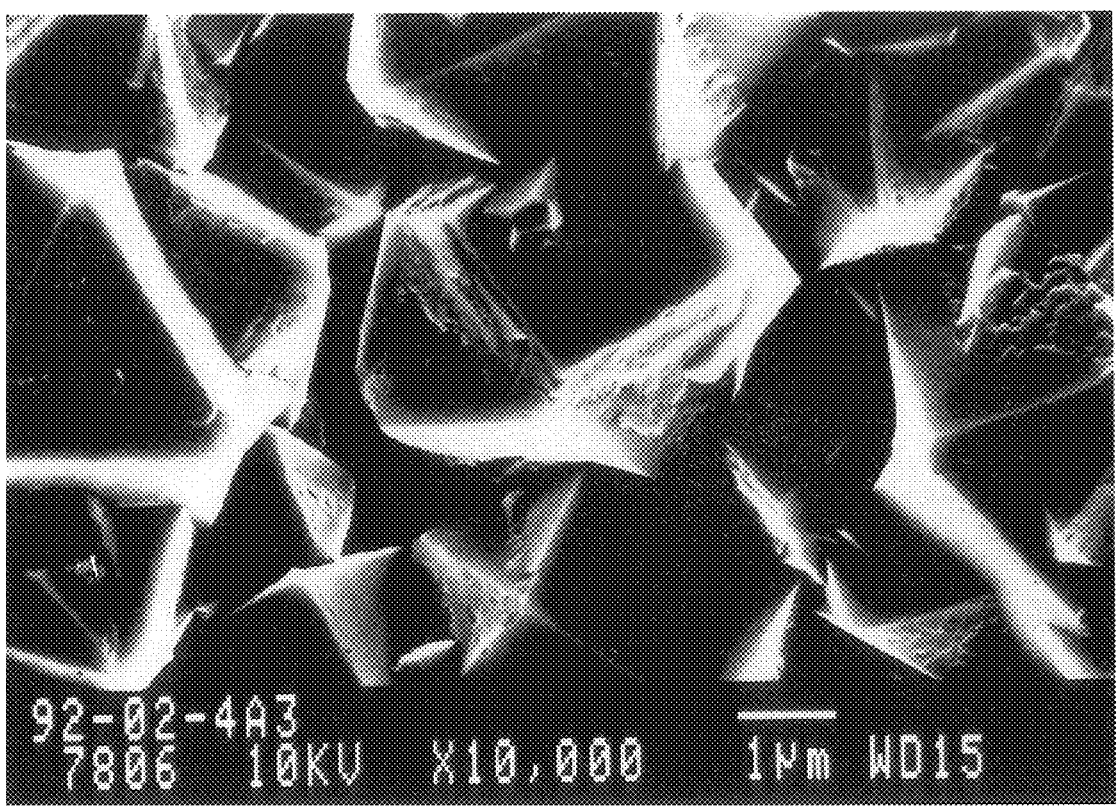
FIG. 27A shows a scanning electron microscope image of a diamond film grown in a $H_2/CH_4$ plasma.
Figure 28A:
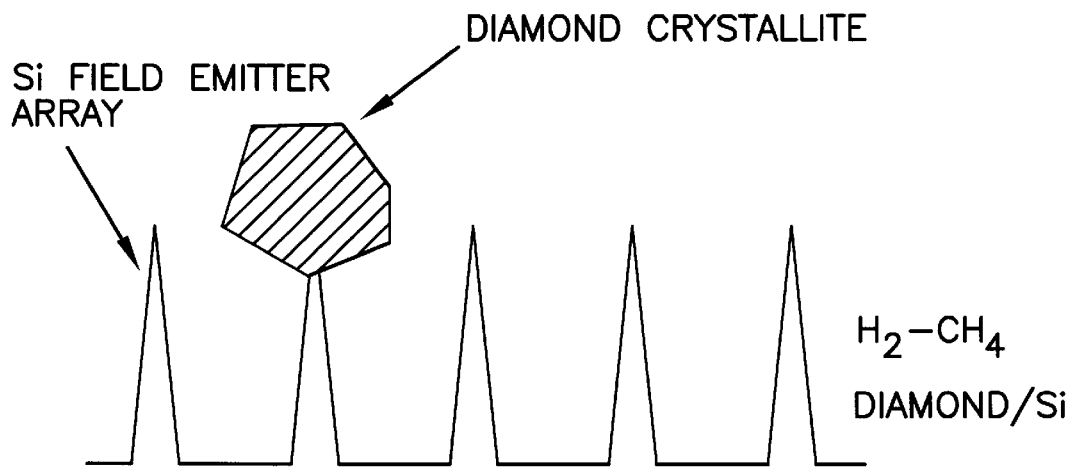
FIG. 28A shows a schematic illustration of field emission tips and a diamond crystallite deposited on one of the tips using an $H_2$—$CH_4$ plasma and FIG. 28B shows a schematic illustration of field emission tips covered with a layer of nanocrystalline diamond formed from a plasma of a noble gas and $C_{60}$ (or $CH_4$, $C_2H_2$ or anthracene)
Figure 28B:
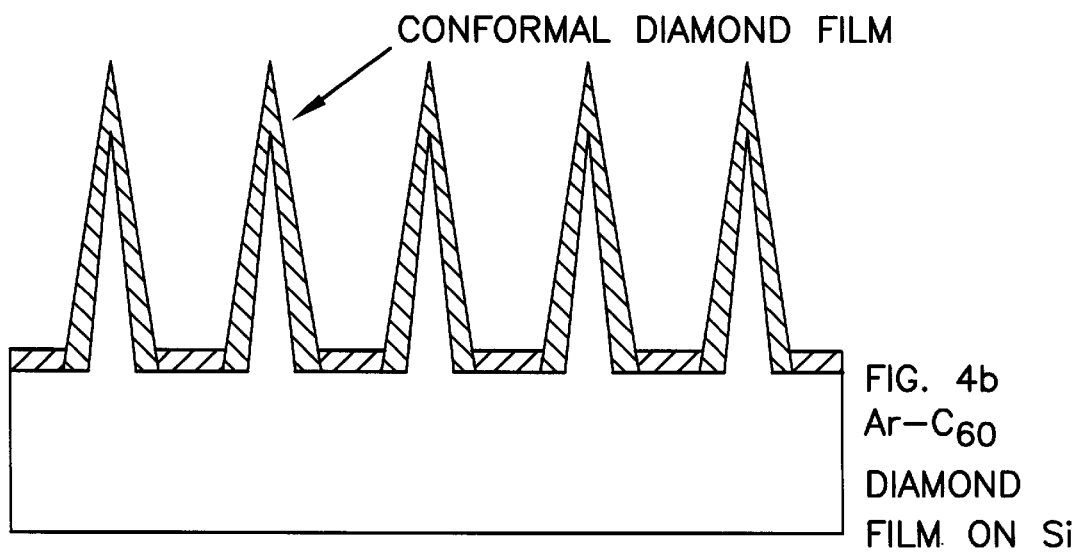

Microtip arrays typically are very well defined tips 100 as shown in FIGS. 26 and 28. These tips 100 are typically made of silicon using photolithography techniques developed by the semiconductor industry and have submicron size dimensions. Conventional diamond layer deposition techniques produce the morphology of diamond crystals 102 shown in FIG. 27A and FIG. 28A. Such structures would not enable use of diamond coated microtips as field emitters. The capability of producing very thin diamond films which are continuous and uniform in thickness is demonstrated by FIG. 9. This figure is a cross-section TEM which shows a 20–30 nm thick film which has a continuity and density unattainable by conventional diamond growth processes.

Figure 27C:
FIG. 27C shows a transmission electron microscope image of a diamond layer prepared from a plasma of $Ar/C_{60}$.
Figure 27D:
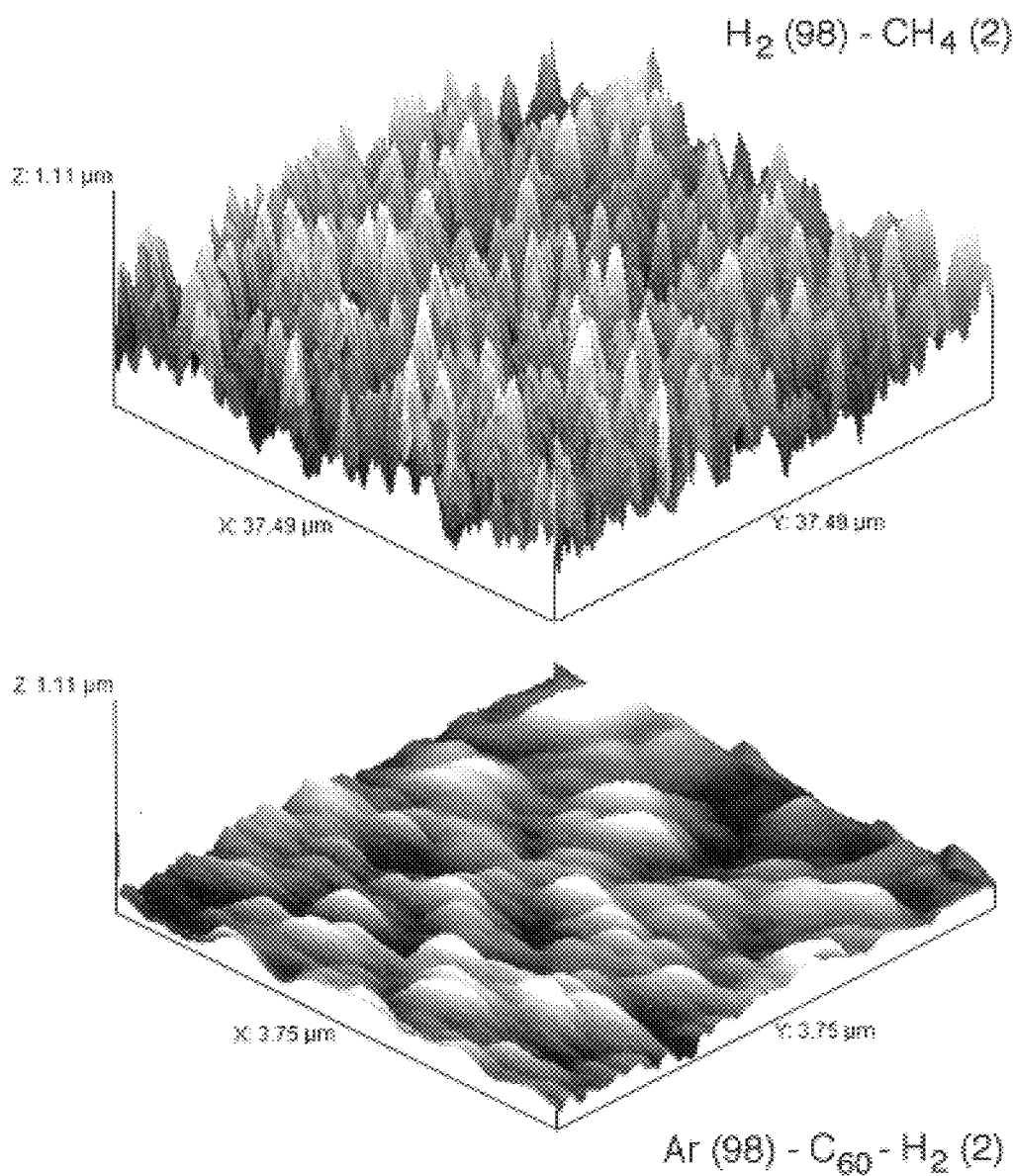
FIG. 27D shows Atomic Force micrographs of diamond films grown from an $H_2$—$CH_4$ plasma (upper portion) and from an Ar—$C_{60}$ plasma with very low (2%) hydrogen concentration (lower portion). The vertical scales are the same, illustrating a pronounced difference in surface roughness for the two processes.

As shown in FIG. 27C, a highly equiaxed, nanocrystalline diamond film (average grain size of 15 nm and range of 10–30 mm) can be deposited using one of the methods described herein (see Examples I and VIII). Moreover, as noted in Example V, there is no evidence of graphite formation which further enhances the suitability of the diamond film to a variety of electronic applications.

In another variation of the method as described in Example VII, $CH_4$ and $C_2H_2$ were used as the source of carbon in combination with an inert gas and a small amount of $H_2$ For these combinations of conditions very smooth, uniform nanocrystalline diamond film (see Example VIII) is also obtained, but has a somewhat irregular, dendritic morphology as shown in FIG. 27B. Again, there was no evidence of graphite formation.

As set forth in Example VIII, the electronic properties of the above-described diamond layers are well suited for use as field emission tips and other demanding electronic applications.

Figure 32:
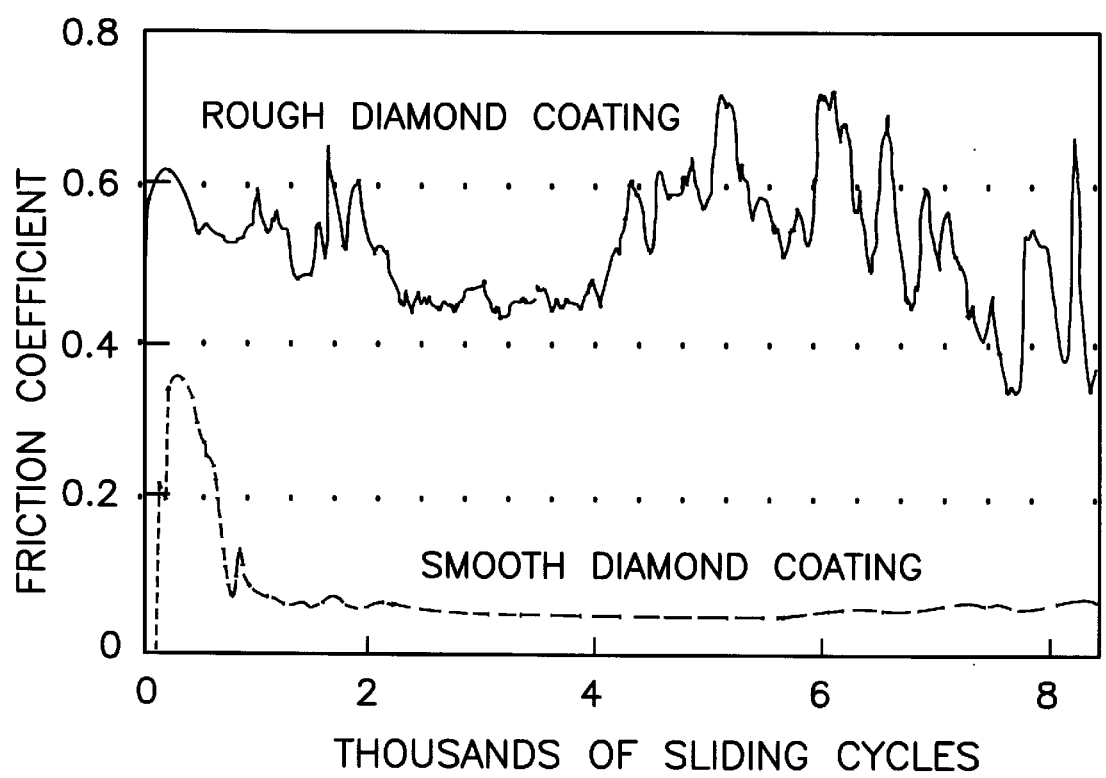
FIG. 32 illustrates a comparison of friction coefficients from SiC pins sliding against a conventional $H_2$—$CH_4$ plasma deposited diamond coating and a diamond coating of the invention.
Figure 35:
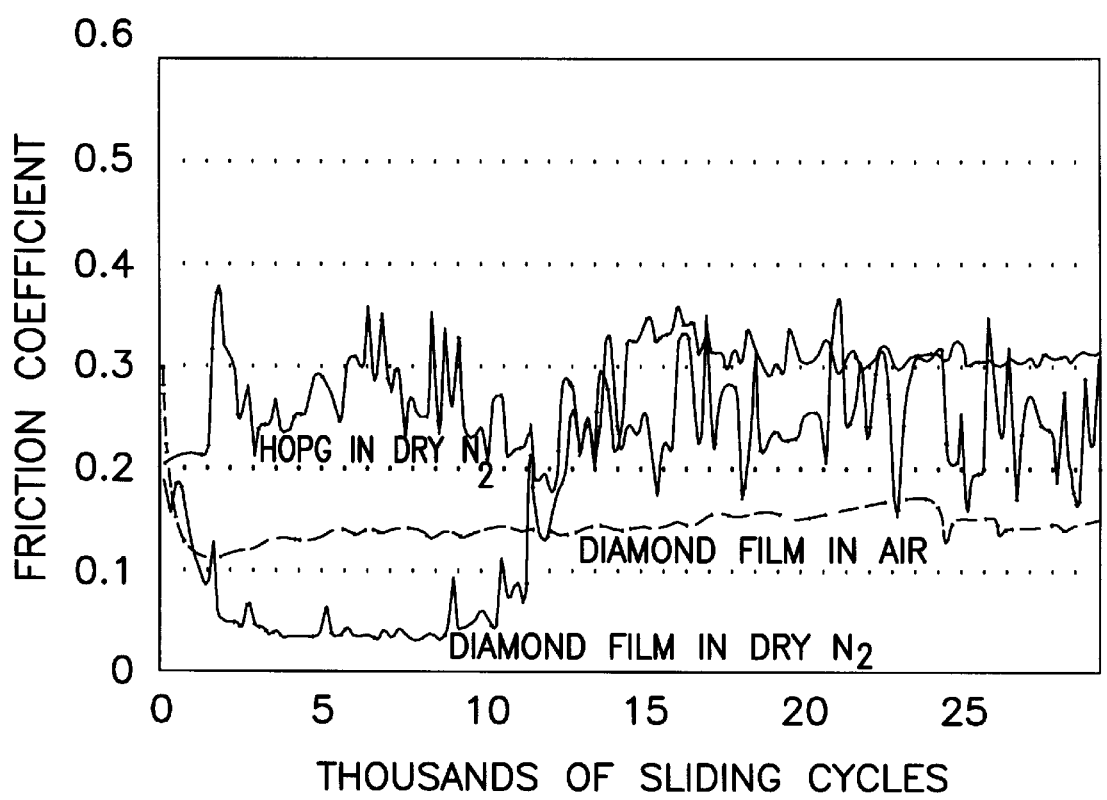
FIG. 35 illustrates friction coefficients of $Si_3N_4$ balls against smooth diamond film of the invention in dry $N_2$ (lower curve), smooth diamond film in open air (middle curve) and for a highly oriented pyrolitic graphite in dry $N_2$ (top curve of low sliding cycles)

In accordance with the above-described methodologies nanocrystalline diamond films were prepared and details of preparation and testing are set forth with further particularity in Examples IX–XI. These examples illustrate that the diamond films have extremely low friction coefficients and low wear rates. For example, a total of $2.27 \times 10^6$ sliding cycles under a load of five Newtons were needed to generate a 0.5 micron deep wear track (see FIG. 37). The smoothness of the diamond films prepared by the method of the invention can be compared with diamond films prepared by conventional $H_2$—$CH_4$ plasma deposition. As shown in FIGS. 32 and 35, and explained in further detail in Example XI, the diamond films prepared by the method of the invention exhibit a much lower friction coefficient than the prior art $H_2$—$CH_4$ plasma films. The low friction values shown in these figures correlate well with the initially smooth surface finishes (i.e., 30 nm, RMS) of these films, and their ability to become polished even further during sliding to reach an ultrasmooth (3 nm RMS) surface finish (see FIG. 34A) that results in very little abrasion and ploughing. These friction coefficients are comparable to that of natural diamond sliding against $Si_3N_4$ in dry $N_2$ and air.

Physically, rougher surfaces can cause increased ploughing and hence higher friction. The high friction coefficient (0.6) of the rough diamond film can be attributed to the abrasive cutting and ploughing effects that sharp surface asperities (FIG. 33B) have on the softer SiC pin. A similar argument can also be used to explain the somewhat high friction coefficient (0.35) of smooth diamond film. Apparently, during repeated sliding passes, surface asperities of this film are broken in or flattened after run-in period, hence the magnitude of the microcutting and ploughing contributing to higher friction is reduced. Previous investigation has confirmed that the surface topography of diamond films relates closely to their friction and wear performance. In general, the higher the surface roughness, the greater the friction and wear losses and our findings are consistent with this.

For the very-low-friction character of smooth diamond films of the invention in open air, and the ultralow friction values in dry $N_2$, we propose the following interpretation without imposing any limitations on the scope of the claims. It is conventionally reported that active gaseous species such as hydrogen, oxygen or water vapor can become attached to and passivate the dangling surface bonds of most carbon materials, including diamond and graphite. Apparently, when the dangling bonds are passivated, the adhesion component of friction is drastically reduced in sliding contacts.

In fact, the low-friction character of diamond is largely attributed to the highly passive nature of its sliding surface. When hydrogen and other species are desorbed or removed from the sliding surfaces, the friction coefficient of diamond increases drastically, presumably because the reactivated dangling bonds cause strong adhesive interactions between the diamond and the counterface materials. Recent studies have clearly demonstrated that the friction coefficients of diamond films sliding against Si, SiC, or diamond-coated SiC counterfaces could increase substantially if surface adsorbates were removed from the surface by annealing in high vacuum. Conversely, if atmospheric air is admitted in the test chamber, the friction coefficient drops precipitously. Thus, the low-friction character of smooth diamond films used in this study can also be attributed to surface adsorbates passivating the dangling bonds of diamond films, essentially making films very inert and chemically insensitive to counterface materials.

We note that the friction coefficient of diamond film remains constant in air but increases substantially in dry $N_2$ as sliding continues beyond 10,000 cycles. Without limiting the scope of the invention, this disparity can be explained as follows: during dynamic rubbing, the absorbate layer is either desorbed by frictional heating or removed mechanically by microfracture or wear thus exposing fresh and active dangling bonds on the diamond surface. Without continuous replenishment, these bonds can become more and more active, exerting some adhesive forces across the sliding interface and thus causing increasingly higher friction. Alternatively, a combination of high frictional heating and very high contact stresses at colliding asperity tips can, over the course of several thousand sliding passes, cause gradual graphitization of these sharp tips. As graphitization becomes widespread and constitutes a third-body interlayer between the sliding surfaces, the frictional behavior of the $Si_3N_4$/diamond interface can become partially dominated by the shear properties of this entrained graphitic material.

Figure 38:
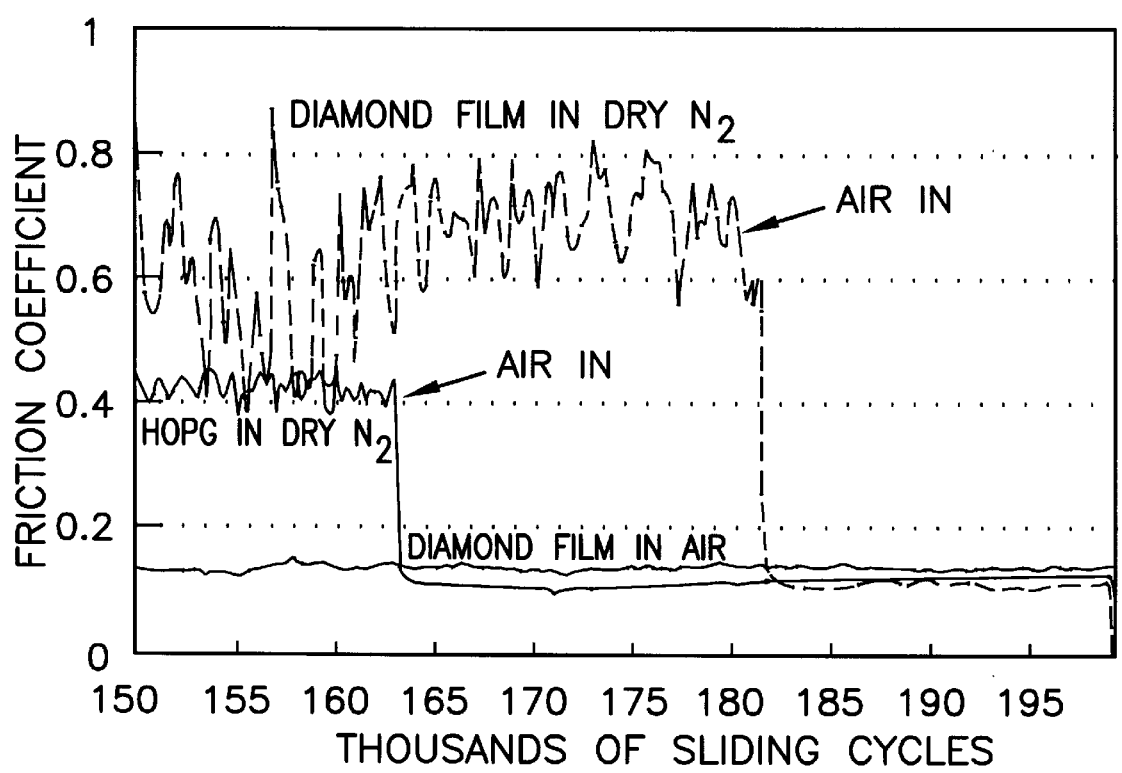
FIG. 38 illustrates frictional coefficients of $Si_3N_4$ balls against diamond film of the invention in dry $N_2$ (upper curve), highly oriented pyrolitic graphite sample in dry $N_2$ (middle curve at low cycles) and diamond film of the invention in air (lower curve at low cycles)

The following simple experiment was performed to test whether some graphifization occurred: Specifically, after accumulating 160,000 to 180,000 sliding cycles on the same samples used in FIG. 32, we shut off the dry $N_2$ and gradually bled ambient air into the test chamber while the sliding test still continued. As shown in FIG. 38, the friction coefficients of both diamond and highly oriented pyrolitic graphite ("HOPG") against $Si_3N_4$ dropped precipitously to around 0.1. The sharp decrease in the friction coefficient of HOPG is not surprising, because this material is known for its maximum lubrication in moist environments. However, the friction coefficient of diamond film also drops instantly when air is introduced into the test chamber. Also, the large fluctuations in friction traces of both diamond film and HOPG disappear as air enters the chamber. The friction coefficient of diamond film in open air remains essentially constant and is comparable to those of the HOPG and the smooth diamond film tested in open air.

Figure 39:
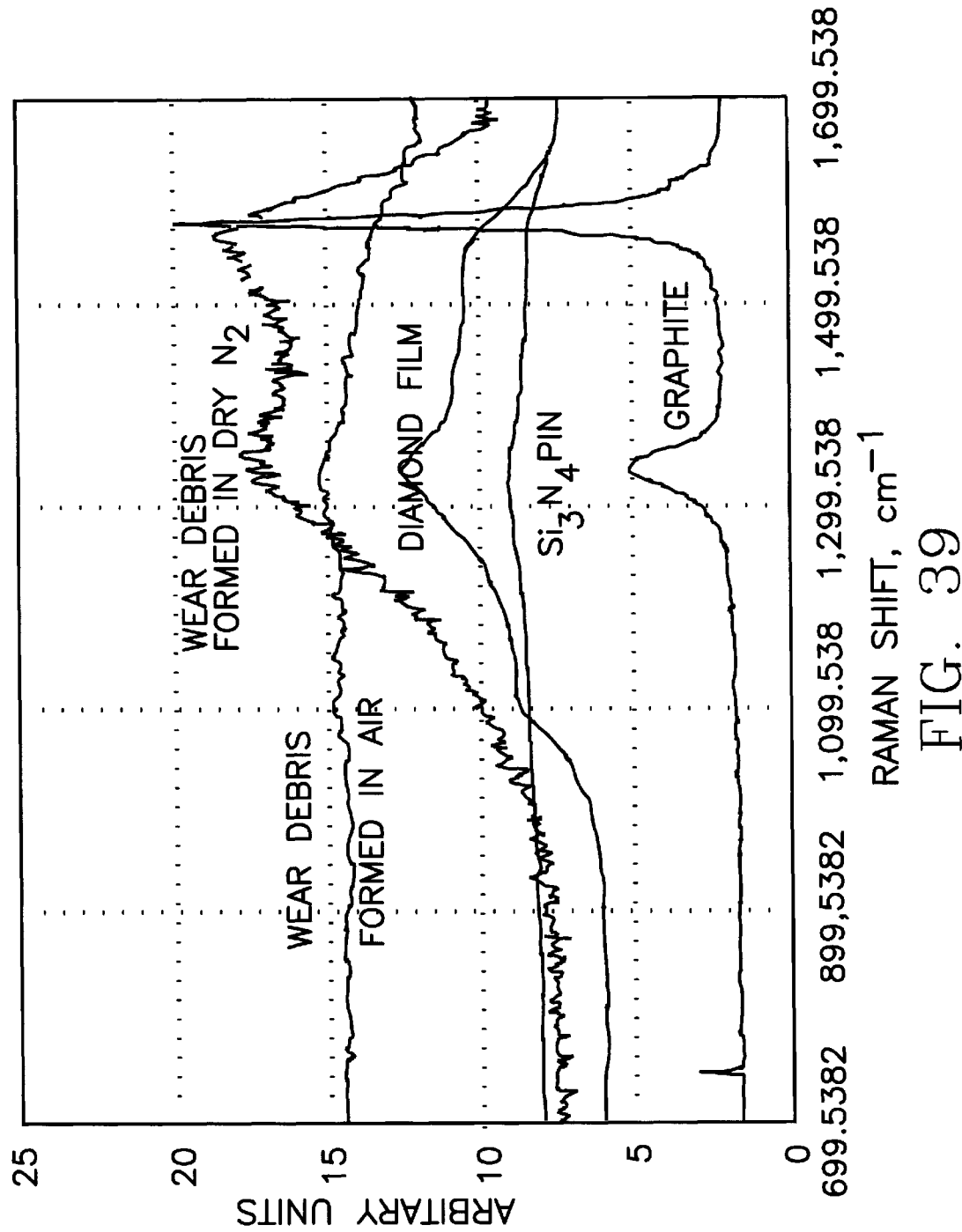
FIG. 39 illustrates Raman spectra of debris particles formed during passes against diamond film of the invention in dry $N_2$ and wear debris formed in air, and compared to the diamond film, the $Si_3N_4$ pin and graphite.

In an attempt to find evidence of graphitization on the sliding diamond surfaces, we used a laser Raman spectroscope. We could not verify the formation of a detectable graphitic precursor on the sliding surface of diamond films after tests in open air, but there was some evidence of graphitization on surfaces rubbed in dry $N_2$. As shown in FIG. 39, Raman spectroscopy of the debris particles formed during sliding in dry $N_2$ reveals two broad Raman bands, one centered at 1345 and the other at 1578 $cm^{-1}$. These two lines essentially overlap with the D and G bands of crystalline graphite. Raman spectroscopy of the debris particles produced in open air did not yield any indication of graphifization. The Raman spectrum of these debris particles was similar to that of the wear scar formed on the $Si_3N_4$ pin.

Based on this observation and recent published works, it is reasonable to conclude that surface graphitization plays a significant role in the longer-term frictional behavior of diamond films, especially in vacuum and dry $N_2$. It is also important to note that in most tribological investigations, sliding-contact tests are usually limited to less than 20,000 sliding cycles, and that the values obtained from such short-duration tests are used as the real indicator of the frictional behavior of diamond films.

As a consequence of the methods described herein, deposition of high-quality nanocrystalline diamond films with very smooth surface finish is feasible in an inert gas-carbonaceous plasma. Such nanocrystalline films are essentially hydrogen-free and consist of an $sp^3$-bonded diamond precursor. Because of their smooth surface finish, the films afford very low friction and high wear resistance to sliding, such as SiC and $Si_3N_4$ counterfaces. Wear of the diamond film itself is difficult to measure after short-duration tests and is still minimal even after $2.27 \times 10^6$ sliding cycles. Mechanistically, the ultra flow friction and wear properties of the diamond films correlate well with their initially smooth surface finish and their ability to become polished even further during sliding. The wear tracks reach an ultra-smooth (3–6 nm root mean square deviation from flatness) surface finish which results in very little abrasion and ploughing. The long-term frictional behavior of these films in dry $N_2$ is dominated by micrographitization, as verified by Raman spectroscopy.

The following nonlimiting examples set forth exemplary embodiments of the inventions:

EXAMPLE I

A $C_{60}$ sublimation source was coupled to a microwave chamber operated with a microwave generator at 2.45 GHz as shown in FIG. 1. The system as a whole is an ASTeX PDS-17 unit supplied by Applied Science and Technology. Fullerene containing soot was made in a conventional manner or was obtained from MER Corporation. (e.g., about 10% $C_{60}$ in the soot). The soot was treated with methanol to remove most of the hydrocarbon constituents. The cleaned soot was place in a gold container which in turn was disposed in a quartz tube wound with nichrome wire used to heat the soot. The microwave chamber was evacuated and the soot heated to about 200° C.–250° C. for two hours to remove residual methanol solvent, hydrocarbons and absorbed gases. The rate of $C_{60}$ sublimation was determined by placing a silicon wafer in front of the outlet of the sublimation source inside the microwave chamber. An argon gas flow of 20 sccm with a total pressure in the chamber of 100 Torr was established by use of a carrier gas inlet into the sublimation source. The sublimation source was maintained at about 500° C., and adequate $C_{60}$ was deposited in one-half an hour on the silicon single crystal (maintained at temperatures above about 470° C. so that a typical $C_{60}$ infrared absorption spectrum could be easily noted). Raman spectroscopy confirmed the presence of $C_{60}$. There were no features in the infrared spectrum that could be attributed to species other than $C_{60}$.

EXAMPLE II

The same manufacturing procedure set forth in Example I was followed except the silicon wafer was removed, and fresh soot was placed in the sublimation source. The temperature of the sublimation source was raised to about 500° C., the microwave generator was activated and a 500 watt microwave discharge was initiated at 1 Torr argon. A quartz fiber optic cable was coupled to the microwave chamber to enable viewing of the plasma discharge at a region about 1–1.5 cm above the silicon substrate. The light within the fiber optic cable was transmitted to an Interactive Technology model 103 optical monochromator with 200 micron entrance and exit slit widths. The monochromator wavelength was stepped in increments of about 2.3 Angstroms with a dwell time of about 100 msec/step. The light detector was a Peltier cooled photomultiplier tube operating in a pulse counting mode with a dark count rate of 20–30 cps. A Macintosh IIci control computer was used with software to provide a 100 msec gating pulse to the 32-bit National Instruments counter board located in the computer back plane.

Figure 3A:
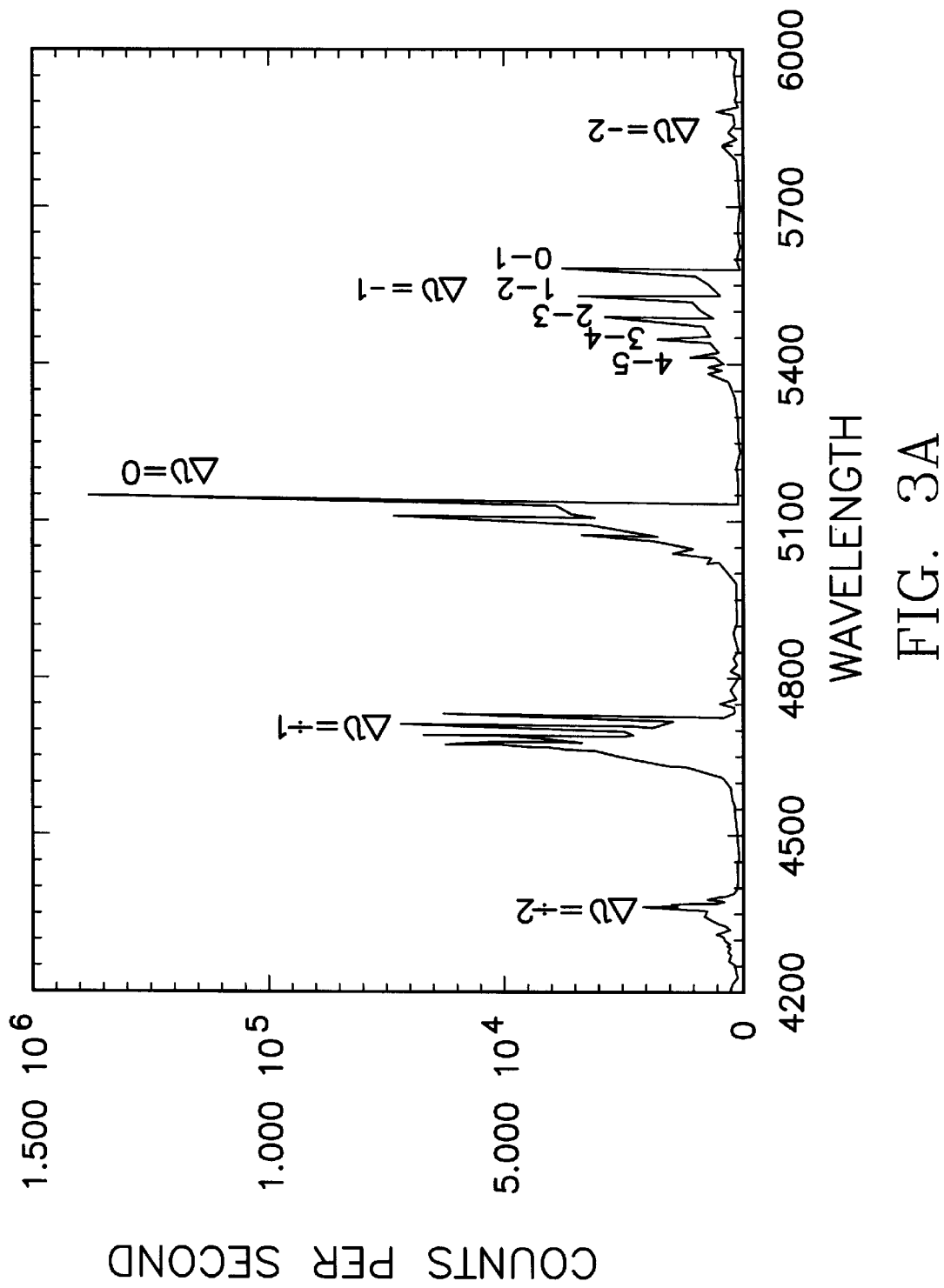
FIG. 3A illustrates an emission spectrum for a plasma in the system of the invention.
Figure 3B:
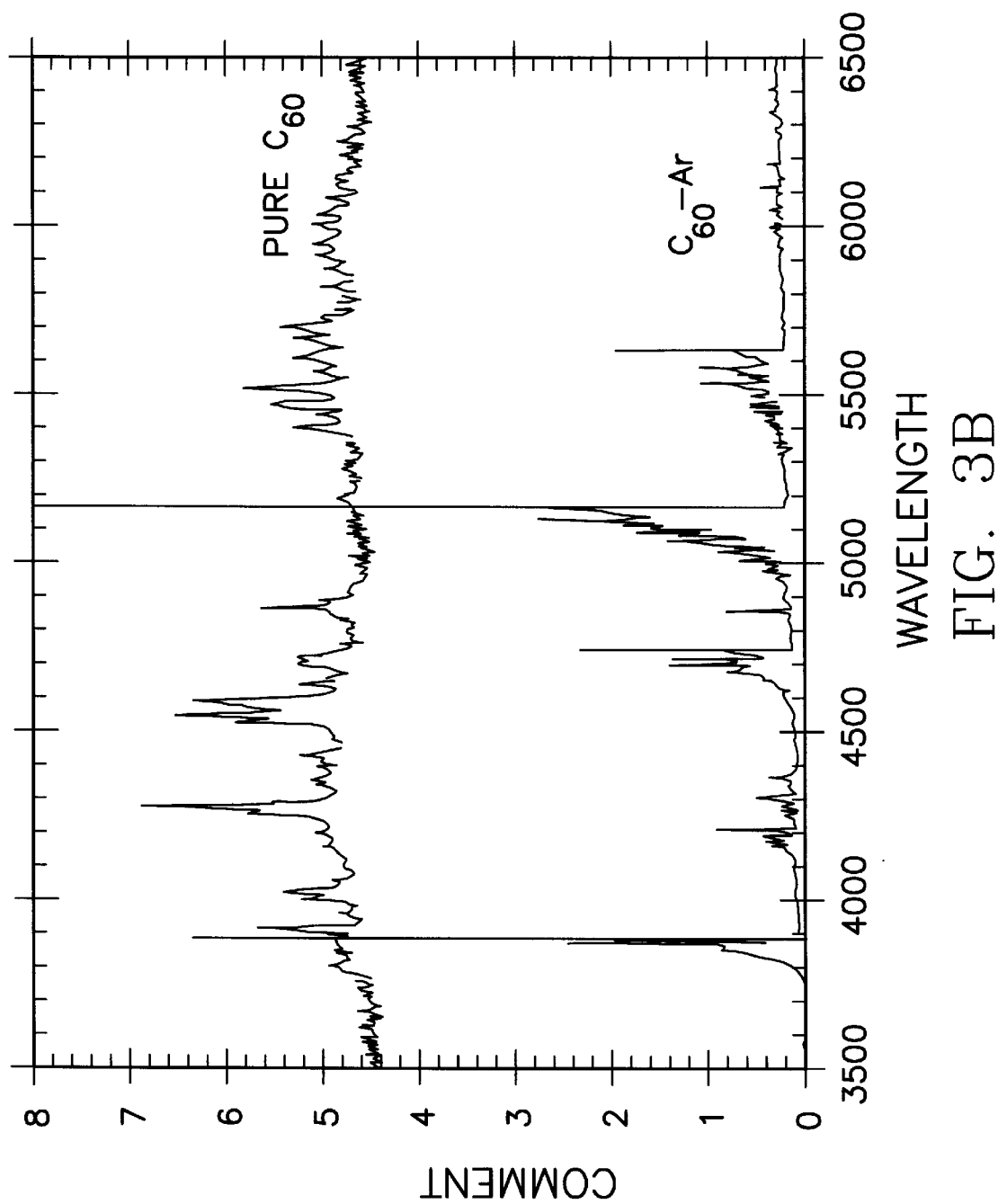
FIG. 3B compares the plot of FIG. 3A to the spectrum for a plasma without a noble carrier gas present (top plot)

A typical spectrum obtained from the intensely emerald green plasma discharge is shown in FIG. 3A. The spectrum is dominated by the $d^3\pi g$-$a^3\pi u$ Swan bands of $C_2$, particularly the $\Delta v = -2, -1, 0, +1, +2$ sequences. This can be compared to the spectral output in the absence of a noble carrier gas as shown in FIG. 3B which does not exhibit $C_2$ bands.

It should also be noted that intense emissions are also observed characteristic of excited argon atoms in the 6000–8000 Angstrom range in FIG. 3A. Argon neutrals in such metastable states as $^3P_2$ at 11.55 eV can lead to efficient energy transfer to the $C_{60}$ molecules and consequent fragmentation.

EXAMPLE III

Figure 3C:
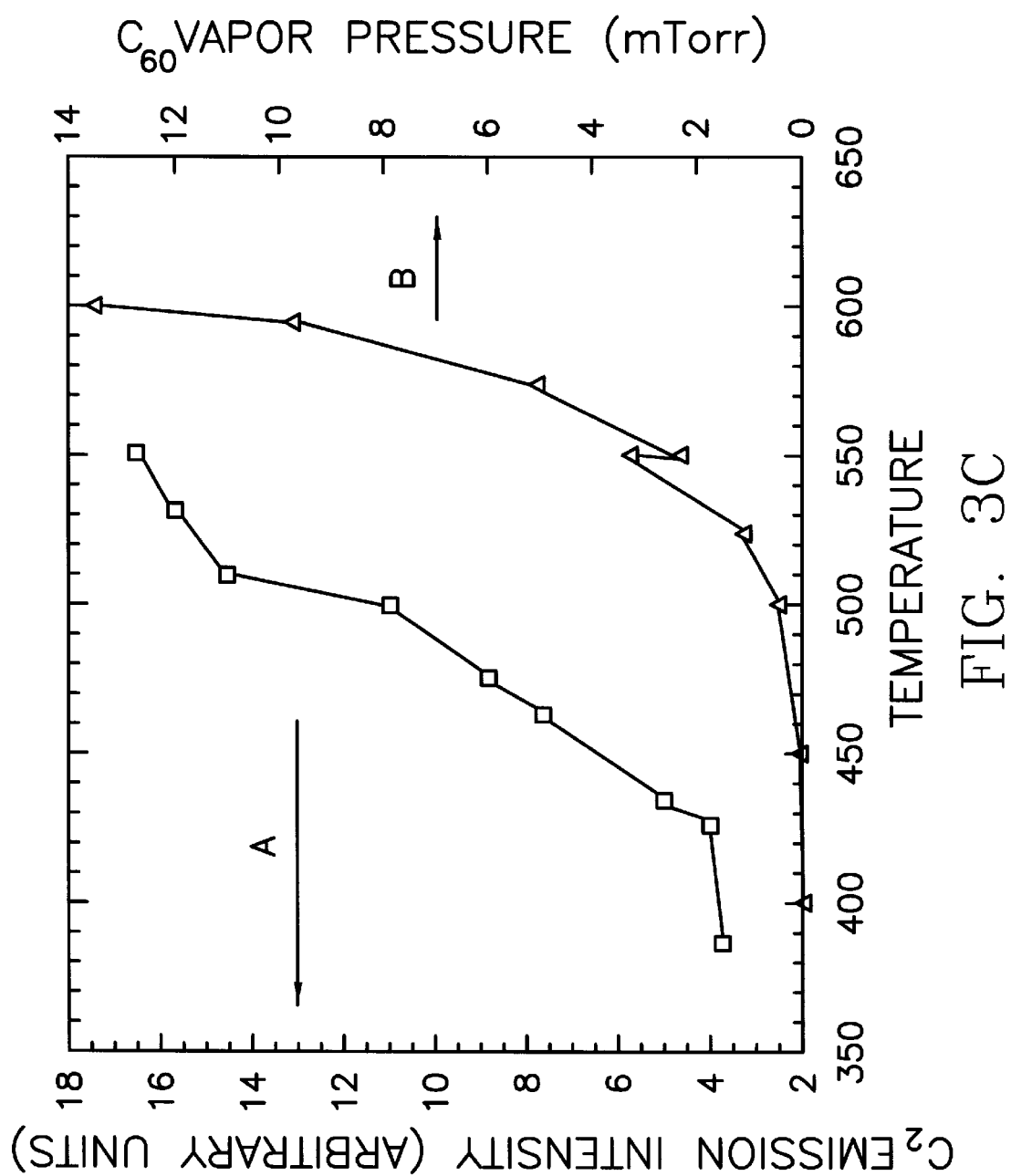
FIG. 3C shows $C_{60}$ vapor pressure and integrated intensity of the $\Delta v=o$ band from $C_2$ emissions.

An examination of the Swan bands in FIG. 3A was performed by analyzing emission spectra as a function of sublimator source temperature. The Swan band emission intensities were found to increase as a function of sublimator temperature (see FIG. 3C). Under saturation conditions of the argon carrier gas, the emission intensities should follow the vapor pressure of $C_{60}$ (see FIG. 3C, curve B). However, a log plot clearly shows that the argon carrier gas is far from being saturated with the equilibrium $C_{60}$ pressure. The $C_2$ concentration in the plasma increases with temperature due to increased $C_{60}$ volatility which shows the $C_2$ emission is not a minor constituent, nor is it due to carbon particles transported into the plasma. Continuation of this method of manufacture for a period of time (several hours or more) at sublimator temperatures of 550° C. results in depletion of $C_{60}$ and higher fullerenes, as evidenced by decreasing Swan band intensities in the spectra. After such a prolonged time of operation, lowering the temperature to 500° C. results in emission spectra having intensities diminished by a factor of ten compared to those obtained with a fresh batch of soot at 500° C.

EXAMPLE IV

The same basic method of Example II was followed except the microwave power level was varied from 500 to 1200 watts. There was no noticeable change in the absolute intensity or the intensity ratios of the different Swan band frequencies.

EXAMPLE V

Figure 6A:
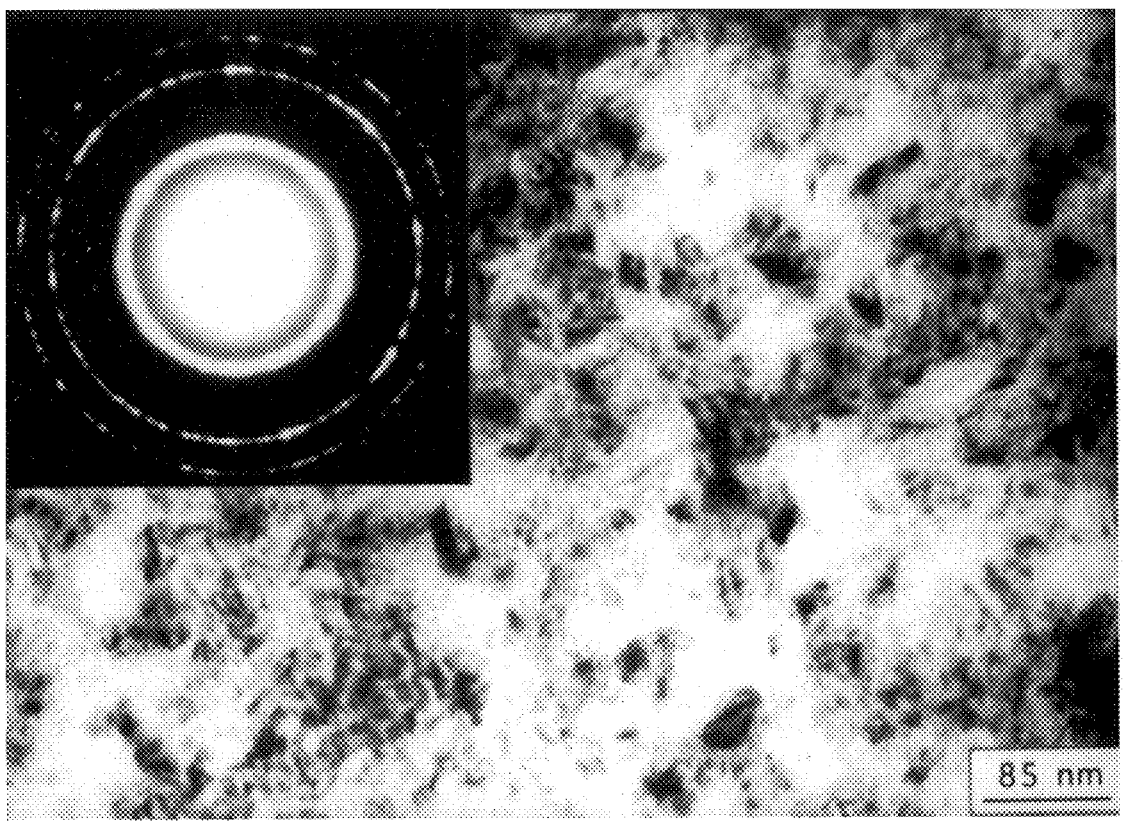
FIG. 6A illustrates a transmission electron microscope (TEM) micrograph from a diamond film of one form of the invention with a selected area electron diffraction pattern inset.
Figure 6B:
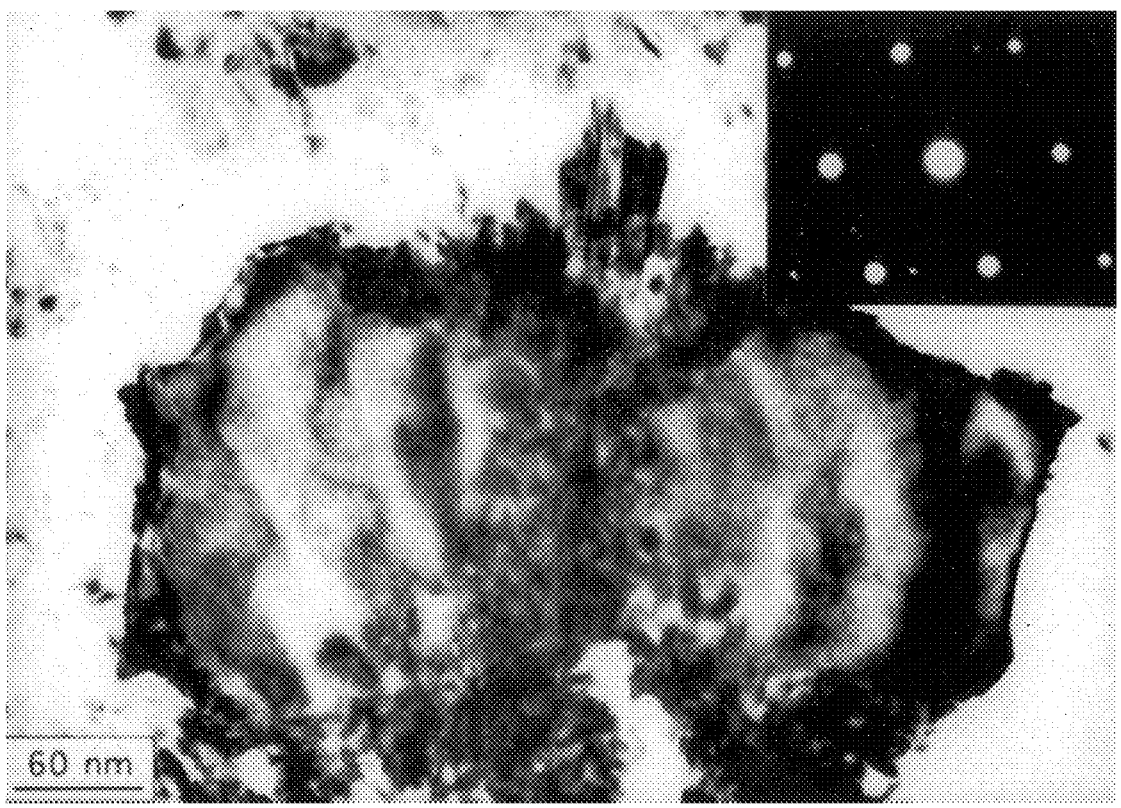
FIG. 6B illustrates a TEM micrograph of two diamond grains from a diamond film of the invention with the grains having a common <111> orientation.
Figure 29:
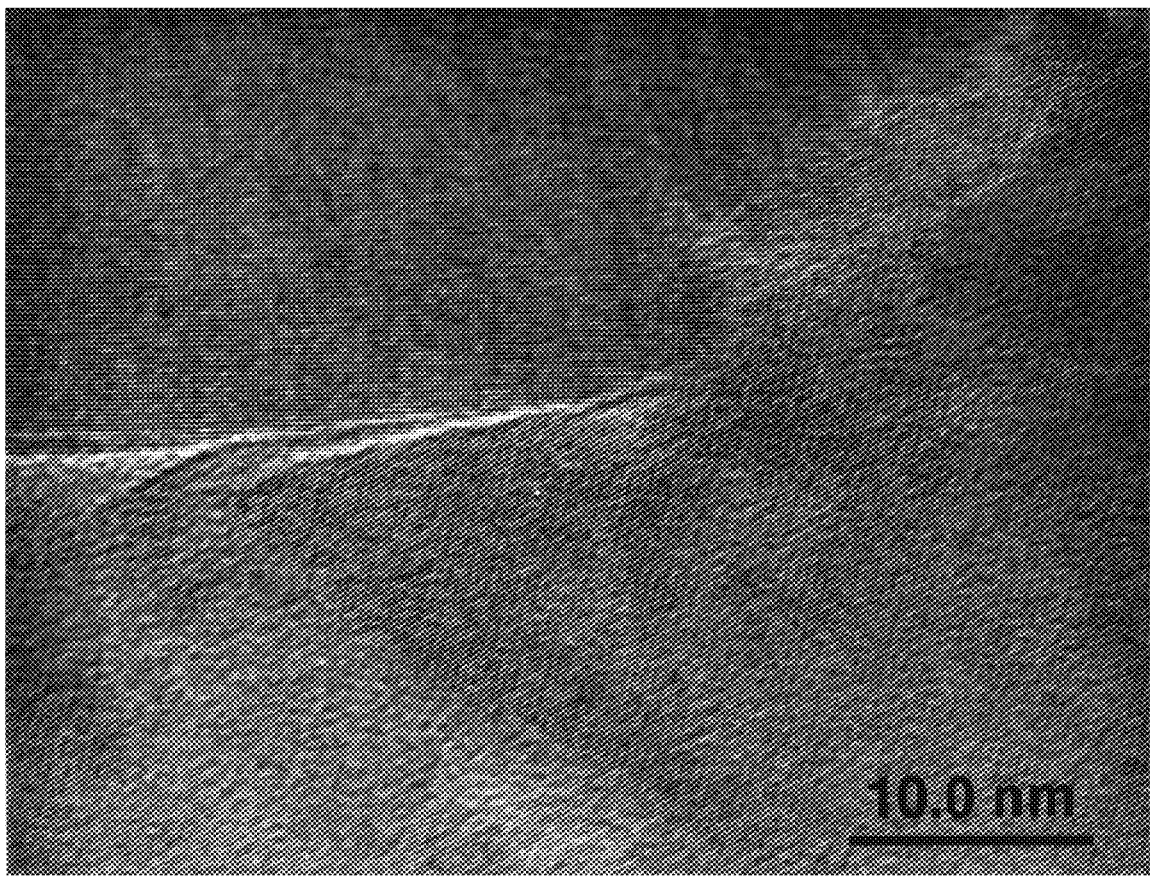
FIG. 29 is an atomic resolution TEM, of a diamond film grown in an Ar—$C_{60}$ plasma, showing atomically abrupt grain boundaries with no nondiamond intergranular material.

The growth rate of diamond film in Example II was characterized to be about 1.2 microns/hour which is comparable to or higher than the deposition rate obtained with a conventional plasma containing 1% methane in hydrogen. Conventional diamond films grown at this rate have a very large grain size, rough surface and high defect density. By lowering the pressure to ~300 mTorr and confining the plasma with a magnetic field, it is possible to reduce the defect density, grain size and surface roughness, but there is a sharp drop in growth rate. Smooth films can be obtained at high growth rate (0.5–1 micron/hr) by increasing the $CH_4$ content of the plasma, but the resulting films have an increased graphitic content. Micrographs (see FIGS. 6 and 29) of the films produced using the subject invention show much smaller defect density than conventional films prepared at 300 mTorr with a magnetized plasma using $CH_4$—$H_2$—$O_2$ mites as prepared by the applicants herein. The films prepared by the method of the invention also show no evidence of graphite contamination, and exhibit atomically abrupt grain boundaries with no nondiamond intergranular material. The growth rates obtained with the method of the invention were comparable with the high pressure growth rate obtained with the standard method, and 10–100× higher than obtained at 300 mTorr using standard plasma composition.

EXAMPLE VI

The procedure described in Example I was followed except that the chamber pressure was 50 mTorr, using an Ar flow rate >10 sccm with an upper magnet current of 150 Å and a lower magnet current of 115 Å to improve plasma stability. The microwave power was 500 watts, and the fullerene sublimator heater was operated at 110 volts, resulting in a sublimation source temperature of about 500° C. An intense $C_2$-rich green plasma with an optical emission spectrum similar to that of FIG. 3A was obtained.

EXAMPLE VII

In another method, fullerene rich soot is replaced by a flow of $CH_4$ gas as the source of carbon for the diamond. The experimental conditions for the deposition system 10 (except for lack of the soot 12) are set forth in Table 1 for Films D–G. In other experiments acetylene ($C_2H_2$) was also used under similar conditions as $CH_4$ and diamond was produced.

EXAMPLE VIII

Figure 7:
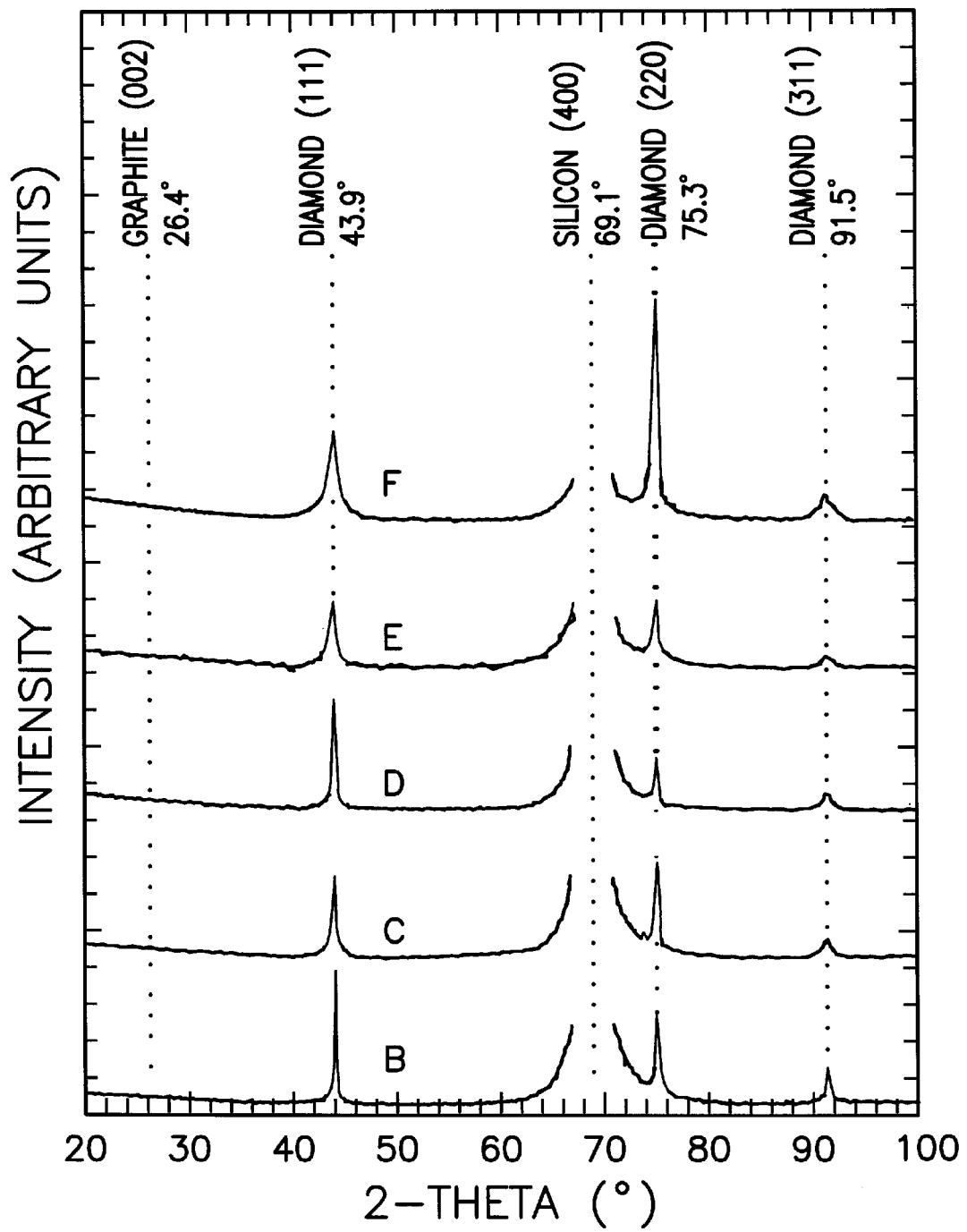
FIG. 7 shows XRD measurements for Films B–F (Table 1) showing diamond as the only crystalline material present in the films; the (400) peak from the silicon substrate has been removed for clarity.

Characterization of the resulting Films A–G are discussed herein. The Films A–G grown or described herein before are characterized as nanocrystalline diamond films. FIG. 7 shows XRD patterns from Films B–F. The characteristic (111), (220) and (311) diamond peaks are evident. The strong Si (400) peak due to the silicon substrate has been removed. There is no evidence of the strong (002) graphite peak at 26.4°. This indicates that the films contain diamond and no appreciable amounts of other crystalline material.

Figure 8A:
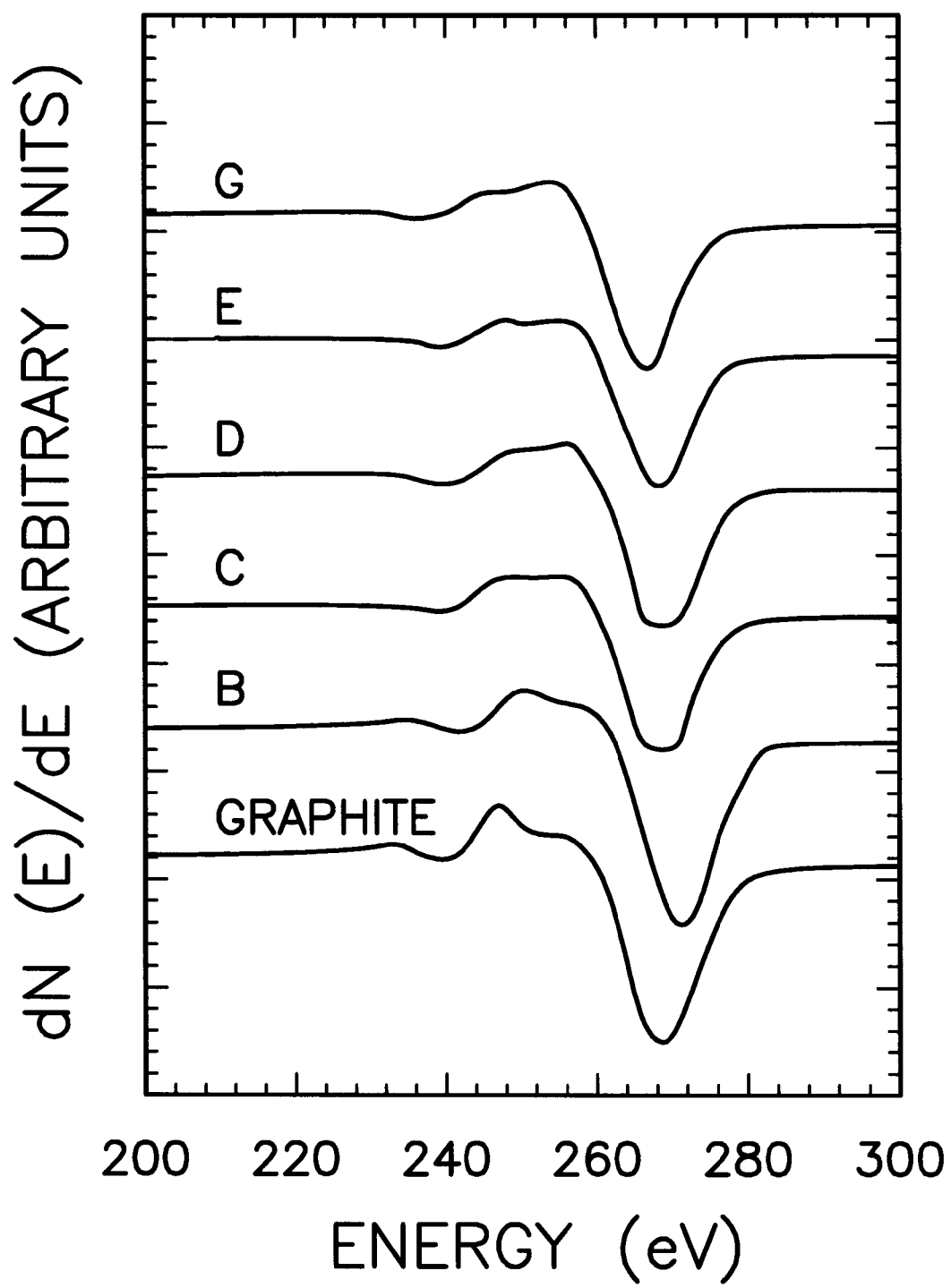
FIG. 8A shows the AES spectra for Films C–E and G to be very similar to diamond; Film B appears to be a hybrid between diamond and graphite, indicating a higher $sp^2/sp^3$ carbon ratio in this film.
Figure 8B:
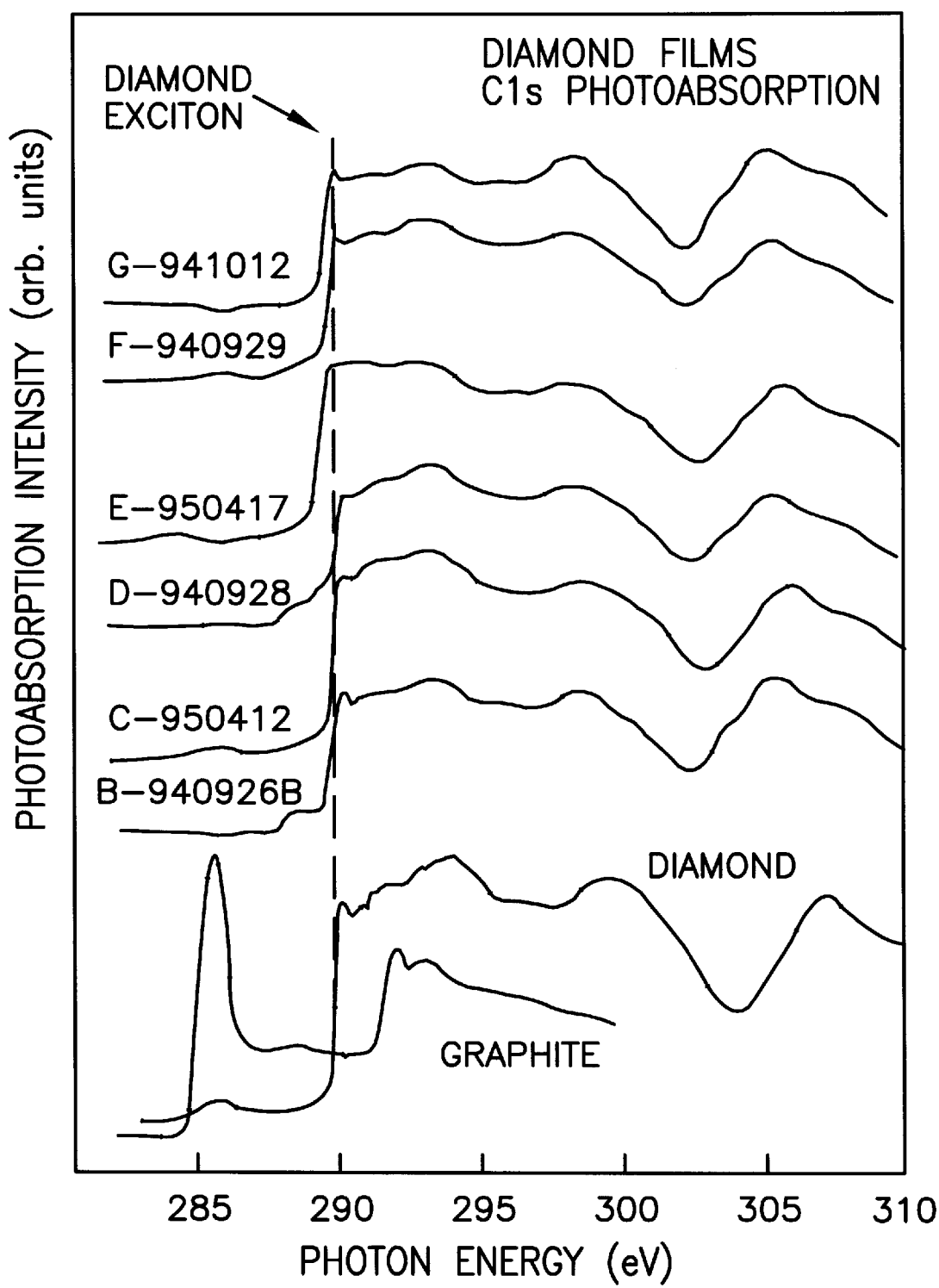
FIG. 8B shows near-edge X-ray absorption fine structure (NEXAFS) data for Films B–G on films deposited under the same conditions as Films B–G, as well as graphite and diamond reference spectra. Films B, D and F have a higher degree of graphitic binding (286 eV) and trapped hydrogen (288 eV) than Films C, E and G.

Evidence of low $sp^2/sp^3$ carbon ratios in the films is obtained from AES measurements of the carbon KLL peak shown in FIG. 8A. The KLL peak is sensitive to the bonding state of the carbon atom and has been used to determine $sp^2/sp^3$ ratios in a C:H films. The AES spectra for Films C–F are very similar to that reported in the literature for diamond, indicating a low $sp^2/sp^3$ ratio. The AES spectrum of Film B appears to be somewhere between diamond and graphite, indicating a higher $sp^2/sp^3$ carbon ratio in this film. Similar results are obtained in the X-ray photo absorption measurements of FIG. 8B, with the added information that the films grown at the lowest hydrogen concentrations (C and E) are both essentially pure diamond and contained no trapped hydrogen, and are indistinguishable from the single crystal diamond reference sample. Films B, D and F by comparison contain significant hydrogen as evidenced by the bump at 289–290 eV, corresponding to C—H bond stretching.

Figure 9:
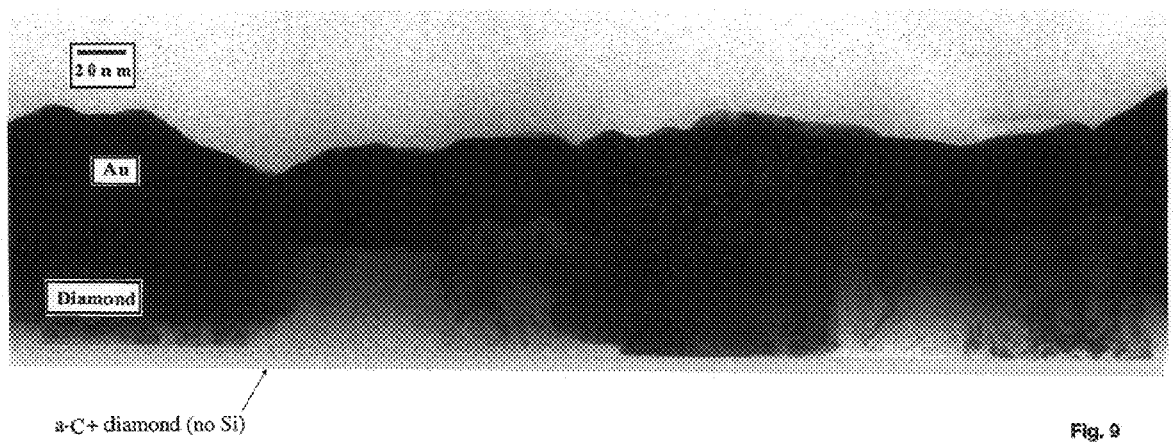
FIG. 9 shows a cross-section HRTEM image of Film A; the silicon substrate has been removed and a gold layer deposited on top; an amorphous carbon layer has formed on top of the silicon before diamond growth began; the diamond grain boundaries are sharp, with no evidence of $sp^2$ carbon; a continuous diamond film was formed at a thickness of 20–30 nm compared to 500–1000 nm required for conventional methods.

High resolution TEM has been used to examine the microstructure of films grown with fullerene precursors and indicates the films are composed of small diamond grains with an average grain size of 15 nm, with extremely clean grain boundaries. FIG. 9 shows a HRTEM image of a section of Film A. The silicon substrate has been removed and a layer of gold deposited on the diamond. A 100 Å thick layer composed of amorphous carbon and diamond was disposed immediately above the silicon substrate and formed preceding diamond film growth. The diamond grains are clearly visible above the amorphous layer and appear as well ordered diamond crystals. The boundaries between the grains are sharp and appear to contain little or no nondiamond phases. This is demonstrated even more clearly by FIG. 29 which shows a grain boundary region at atomic resolution. The lines in this figure are the atomic rows, and the spacing matches that of the bulk diamond lattice, unambiguously demonstrating formation of the diamond phase and the lack of any nondiamond phase at the grain boundary. This further indicates these films are composed of nanocrystalline diamond films with very little $sp^2$ carbon present.

Figure 10:
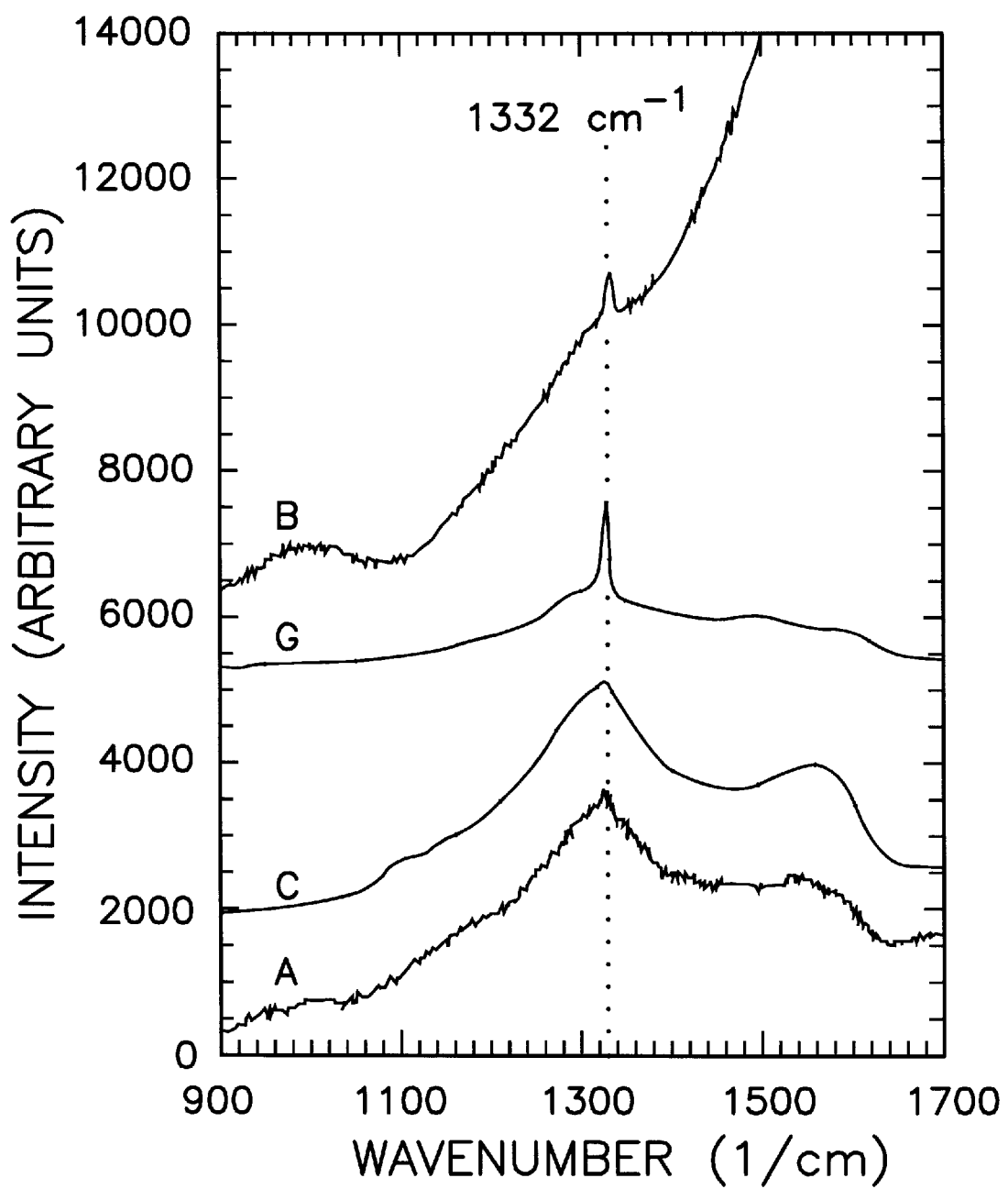
FIG. 10 shows Raman spectra of the films with a diamond peak at 1332 $cm^{-1}$, as well as features at 1580 and 1320 $cm^{-1}$ which are commonly attributed to $sp^2$ carbon. Films A and C show an additional feature at 1140 $cm^{-1}$ which has been attributed to nanocrystalline diamond.

Raman spectra of Films A–C and G which are representative of all the films grown are shown in FIG. 10. Raman spectra of Films E and F are similar to Film C while the Raman spectrum of Film D is similar to Film B. The Raman spectra show a peak at 1332 $cm^{-1}$ attributed to diamond. Features at 1580 and 1330 $cm^{-1}$ have been attributed to $sp^2$ carbon but probably are due to atoms residing at grain boundaries in this nanocrystalline material. An additional feature around 1140 $cm^{-1}$ appears for Films A and C which has been attributed to nanocrystalline diamond. For Film B, an intense fluorescence peak at 2250 $cm^{-1}$ (1.68 eV) results in the rapidly rising background. The weak 1332 $cm^{-1}$ peak relative to other Raman features for films grown at low hydrogen contents (Films A and C) is attributed to the small grain size in the films rather than an increase in the $sp^2/sp^3$ carbon ratio. The 1332 $cm^{-1}$ peak intensity has been shown to decrease with decreasing grain size both for diamond particles of known size and diamond films, where the grain size was determined from XRD measurements. Furthermore, these Raman spectra were excited using 632.8 nm light, which is more sensitive to the nondiamond carbon phases than the 488 nm Argon ion laser light commonly employed for measuring Raman spectra. The present interpretation is supported by the TEM images, which indicate that Film A is nanocrystalline, as well as the NEXAFS, AES and XRD data, which indicate the $sp^2/sp^3$ ratios of the films are very similar to diamond and the only crystalline component in the films are diamond.

AFM measurements (see Table 1) of rms surface roughness for Films A–E and G, all grown to ≈2 μm, show that higher carbon to hydrogen ratios lead to smooth film growth, while lower ratios lead to rougher films. Film F demonstrates that in these low hydrogen content plasmas, a 10 μm thick, smooth (rms roughnesses of 45 nm) film can be grown.

FIG. 11A is a cross-sectional SEM micrograph of Film A. The surface of this nanocrystalline diamond Film is rather smooth. FIG. 11B shows that the wear track formed on Film A during tribological testing becomes extremely smooth.

FIG. 12A shows the measured coefficient of friction for conventionally grown polished CVD diamond film as a function of surface roughness. Also shown are the friction coefficients for a cleaved single crystal natural diamond and an unpolished film grown from an Ar—$C_{60}$ plasma. The cleaved natural diamond and the Ar—$C_{60}$ grown film have comparable surface roughness and identical friction properties. As is evident from FIG. 12B, Film G with a rough surface finish exhibits a significantly higher friction coefficient than the smooth Film C in dry $N_2$. As a reference, the friction coefficient of the Si substrate against the $Si_3N_4$ ball is also included in FIG. 12B. The friction coefficient of the rough diamond Film G was somewhat higher than that of the Si substrate, and the wear rate of the counterface material is considerably higher. Table 1 provided hereinbefore shows the overall frictional performance and ball wear rate for both the rough and smooth diamond films. Again, the highest friction coefficients are due to rough diamond films, whereas the smooth diamond films exhibit friction coefficients of 0.04 to 0.12. We believe that the large fluctuations in the friction traces and very high initial friction coefficients of rough diamond films are largely due to ploughing and interlocking of asperities across the sliding interface. Sharp asperite tips of diamond crystals can dig in and cut the surface of softer counterface material, thus causing severe abrasion and ploughing. It is known that a high degree of ploughing can cause high frictional traction between sliding surfaces. This in turn promotes high friction and severe abrasion of the much softer counterface material. During successive sliding passes, the sharp asperite tips are progressively rounded and eventually blunted to result in a much smoother surface finish. Furthermore, the valleys between asperites are filled with a blanket of wear debris particles. The combination of these two physical phenomena produces a relatively smooth surface finish and eventually results in somewhat lower friction coefficients, although not as low as for diamond films which are intrinsically smooth. This observation is consistent with conventional results which show very high friction coefficients for rough diamond films. In general, prior art found that the greater the surface roughness, the higher the initial and steady-state friction coefficients for diamond films as shown in FIG. 12A.

Owing to their much smoother surface finish, Films A and C exhibit very low friction coefficients (i.e., 0.04 to 0.12, especially at steady-state (see FIG. 12B)). These values are comparable to that of a natural diamond in dry $N_2$ as conventionally reported. As shown in FIG. 11A, the surface asperites of these films are not faceted and sharp. Most importantly, the sliding contact surfaces of these films become exceedingly smooth under the influence of repeated sliding (see FIG. 11B). As a result, the extent of frictional losses during sliding against $Si_3N_4$ remain low, especially after a break-in regime of the sliding tests. In short these films cause much lower ploughing, hence very little fluctuation in friction traces during sliding.

Table 1 lists hereinbefore the wear rates of $Si_3N_4$ balls during sliding against various diamond films. As is evident, compared to smooth diamond films, rough diamond films cause much higher wear losses on counterface balls. This can be attributed to severe abrasion caused by the sharp asperite tips and edges of rough diamond crystals, whereas the smooth films result in much lower wear losses on the $Si_3N_4$ ball, up to 100× lower than previously reported values for conventionally deposited diamond thin films.

EXAMPLE IX

In another form of the invention diamond films were grown on single-crystal silicon wafers or sintered SiC substrates, and a bias of −150 V was applied to enhance diamond nucleation density. Film growth was monitored in-situ by laser reflectance interferometry to determine growth rate and to stop growth at the desired film thickness. All films were grown at a substrate temperature of 800 to 850° C., and total gas flow rate was 100 sccm. For smooth films, the gas composition was 98% Ar, 2% $H_2$ and $C_{60}$ at 100 Torr pressure and 800 W of microwave power was used. Rough, faceted films were also grown in typical prior art conditions of 95% $H_2$ and 2% $CH_4$ at 60 Torr pressure and 1500 W of microwave power.

EXAMPLE X

We conducted friction and wear tests on a ball-on-disk tribometer with pairs of SiC pins or $Si_3N_4$ balls and diamond-coated substrates in dry $N_2$ and open air of 30 to 50% relative humidity. The normal load applied to the balls was 2 to 5 N, which initially created mean Hertzian contact pressures of approximately 0.6 to 0.8 GPa (ignoring effects of the diamond films) between $Si_3N_4$ and SiC. Because of the formation of a flat wear scar during sliding contact nominal bearing pressures fell to a fraction of these initial Hertzian values by the end of the tests. Frictional force was monitored with the aid of a load cell and was recorded on chart paper throughout the tests. The sliding velocity ranged from 0.05 to 0.2 m/s during tests. A few tests were run to assess the long-term tribological performance and durability of diamond coatings under a 5-N load at 0.04 m/s. Wear-volume calculations on the balls were based on microscopic determination of the diameter of the circular wear scars, combined with the assumption that the wear scar is flat. These wear volumes were converted into average specific wear rates by simply normalizing wear volume ($mm^3$) over contact load (N) and total sliding distance (m). The wear of disk specimens was assessed from the traces of surface profiles across the wear tracks. Two to three duplicate tests were run under each test condition to check the reproducibility of the friction and wear data.

Figure 30:
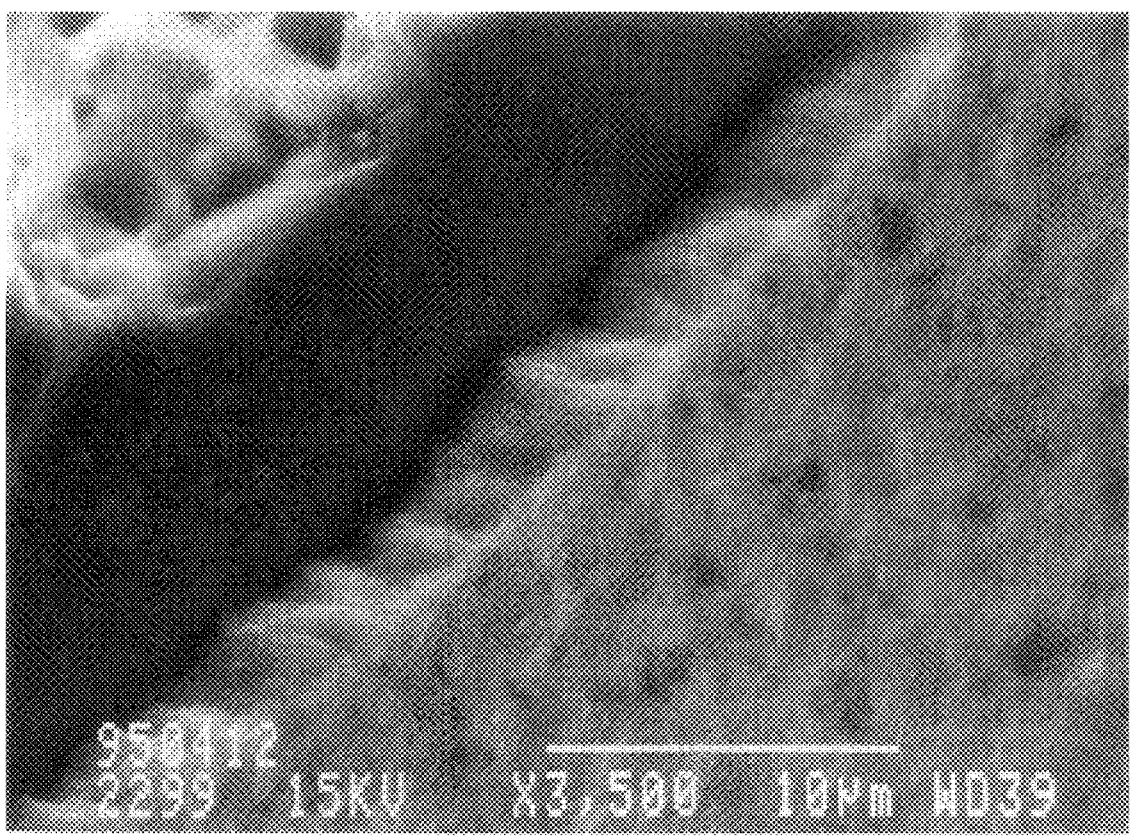
FIG. 30 illustrates a cross-sectional SEM micrograph of a diamond film prepared in accordance with the invention.
Figure 31:
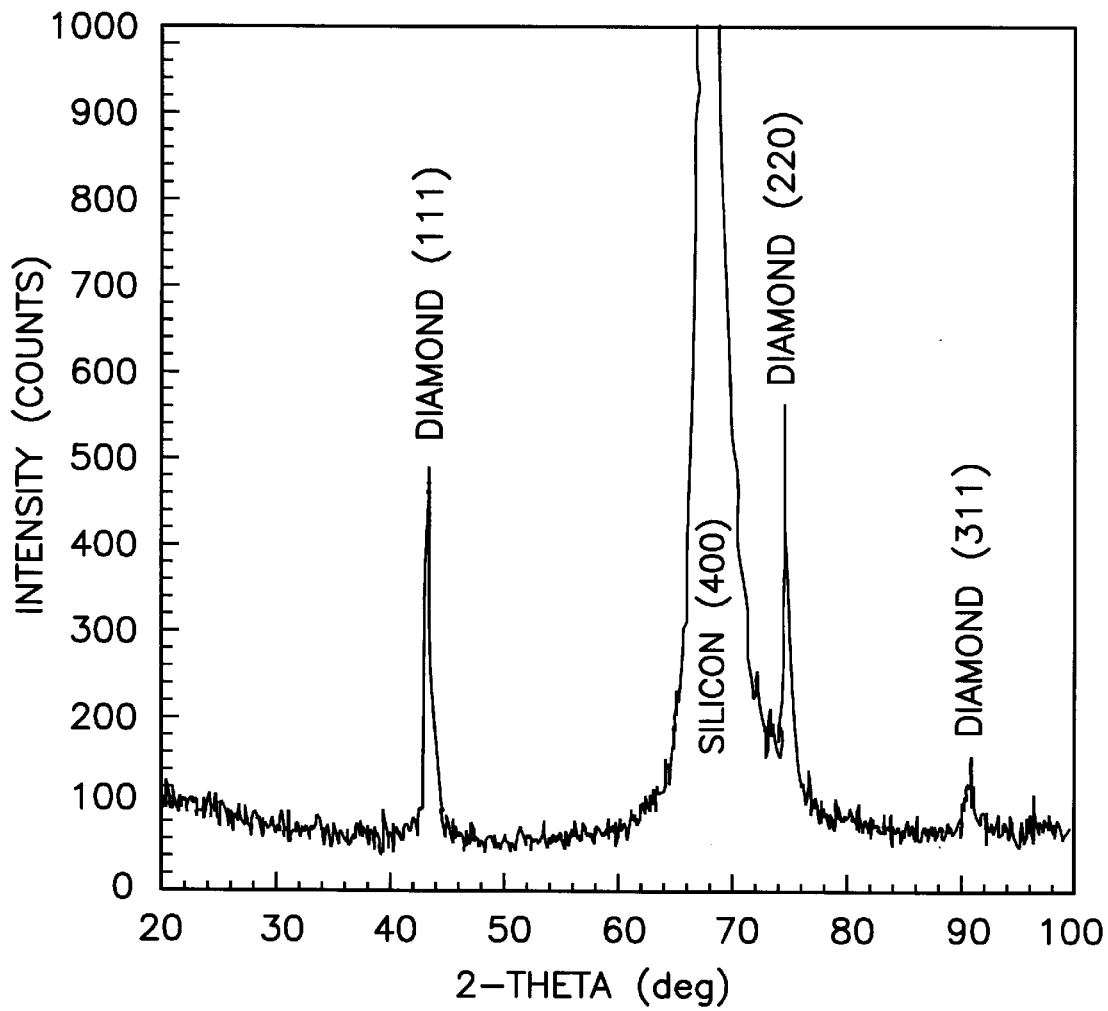
FIG. 31 illustrates an X-ray diffraction pattern of the diamond film shown in FIG. 30.

FIG. 30 is a cross-sectional SEM photomicrograph of one of the diamond films used in this study. At the magnification shown, this film appears dense and smooth. The rough surface finish and coarse columnar morphology, typical of most $CH_4/H_2$ grown PCD films with larger grain sizes, is not obvious in this film, which has been characterized as a nanocrystalline diamond. As shown in FIG. 31, the characteristic (111), (220), and (311) diamond peaks are evident in the XRD pattern, and there is no evidence of the strong (002) graphite peak at 26.4°. This indicates that the films contain diamond but no appreciable amounts of other crystalline phases.

The measure of low $sp^2/sp^3$ carbon ratios in the films were obtained from AES measurements of the carbon KLL peak, which is sensitive to the bonding state of the carbon atom and has been used to determine $sp^2/sp^3$ ratios in amorphous hydrogenated carbon films. The AES spectra are very similar to those reported in the literature for diamond, indicating a low $sp^2/sp^3$ ratio. Further evidence of low $sp^2/sp^3$ ratios in these films have recently been obtained with photoabsorption near-edge X-ray absorption fine structure (NEXAFS) measurements, which clearly distinguish between $sp^2$ and $sp^3$ carbon bonding. These measurements show that the films are indeed diamond and contain little $sp^2$ bonding.

High-resolution TEM (HRTEM) has been used to examine the microstructure of films grown with fullerene precursors, and this study indicates that the films are composed of small diamond grains (10–300 nm). For smooth $C_{60}$ grown films, average grain size was determined to be 15 nm.

The Raman spectra of the films show a peak at 1332 $cm^{-1}$ attributed to diamond. Additional broad features at 1580 and 1330 cm$^{-1}$ have been attributed to sp$^2$ carbon. An additional feature around 1140 cm$^{-1}$ appears for C$_{60}$/Ar/H$_2$-grown films and has been attributed to nanocrystalline diamond. The 1332 cm$^{-1}$ peak for the C$_{60}$/Ar/H$_2$ grown films is weak relative to other Raman features. This is attributed to the small grain size in the films rather than to an increase in sp$^2$/sp$^3$ carbon ratio. The 1332 cm$^{-1}$ peak intensity has been shown to decrease with decreasing grain size for diamond films. Furthermore, these Raman spectra were excited by 632.8-nm light, which is more sensitive to nondiamond carbon phases than is the 488-nm argon ion laser light commonly employed for measuring Raman spectra. The present interpretation is supported by the TEM images, which indicate that the film is nanocrystalline, as well as by the AES and XRD data, which indicate that the sp$^2$/sp$^3$ ratios of the films are similar to diamond and that the only crystalline component in the films is diamond.

From AFM measurements of RMS surface roughness, the CH$_4$/H$_2$ grown films were found to become rougher with increasing thickness. The C$_{60}$/Ar/H$_2$ grown films remained smooth as film growth proceeded, with RMS roughnesses of 30–50 nm.

EXAMPLE XI

FIG. 32 compares the friction coefficients of SiC pins sliding against smooth and rough diamond films in dry N$_2$. The SEM photomicrographs in FIG. 33A and 33B show the surface finish of these films. The friction coefficient of rough diamond film is high and very unsteady, fluctuating between 0.45 and 0.7, whereas the friction coefficient of smooth diamond film is around 0.04 at steady state and does not fluctuate. SEM photomicrographs of the wear track formed on smooth diamond film revealed a highly polished, ultrasmooth surface finish (see FIG. 34A), while the wear track of rough diamond film was covered with a layer of thick debris particles (FIG. 34B). The wear of SiC pins sliding against rough diamond film was 6.5×10$^{-6}$ mm$^3$/N.m, while the wear rate of pins sliding against the smooth diamond film was 2.5×10$^{-7}$ mm$^3$/N.m. Wear of diamond films themselves was practically unmeasurable in both cases.

FIG. 35 shows the friction coefficients of Si$_3$N$_4$ balls against smooth diamond film in dry N$_2$ and in open air. For comparison, the friction coefficient of a highly oriented pyrolitic graphite (HOPG) sample is also included. Regardless of the test environment, the initial friction coefficient of diamond film against Si$_3$N$_4$ is high (0.35), but decreases steadily as sliding continues. In dry N$_2$, the friction coefficient stabilizes at around 0.04 after about 1,500 cycles and remains fairly constant at this value until 10,000 cycles. It then begins to increase with further sliding, eventually reaching 0.31 after 15,000 cycles. As can be seen from the same figure, the average friction coefficient of HOPG against Si$_3$N$_4$ is around 0.25; and the friction trace is highly erratic. For the smooth diamond film tested in air, its friction coefficient is initially high (0.35), but decreases to 0.13 and remains constant throughout the test.

Figure 36:
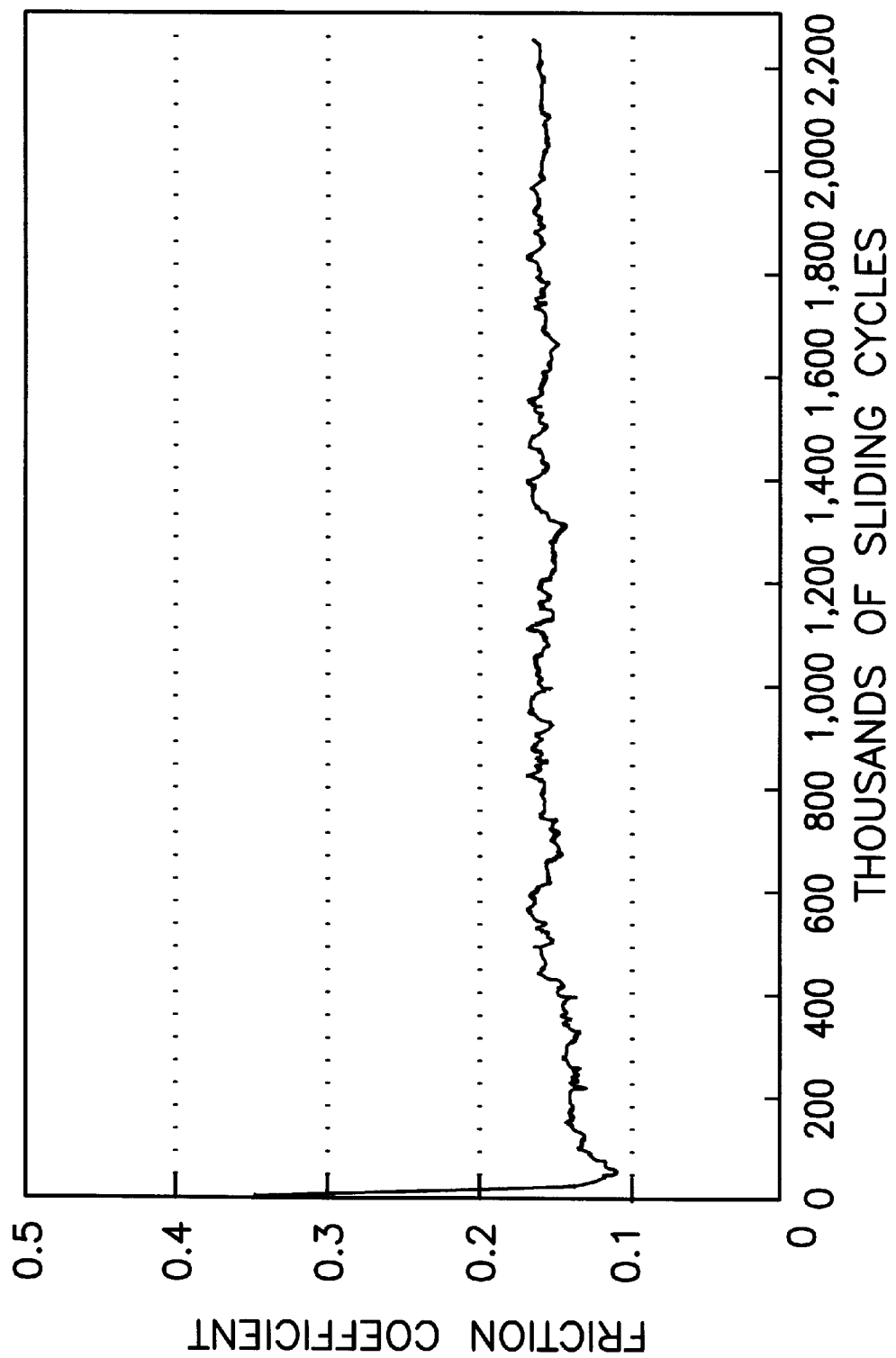
FIG. 36 illustrates the friction coefficient of $Si_3N_4$ balls sliding against diamond film of the invention for a long-term test.
Figure 37:
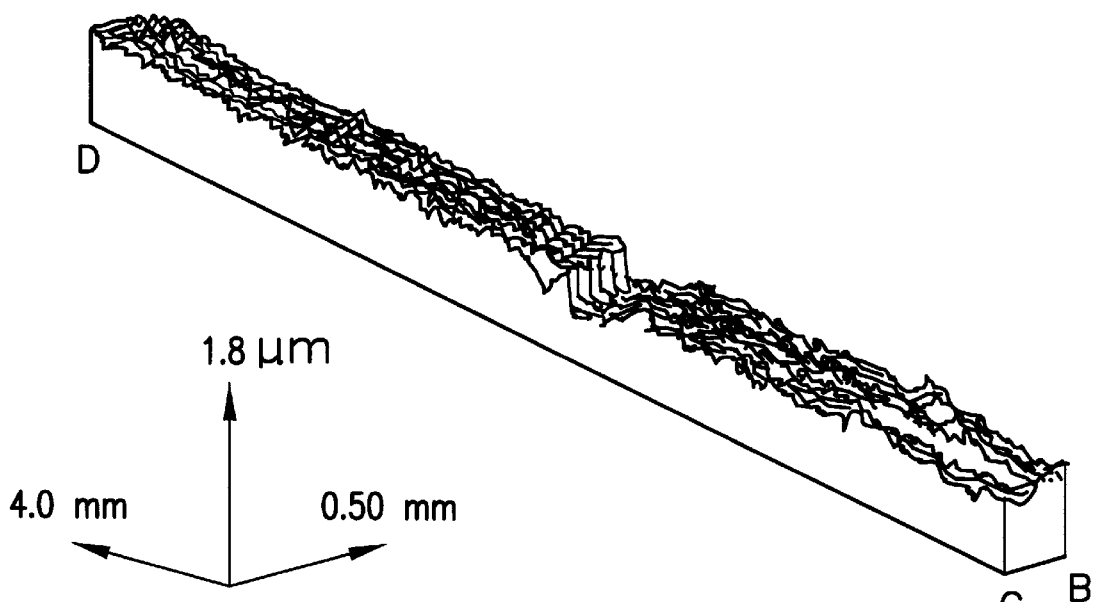
FIG. 37 illustrates a three-dimensional surface map of a wear track in the diamond coating of the invention after $2.27 \times 10^6$ passes.

FIG. 36 shows friction coefficients of Si$_3$N$_4$ balls sliding against smooth diamond film during a long-duration test (i.e., 2.27×10$^6$ cycles (or 36 km)). As is evident, the initially high friction coefficient of 0.35 decreases to 0.12 as sliding cycles increase. It then tends to increase slightly to 0.15 after 75,000 cycles and remains constant at this value. The average specific wear rate of the counterface ball was 1.4×10$^{-8}$ mm$^3$/N.m. FIG. 37 is a 3-D surface map of the wear track formed on this diamond film after accumulating 2.27×10$^6$ sliding passes. The depth of this track was measured with a surface profilometer to be 0.5 μm, the film itself was 6 μm thick.

While preferred embodiments of the invention have been shown and described, it will be clear to those skilled in the art that various changes and modifications can be made without departing from the invention in its broader aspects as set forth in the claims provided hereinafter.

What is claimed is:

1. An article of manufacture, comprising a diamond film disposed on a substrate, said diamond film consisting essentially of carbon and having an equiaxed grain structure of grain diameters ranging from about 10–300 nm and a surface finish of less than about 50 nm root mean square deviation from flatness in the as deposited form.

2. The article as defined in claim 1 wherein said diamond film consists essentially of a diamond crystallographic structure.

3. The article as defined in claim 2 wherein said diamond crystallographic structure exhibits an atomic bonding structure consisting essentially of sp$^3$ bonding.

4. The article as defined in claim 1 wherein said substrate comprises a microtip array.

5. The article as defined in claim 4 wherein said microtip array is selected from the group consisting of silicon, a metal and a ceramic.

6. The article as defined in claim 1 wherein said diamond film has undergone sliding wear on an exposed surface and formed a graphite coating on said exposed surface.

7. The article as defined in claim 1 wherein said diamond film exhibits a sliding friction coefficient with Si$_3$N$_4$ of about 0.04–0.12.

8. The article as defined in claim 1 wherein said grain structures have an average diameter of about 15 nm.

9. A method of forming nanocrystalline diamond film on a substrate, comprising the steps of:

(a) forming a carbonaceous containing vapor;

(b) providing an inert gas containing gas stream and combining said gas stream with said carbonaceous containing vapor;

(c) collecting said combined carbonaceous vapor and said gas stream in a chamber;

(d) forming a plasma in said chamber, said plasma containing fragmented carbon species; and (e) depositing said fragmented carbon species onto said substrate to form said nanocrystalline diamond film having equiaxed grains of diameter of about 10–300 nm and said diamond film further having a root mean square flatness of less than about 50 nm deviation from flatness in the as deposited state.

10. The method as defined in claim 9 wherein said step (a) includes forming a vapor having species selected from the group consisting of CH$_4$, C$_2$H$_2$ and anthracene.

11. The method as defined in claim 9 wherein said inert gas containing stream is selected from the group consisting of argon, an argon/H$_2$ mixture, neon, krypton and xenon.

12. The method as defined in claim 9 wherein said substrate comprises a microtip array.

13. The method as defined in claim 9 wherein said carbonaceous containing vapor consists of C$_{60}$ in combination with a species selected from the group consisting of CH$_4$, C$_2$H$_2$ and anthracene.

14. The method as defined in claim 13 further including H$_2$ in said vapor.

15. The method as defined in claim 9 wherein said carbonaceous vapor consists essentially of C$_2$ molecules.

16. The method as defined in claim 9 wherein said step (e) comprises the following incremental growth steps without use of H$_2$:

(1) depositing a $C_2$ molecule on a diamond surface on said substrate and inserting the $C_2$ molecule into a surface carbon dimer bond;

(2) forming a new surface carbon dimer with the inserted $C_2$ molecule and the surface dimer bond;

(3) depositing a second $C_2$ molecule to form a new surface carbon dimer on an adjacent atomic row; and (4) inserting a third $C_2$ molecule into a trough between the two surface carbon dimers, said third molecule incorporated into the diamond surface thereby forming a new surface carbon dimer row running perpendicular to the adjacent dimer row.

* * * * *